US009336881B2

(12) United States Patent
Shimakawa et al.

(10) Patent No.: US 9,336,881 B2
(45) Date of Patent: May 10, 2016

(54) VARIABLE RESISTANCE NONVOLATILE MEMORY DEVICE INCLUDING A VARIABLE RESISTANCE LAYER THAT CHANGES REVERSIBLY BETWEEN A LOW RESISTANCE STATE AND A HIGH RESISTANCE STATE ACCORDING TO AN APPLIED ELECTRICAL SIGNAL

(71) Applicant: Panasonic Intellectual Property Management Co., Ltd., Osaka (JP)

(72) Inventors: Kazuhiko Shimakawa, Osaka (JP); Ryotaro Azuma, Osaka (JP); Ken Kawai, Osaka (JP); Shunsaku Muraoka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/730,629

(22) Filed: Jun. 4, 2015

(65) Prior Publication Data
US 2015/0364193 A1  Dec. 17, 2015

(30) Foreign Application Priority Data

Jun. 16, 2014  (JP) ................................ 2014-123824

(51) Int. Cl.
*G11C 11/00* (2006.01)
*G11C 11/14* (2006.01)
(Continued)

(52) U.S. Cl.
CPC .................. *G11C 13/0069* (2013.01)

(58) Field of Classification Search
USPC .......................... 365/148, 158, 163, 171, 173
See application file for complete search history.

(56) References Cited

U.S. PATENT DOCUMENTS 6,873,561 B2 *   3/2005   Ooishi .................... G11C 11/15
                                                   365/148
7,652,912 B2 *   1/2010   Kawagoe ............... G11C 11/15
                                                   365/148
(Continued)

FOREIGN PATENT DOCUMENTS

JP   2005-235360   9/2005
JP   2011-008860   1/2011
(Continued)

OTHER PUBLICATIONS

A.Kawahara et al., "Filament Scaling Forming Technique and Level-Verify-Write Scheme with Endurance Over 107 Cycles in ReRAM" IEEE International Solid-State Circuits Conference, 2013.
(Continued)

*Primary Examiner* — Trong Phan
(74) *Attorney, Agent, or Firm* — McDermott Will & Emery LLP

(57) ABSTRACT

A variable resistance nonvolatile memory device includes: a nonvolatile memory element; an NMOS transistor connected to the nonvolatile memory element; a source line connected to the NMOS transistor; a bit line connected to the nonvolatile memory element. When a control circuit causes the nonvolatile memory element to be in the low resistance state, the control circuit controls to flow a first current from a first voltage source to a reference potential point, and applies a first gate voltage to a gate of a NMOS transistor, and when the control circuit causes the nonvolatile memory element to be in the high resistance state, the control circuit controls to flow a second current from a second voltage source to the reference potential point, and applies a second gate voltage to the gate of the NMOS transistor, the second gate voltage being lower than the first gate voltage.

20 Claims, 30 Drawing Sheets

(51) Int. Cl.
   *G11C 11/15*   (2006.01)
   *G11C 13/00*   (2006.01)

(56) References Cited

U.S. PATENT DOCUMENTS

| | | | |
|---|---|---|---|
| 7,903,448 B2 * | 3/2011 | Oh | G11C 13/0007 365/148 |
| 8,289,752 B2 * | 10/2012 | Lu | G11C 11/16 365/148 |
| 8,472,238 B2 * | 6/2013 | Shimakawa | G11C 13/0007 365/148 |
| 8,619,458 B2 * | 12/2013 | Baek | G11C 8/10 365/148 |
| 2005/0174840 A1 | 8/2005 | Tsushima et al. | |
| 2010/0177555 A1 | 7/2010 | Shimakawa et al. | |
| 2010/0328993 A1 | 12/2010 | Ohmori et al. | |
| 2011/0128776 A1 | 6/2011 | Katoh et al. | |
| 2012/0020141 A1 | 1/2012 | Kitagawa et al. | |
| 2012/0074375 A1 | 3/2012 | Shimakawa et al. | |
| 2012/0281453 A1 | 11/2012 | Shimakawa et al. | |
| 2013/0044535 A1 | 2/2013 | Shimakawa | |

FOREIGN PATENT DOCUMENTS

| | | |
|---|---|---|
| JP | 2012-027972 | 2/2012 |
| WO | 2009/141857 | 11/2009 |
| WO | 2010/131477 | 11/2010 |
| WO | 2012/140903 | 10/2012 |

OTHER PUBLICATIONS

S. Muraoka et al., "Comprehensive Understanding of Conductive Filament Characteristics and Retention Properties for Highly Reliable ReRAM" 2013 Symposium on VLSI Tech. Dig. of Tech. Papers.

\* cited by examiner

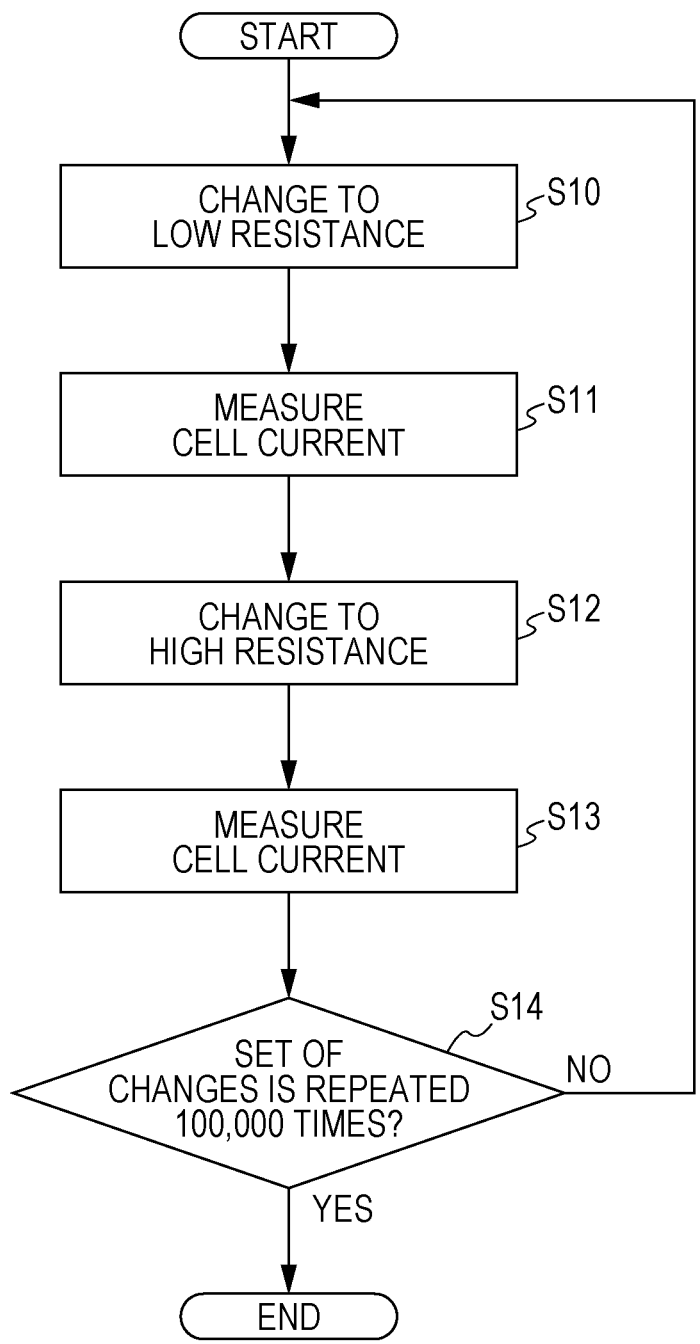

VARIABLE RESISTANCE NONVOLATILE MEMORY DEVICE INCLUDING A VARIABLE RESISTANCE LAYER THAT CHANGES REVERSIBLY BETWEEN A LOW RESISTANCE STATE AND A HIGH RESISTANCE STATE ACCORDING TO AN APPLIED ELECTRICAL SIGNAL

BACKGROUND

1. Technical Field

The present disclosure relates to a variable resistance nonvolatile memory device including memory cells, each including a variable resistance nonvolatile memory element.

2. Description of the Related Art

Research and development of variable resistance nonvolatile memory devices including memory cells, each including a variable resistance nonvolatile memory element is ongoing. The variable resistance nonvolatile memory element is an element that has the characteristic that a resistance value (resistance state) changes reversibly by electrical signals and that is able to store data corresponding to the resistance value in a nonvolatile manner. The variable resistance nonvolatile memory element includes: a resistance random access memory (ReRAM) based on change in electrical resistance value due to an oxidation reduction reaction, a magnetoresistive random access memory (MRAM) based on change in magnetic resistance, and a phase-change random access memory (PCRAM) based on change in electrical resistance value due to a phase change.

It is known that in a rewrite operation in these variable resistance nonvolatile memory devices, control of the amount of current flowing through and/or the value of voltage applied to a variable resistance nonvolatile memory element achieves regulation of resistance value and stability of the operation (see, for example, Japanese Unexamined Patent Application Publication No. 2012-27972 (hereinafter, referred to as Patent Document 1), Japanese Patent No. 4670252 (hereinafter, referred to as Patent Document 2), and Japanese Patent No. 5287544 (hereinafter, referred to as Patent Document 3)).

BRIEF SUMMARY OF THE INVENTION

One non-limiting and exemplary embodiment provides a variable resistance nonvolatile memory device that is capable of stably continuing a resistance change operation.

In one general aspect, the techniques disclosed here feature a variable resistance nonvolatile memory device including: a nonvolatile memory element that includes a first electrode, a second electrode, and a variable resistance layer between the first electrode and the second electrode, and that changes reversibly between a low resistance state and a high resistance state according to an applied electrical signal; an NMOS transistor including a first diffusion layer region, a gate, and a second diffusion layer region, the first diffusion layer region being connected to the first electrode; a source line connected to the second diffusion layer region; a bit line connected to the second electrode; a source line drive circuit connected to the source line that includes i) a current steering circuit connected to a first voltage source, ii) a first switch circuit disposed between the source line and an output of the current steering circuit, iii) a second switch circuit disposed in parallel with the first switch between the source line and a reference potential point; a bit line drive circuit connected to the bit line that includes i) a third switch circuit disposed between the bit line and the reference potential point, and ii) a fourth switch circuit disposed in parallel with the third switch between the bit line and a second voltage source; and a control circuit that controls at least the NMOS transistor, the source line drive circuit and the bit line drive circuit. The nonvolatile memory element may complete to change from the high resistance state to the low resistance state when a voltage higher than or equal to a low resistance change ending voltage is applied between the first electrode and the second electrode. The low resistance change ending voltage may vary in a range between a first voltage and a second voltage higher than the first voltage. When the control circuit causes the nonvolatile memory element to be in the low resistance state for a writing operation, i) the control circuit may turn on the first switch circuit and the third switch circuit, and may turn off the second switch circuit and the fourth switch circuit to flow a first current from the first voltage source to the reference potential point, and ii) the control circuit may apply a first gate voltage to the gate of the NMOS transistor. When the control circuit causes the nonvolatile memory element to be in the high resistance state for the writing operation, i) the control circuit may turn off the first switch circuit and the third switch circuit, and may turn on the second switch circuit and the fourth switch circuit to flow a second current from the second voltage source to the reference potential point, and ii) the control circuit may apply a second gate voltage to the gate of the NMOS transistor, the second gate voltage being lower than the first gate voltage.

The variable resistance nonvolatile memory device in one general aspect is capable of stably continuing a resistance change operation.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is an evaluation flow diagram for comparing the effects of the 1T1R memory cell in the embodiment and a conventional technique;

DETAILED DESCRIPTION

Figure 1:
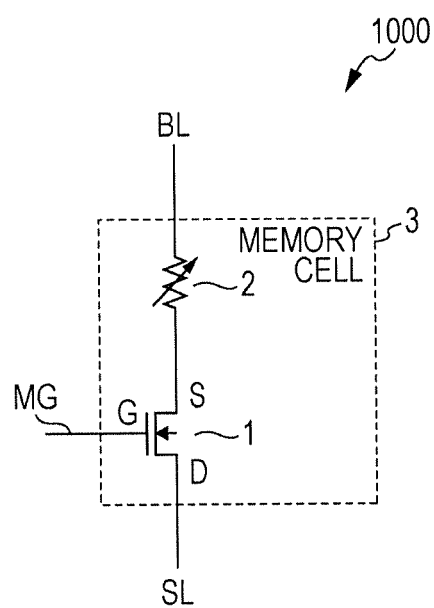
FIG. 1 is a circuit diagram of a conventional 1T1R memory cell.

Underlying Knowledge Forming Basis of the Present Disclosure

In summary of the techniques disclosed in the above-mentioned Patent Document 1, Patent Document 2, Patent Document 3, it is claimed that for low resistance operation, writing to a variable resistance nonvolatile memory element with steered current is effective. The Patent Documents 1 to 3 describe that a desired resistance value may be set in the variable resistance nonvolatile memory element according to the value of a current to be driven and the effect of reducing deterioration of the variable resistance nonvolatile memory element is available by steering the current to be driven and avoiding flow of excessive current through the variable resistance nonvolatile memory element.

On the other hand, for high resistance operation, it is claimed that writing to a variable resistance nonvolatile memory element with steered voltage is effective. The high resistance operation is such that flowing a predetermined current through a variable resistance nonvolatile memory element in a low resistance state causes the variable resistance nonvolatile memory element to change to a high resistance state. However, when change to a high resistance state is made, a high voltage is applied to the variable resistance nonvolatile memory element according to a relationship to current x resistance (product of current and resistance). In the case of a variable resistance nonvolatile memory element having an insulating layer with an extremely small thickness, after the change to a high resistance, a high electric field is applied to the variable resistance nonvolatile memory element, which causes breakage of the variable resistance nonvolatile memory element. For this reason, Patent Documents 1 to 3 describe that the effect of reducing breakage or deterioration of the variable resistance nonvolatile memory element is achieved by steering the voltage.

The above-mentioned Patent Documents 1 to 3 disclose a method of setting the variable resistance nonvolatile memory element to have a desired resistance value. In addition, the above-mentioned Patent Documents 1 to 3 disclose a method of reducing breakage or deterioration of the variable resistance nonvolatile memory element, the breakage or deterioration being caused by application of excessive current or voltage in a rewrite operation of the variable resistance nonvolatile memory element. However, the above-mentioned Patent Documents 1 to 3 do not describe the challenge of achieving a large number of times of rewriting.

These days, variable resistance nonvolatile memory devices such as ReRAM are being actively studied. This is because the variable resistance nonvolatile memory device achieves high-speed rewrite operation and read operation compared with a flash memory, the mainstream of conventional nonvolatile memory device. Also, although the number of times of rewriting of a flash memory was of the order of 100,000 previously, along with the advancement in miniaturization and increase in capacity, the number of times of rewriting has been reduced to the order of several thousands. Even at this point, the variable resistance nonvolatile memory device has high rewriting performance compared with the flash memory.

Figure 27:
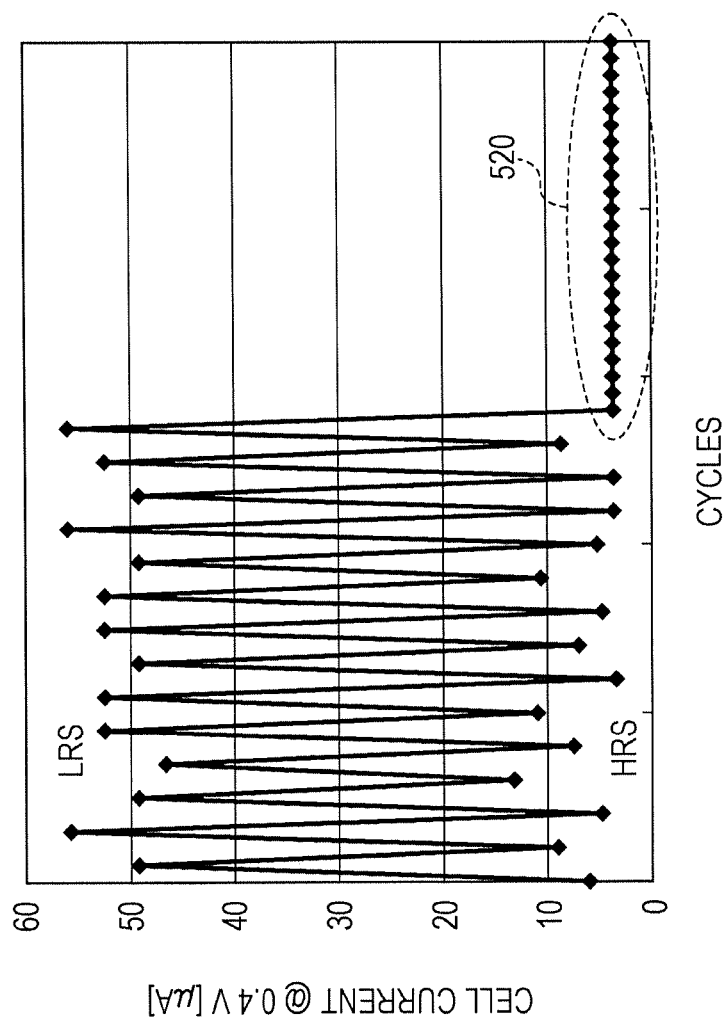
FIG. 27 is a graph illustrating a problem of the operation of a conventional variable resistance nonvolatile memory element that is disclosed in 2013 IEEE International Solid-State Circuits Conference 12.6 FIG. 12.6.4 (hereinafter, referred to as Non-Patent Document 1).

In the above-mentioned Non-Patent Document 1, the inventors have disclosed a technique for improving the number of times of rewriting performed by a variable resistance nonvolatile memory device by using a verification rewriting technique. FIG. 27 is a graph illustrating a problem of the operation of the variable resistance nonvolatile memory element that is disclosed in Non-Patent Document 1. When high resistance operation and low resistance operation are repeated for a large number of memory cells in a memory cell array, super-high resistance state 520 may occur in which resistance state is fixed to a high resistance state, which prevents subsequent low resistance operation. It has been disclosed that normal rewrite operation may be recovered by verification writing defined by a predetermined rewrite algorithm.

However, the verification writing has a problem in that each write operation is accompanied by read operation and also increase in the number of memory cells to be rewritten reduces writing speed.

Thus, the present disclosure provides a variable resistance nonvolatile memory device that is capable of stably continuing a resistance change operation.

An aspect of the present disclosure provides a variable resistance nonvolatile memory device including: a nonvolatile memory element that includes a first electrode, a second electrode, and a variable resistance layer between the first electrode and the second electrode, and that changes reversibly between a low resistance state and a high resistance state according to an applied electrical signal; an NMOS transistor including a first diffusion layer region, a gate, and a second diffusion layer region, the first diffusion layer region being connected to the first electrode; a source line connected to the second diffusion layer region; a bit line connected to the second electrode; a source line drive circuit that is connected to the source line and that includes i) a current steering circuit connected to a first voltage source, ii) a first switch circuit disposed between the source line and an output of the current steering circuit, iii) a second switch circuit disposed in parallel with the first switch between the source line and a reference potential point; a bit line drive circuit that is connected to the bit line and that includes i) a third switch circuit disposed between the bit line and the reference potential point, and ii) a fourth switch circuit disposed in parallel with the third switch between the bit line and a second voltage source; and a control circuit that controls at least the NMOS transistor, the source line drive circuit and the bit line drive circuit. The nonvolatile memory element completes to change from the high resistance state to the low resistance state when a voltage higher than or equal to a low resistance change ending voltage is applied between the first electrode and the second electrode, wherein the low resistance change ending voltage varies in a range between a first voltage and a second voltage higher than the first voltage. When the control circuit causes the nonvolatile memory element to be in the low resistance state for a writing operation, i) the control circuit turns on the first switch circuit and the third switch circuit, and turns off the second switch circuit and the fourth switch circuit to flow a first current from the first voltage source to the reference potential point, and ii) the control circuit applies a first gate voltage to the gate of the NMOS transistor. When the control circuit causes the nonvolatile memory element to be in the high resistance state for the writing operation, i) the control circuit turns off the first switch circuit and the third switch circuit, and turns on the second switch circuit and the fourth switch circuit to flow a second current from the second voltage source to the reference potential point, and ii) the control circuit applies a second gate voltage to the gate of the NMOS transistor, the second gate voltage being lower than the first gate voltage.

When the control circuit causes the nonvolatile memory element to be in the low resistance state for the writing operation, the control circuit controls the first current to be a constant current lower than a drive current that flows through the NMOS transistor, by applying the first gate voltage to the gate of the NMOS transistor.

In this manner, when the nonvolatile memory element is written to a low resistance state, a current, which is steered by a current steering circuit, is applied to the nonvolatile memory element. On the other hand, when the variable resistance nonvolatile memory element is written to a high resistance state, a gate voltage, which is lower than a voltage applied when the variable resistance nonvolatile memory element is written to a low resistance state, is applied to the gate of the NMOS transistor. Consequently, resistance change operation is continued, that is more stable than in a conventional manner. Also, the current, which flows through the variable resistance nonvolatile memory element at the end of a change to a low resistance state, is regulated to a constant current value.

The variable resistance nonvolatile memory device may further include a gate clamp power source that applies a clamp voltage to the current steering circuit. The current steering circuit may comprise a PMOS transistor, a source of the PMOS transistor is connected to the first voltage source, a drain of the PMOS transistor is connected to the first switch circuit, a gate of the PMOS transistor is connected to the gate clamp power source, a voltage Vclamp of the gate clamp power source is a constant voltage satisfying 0 [V]<Vclamp<VdL−Vtp, where Vtp is a threshold value voltage of the PMOS transistor, and VdL is the first reference voltage at the first voltage source. When the nonvolatile memory element is written to a low resistance state, the NMOS transistor may perform a source follower operation and the PMOS transistor performs a drain drive operation.

In this manner, when the nonvolatile memory element is written to a low resistance state, the NMOS transistor performs a source follower operation and the PMOS transistor included in the current steering circuit performs a drain drive operation. Therefore, current steering is performed by the PMOS transistor more reliably.

The PMOS transistor may have a characteristic in which a change rate of a drain current with respect to a source voltage is 2 [μA]/0.1 [V] or lower in a saturation region of voltage-current characteristic that indicates a relation of the source voltage with the drain current.

Thus, in the saturation region of the PMOS transistor, an increase in current with respect to an increase in source-drain voltage is controlled within a certain range, and applied current at the end of a change to a low resistance state is reliably regulated.

The nonvolatile memory element may start to change from the high resistance state to the low resistance state when a voltage higher than or equal to a low resistance change starting voltage is applied between the first electrode and the second electrode. The low resistance change starting voltage may vary in a range between a third voltage and a fourth voltage higher than the third voltage. When the control circuit applies the first gate voltage to the gate of the NMOS transistor, at least VwL>VRS2+Vtns may be satisfied. VwL is the first gate voltage. Vtns is a threshold value voltage when the NMOS transistor performs a source follower operation. VRS2 is the fourth voltage.

In this manner, a voltage exceeding the low resistance change starting voltage at an assumed maximum voltage is applied to the variable resistance nonvolatile memory element, and writing to a low resistance state is reliably performed.

When the control circuit applies the second gate voltage to the gate of the NMOS transistor, a drain current of the NMOS transistor may be between 1 time and 1.7 times the constant current in a non-saturation region of a voltage-current characteristic that indicates a relation of a source voltage of the NMOS transistor with the drain current of the NMOS transistor. More preferably, the drain current of the NMOS transistor may be between 1.3 times and 1.5 times the constant current in the non-saturation region.

In this manner, when the variable resistance nonvolatile memory element is written to a high resistance state, a suitable voltage is applied to the gate of the NMOS transistor. Therefore, stable high resistance operation may be performed.

The nonvolatile memory element may have characteristics in which the nonvolatile memory element starts to change from a low resistance state to a high resistance state when a voltage higher than or equal to a high resistance change starting voltage is applied between the first electrode and the second electrode. The high resistance change starting voltage may vary in a range between a fifth voltage and a sixth voltage higher than the fifth voltage, and VdH≤Vdd+VRE2 may be satisfied. VdH is a second reference voltage at the second voltage source. VRE2 is the sixth voltage. Vdd is a drain voltage corresponding to the non-saturation region in the voltage-current characteristic of the NMOS transistor.

In this manner, change to a high resistance state is made in the non-saturation region of the NMOS transistor, and stable high resistance operation may be performed.

Furthermore, the variable resistance nonvolatile memory device may further include: a third voltage source at which a third reference voltage is set; a fifth switch circuit having one terminal connected to the second diffusion layer region of the NMOS transistor and having the other terminal connected to both of the first switch circuit and the second switch circuit; a sixth switch circuit having one terminal connected to the second electrode of the nonvolatile memory element and having the other terminal connected to both of the third switch circuit and the fourth switch circuit; a seventh switch circuit disposed between the source line and the third voltage source; and an eighth switch circuit disposed between the bit line and the third voltage source. When the control circuit causes the nonvolatile memory element to be in the low resistance state or the high resistance state for the writing operation, the control circuit may turn on the fifth switch circuit and the sixth switch circuit, and may turn off the seventh switch circuit and the eighth switch circuit. When the control circuit does not causes the nonvolatile memory element to be in the low resistance state or the high resistance state for the writing operation, the control circuit may turn off the fifth switch circuit and the sixth switch circuit, and may turn on the seventh switch circuit and the eighth switch circuit.

In this manner, precharge to the source line and the bit line is possible using the third voltage source as a precharge power source.

Furthermore, the nonvolatile memory element may have characteristics in which the absolute value of the low resistance change ending voltage is equal to the absolute value of the high resistance change starting voltage. When VRE is the absolute value of the high resistance change starting voltage, and VRS is the absolute value of the low resistance change starting voltage, VRE≤VRS may be satisfied.

In this manner, resistance change operation is performed in suitable conditions for continuing stable resistance change operation.

An aspect of the present disclosure provides a variable resistance nonvolatile memory device including: a memory cell array in which a plurality of memory cells are arranged in a row direction and in a column direction, each of the plurality of memory cells having i) a nonvolatile memory element that includes a first electrode, a second electrode, and a variable resistance layer between the first electrode and the second electrode, and that changes reversibly between a low resistance state and a high resistance state according to an applied electrical signal, and ii) an NMOS transistor including a first diffusion layer region, a gate, and a second diffusion layer region, the first diffusion layer region being connected to the first electrode; a plurality of bit lines, each of the plurality of bit lines being connected to the second electrode of corresponding one of the nonvolatile memory elements; a plurality of source lines arranged in the same direction as the plurality of bit lines, each of the plurality of source lines being paired with a corresponding one of the plurality of bit lines and being connected to the second diffusion region of corresponding one of the NMOS transistors; a plurality of word lines arranged in a perpendicular direction to the plurality of bit lines and the plurality of source lines, each of the plurality of word lines being connected to the gate of a corresponding one of the NMOS transistors; a column selection circuit that selects one of the plurality of source lines and one of the plurality of bit lines; a row selection circuit that selects one of the plurality of word lines; a source line drive circuit that includes i) a current steering circuit connected to a first voltage source, ii) a first switch circuit disposed between the source line and an output of the current steering circuit, iii) a second switch circuit disposed in parallel with the first switch between the source line and a reference potential point, wherein the source line drive circuit is connected to one of the plurality of the source lines via the column selection circuit; a bit line drive circuit that includes i) a third switch circuit disposed between the bit line and the reference potential point, and ii) a fourth switch circuit disposed in parallel with the third switch between the bit line and a second voltage source, wherein the bit line drive circuit is connected to one of the plurality of the bit lines via the column selection circuit; and a control circuit that controls at least the NMOS transistor, the source line drive circuit, the bit line drive circuit, the column selection circuit, and the row selection circuit. Each of the nonvolatile memory elements may complete to change from the high resistance state to the low resistance state when a voltage higher than or equal to a low resistance change ending voltage is applied between the first electrode and the second electrode. The low resistance change ending voltage may vary in a range between a first voltage and a second voltage higher than the first voltage. When the control circuit causes the nonvolatile memory element between one bit line and one source line selected by the column selection circuit, to be in the low resistance state for a writing operation, i) the control circuit may turn on the first switch circuit and the third switch circuit, and may turn off the second switch circuit and the fourth switch circuit to flow a first current from the first voltage source to the reference potential point, and ii) the control circuit may apply a first gate voltage to the gate of the NMOS transistor of the nonvolatile memory element between the one bit line and the one source line selected by the column selection circuit. When the control circuit causes the nonvolatile memory element between one bit line and one source line selected by the column selection circuit, to be in the high resistance state for the writing operation, i) the control circuit may turn off the first switch circuit and the third switch circuit, and may turn on the second switch circuit and the fourth switch circuit to flow a second current from the second voltage source to the reference potential point, and ii) the control circuit may apply a second gate voltage to the gate of the NMOS transistor of the nonvolatile memory element between the one bit line and the one source line selected by the column selection circuit, the second gate voltage being lower than the first gate voltage.

The column selection circuit may include a plurality of fifth switch circuits and includes a plurality of sixth switch circuits. Each of the plurality of the fifth switch circuits may have one terminal connected to a corresponding one of the memory cells and may have the other terminal connected to both of the first switch circuit and the second switch circuit. Each of the plurality of the sixth switch circuits may have one terminal connected to the corresponding one of the memory cells and may have the other terminal connected to both of the third switch circuit and the fourth switch circuit.

In this manner, the variable resistance nonvolatile memory device is achieved that is provided with a memory cell array including memory cells capable of stably continuing a resistance change operation.

The variable resistance nonvolatile memory device further may include a third voltage source at which a third reference voltage is set. The column selection circuit further may include a seventh switch circuit disposed between the plurality of source lines and the third voltage source, and a eighth switch circuit disposed between the plurality of bit lines and the third voltage source. When the control circuit causes one of the nonvolatile memory elements to be in the low resistance state or the high resistance state for the writing operation, the control circuit may turn on a corresponding one of the fifth switch circuits and a corresponding one of the sixth switch circuits, and may turn off the seventh switch circuit and the eighth switch circuit. When the control circuit does not causes the one of the nonvolatile memory elements to be in the low resistance state or the high resistance state for the writing operation, the control circuit may turn off the corresponding one of the fifth switch circuits and the corresponding one of the sixth switch circuits, and may turn on the seventh switch circuit and the eighth switch circuit.

In this manner, precharge to non-selection source lines and non-selection bit lines is made possible.

Also, $0 [V] < VPR < VwL - Vtns$ may be satisfied, where VPR is the third reference voltage, VwL is the first gate voltage, and Vtns is a threshold value voltage when the NMOS transistor performs the source follower operation. The third reference voltage VPR may be $(VwL-Vtns)/2$.

In this manner, the potential difference between the gate of an NMOS transistor and channel is regulated, the NMOS transistor in each non-selection memory cell. Therefore, it is possible to improve the reliability of the variable resistance nonvolatile memory device which is formed in more fine processes.

Each of the nonvolatile memory elements may start to change from the high resistance state to the low resistance state when a voltage higher than or equal to a low resistance change starting voltage is applied between the first electrode and the second electrode. The low resistance change starting voltage may vary in a range between a third voltage and a fourth voltage higher than the third voltage. Each of the nonvolatile memory elements may have characteristics in which when the writing operation in the high resistance state and the writing operation in the low resistance state are alternately repeated, a plurality of low resistance change starting voltages corresponding to the nonvolatile memory elements may be distributed according to a normal distribution. When the control circuit causes the nonvolatile memory element to be in the low resistance state, the control circuit may select a corresponding one of the word lines to apply the first gate voltage to the gate of a corresponding one of the NMOS transistors to satisfy $VwL > VRS2 + Vtns$. VRS2 is the fourth voltage which is derived based on an occurrence probability of $1/(A \times B)$, VwL is the first gate voltage, and Vtns is a threshold value voltage when the NMOS transistor performs the source follower operation. A is the number of the memory cells arranged in the memory cell array, and B is a maximum number of times of rewriting the memory cell array in a high resistance state or a low resistance state.

Thus, resistance change operation is assured that is in accordance with the specification for the number of memory cells and a maximum number of times of rewriting.

When the control circuit causes nonvolatile memory element to be in the high resistance state, the control circuit may select a corresponding one of the word lines to apply the second gate voltage to the gate of a corresponding one of the NMOS transistors to be a drain current of the NMOS transistor between 1 time and 1.7 times the constant current in a non-saturation region of a voltage-current characteristic. The non-saturation region of the voltage-current characteristic may indicate a relation of a source voltage of the NMOS transistor with the drain current of the NMOS transistor. The control circuit may select a corresponding one of the word lines to apply the first gate voltage to the gate of a corresponding one of the NMOS transistors to satisfy $VwL > 1.8 [V] + Vtns$. VwL is the first gate voltage, and Vtns is a threshold value voltage when the NMOS transistor performs the source follower operation. The control circuit may apply the first gate voltage to the gate of the corresponding one of the NMOS transistors to satisfy VwL=≥2.2 [V]+Vtns. The control circuit may apply the second gate voltage to the gate of the corresponding one of the NMOS transistors to be the drain current between 1.3 times and 1.5 times the constant current.

In this manner, resistance change operation is performed in suitable conditions for continuing stable resistance change operation.

Furthermore, a voltage switching circuit may be provided that selectively supplies one of the first gate voltage, the second gate voltage, and a third gate voltage to the row selection circuit, the third gate voltage being a voltage to be applied to the gate of the NMOS transistor connected to the variable resistance nonvolatile memory element that reads a resistance state by a read circuit. The control circuit may control the voltage switching circuit so that when the variable resistance nonvolatile memory element is written to a low resistance state, the first gate voltage is selected, when the variable resistance nonvolatile memory element is written to a high resistance state, the second gate voltage is selected, and when a read operation is performed on the variable resistance nonvolatile memory element, the third gate voltage is selected.

In this manner, a voltage is selectively applied to the gate of the NMOS transistor.

Furthermore, a voltage generation circuit may be provided that generates at least one of the first gate voltage, the second gate voltage, the third gate voltage, the voltage of the gate clamp power source, the voltage of the first voltage source, the voltage of the second voltage source, and the voltage of the third voltage source.

Accordingly, a variable resistance nonvolatile memory device which contained various power supplies is achieved.

A writing method according to an aspect of the present disclosure is a method to be performed in a variable resistance nonvolatile memory device including a memory cell that is formed by connecting (1) a variable resistance nonvolatile memory element including a first electrode, a second electrode, and a variable resistance layer which is interposed between the first electrode and the second electrode, connected to the first and second electrodes, and which changes reversibly between a low resistance state and a high resistance state according to one of electrical signals having different polarities applied across the first and second electrodes; and (2) an NMOS transistor including a first diffusion layer region, a gate, and a second diffusion layer region that is formed in the opposite side of the first diffusion layer region with respect to the gate. In the memory cell, the first electrode and the first diffusion layer region are connected, and the variable resistance nonvolatile memory device further includes (1) a source line connected to the second diffusion layer region; (2) a bit line connected to the second electrode; and (3) a write circuit including a current steering circuit connected to a first voltage source, a first switch circuit to connect the output of the current steering circuit and the source line, a second switch circuit to connect the source line and a reference potential, a third switch circuit to connect the bit line and the reference potential, and a fourth switch circuit to connect the bit line and a second voltage source. When the variable resistance nonvolatile memory element is written to a low resistance state, the writing method includes the steps of turning on the first switch circuit and the third switch circuit, turning off the second switch circuit and the fourth switch circuit, and performing control to apply a first gate voltage to the gate. When the variable resistance nonvolatile memory element is written to a high resistance state, the writing method includes turning off the first switch circuit and the third switch circuit, turning on the second switch circuit and the fourth switch circuit, and performing control to apply a second gate voltage to the gate, the second gate voltage being lower than the first gate voltage.

In this manner, when a low resistance state is written to the variable resistance nonvolatile memory element, a current, which is steered by a current steering circuit, is applied to the variable resistance nonvolatile memory element. On the other hand, when the variable resistance nonvolatile memory element is written to a high resistance state, a gate voltage, which is lower than a voltage applied when the variable resistance nonvolatile memory element is written to a low resistance state, is applied to the gate of the NMOS transistor. Consequently, resistance change operation is continued, that is more stable than in a conventional manner.

Hereinafter, a variable resistance nonvolatile memory device and a method of writing to the variable resistance nonvolatile memory device will be specifically described with reference to the drawings.

Each of the embodiments described below presents a specific example of the present disclosure. The numerical values, shapes, materials, components, arrangement positions and connection configurations of the components, steps, the order of the steps shown in the following embodiment each provide an example, and are not intended to limit the present disclosure. Any component, which is included in the components of the following embodiments and not recited in the independent claim that provides the most generic concept, will be described as an arbitrary component.

Embodiment

Basic Data of the Present Disclosure

First, the results of experiment on the variable resistance nonvolatile memory element, which form the basis of the present disclosure will be described.

FIG. 1 is a circuit diagram of a conventional 1T1R memory cell 1000 which is used to compare experimental effects. A memory cell transistor 1 having an NMOS transistor and a variable resistance nonvolatile memory element 2 are connected in series to form a memory cell 3. The memory cell transistor 1 has a drain D, a source S, and a gate G. The gate G is connected to a memory cell gate MG. FIG. 1 illustrates the case where a current flows from a source line SL to a bit line BL. Thus, in this example, the drain D of the memory cell transistor 1 is connected to the source line SL. Also, a variable resistance nonvolatile memory element 2 has one end connected with the source S of the memory cell transistor 1 and the other end connected with the bit line BL.

When a current flows from the bit line BL to the source line SL, the end of the memory cell transistor 1, which is connected to the variable resistance nonvolatile memory element 2, serves as the drain D, and the end of the memory cell transistor 1, which is connected to the source line SL, serves as the source S. One of the source S and the drain D corresponds to a first diffusion layer region, and the other corresponds to a second diffusion layer region that is formed in the opposite side of the first diffusion layer region with respect to the gate.

When the memory cell 3 is changed to a low resistance state, voltage pulses are applied to the source line SL for a predetermined period by a typical driver circuit (not illustrated) having sufficient drive capability with the bit line BL as a reference potential, thereby causing a current to flow in a direction from the source line SL to the bit line BL. When the memory cell 3 is changed to a high resistance state, voltage pulses are applied to the bit line BL for a predetermined period by a typical driver circuit (not illustrated) having sufficient drive capability with the source line SL as a reference potential, thereby causing a current to flow in a direction from the bit line BL to the source line SL. In the change to a high resistance state, the end of the memory cell transistor 1, which is connected to the variable resistance nonvolatile memory element 2, serves as the drain D, and the end of the memory cell transistor 1, which is connected to the source line SL, serves as the source S.

The memory cell 3 is evaluated by applying a predetermined voltage to the source line SL, the bit line BL, and the memory cell gate MG using the memory cell for each bit.

Figure 2:
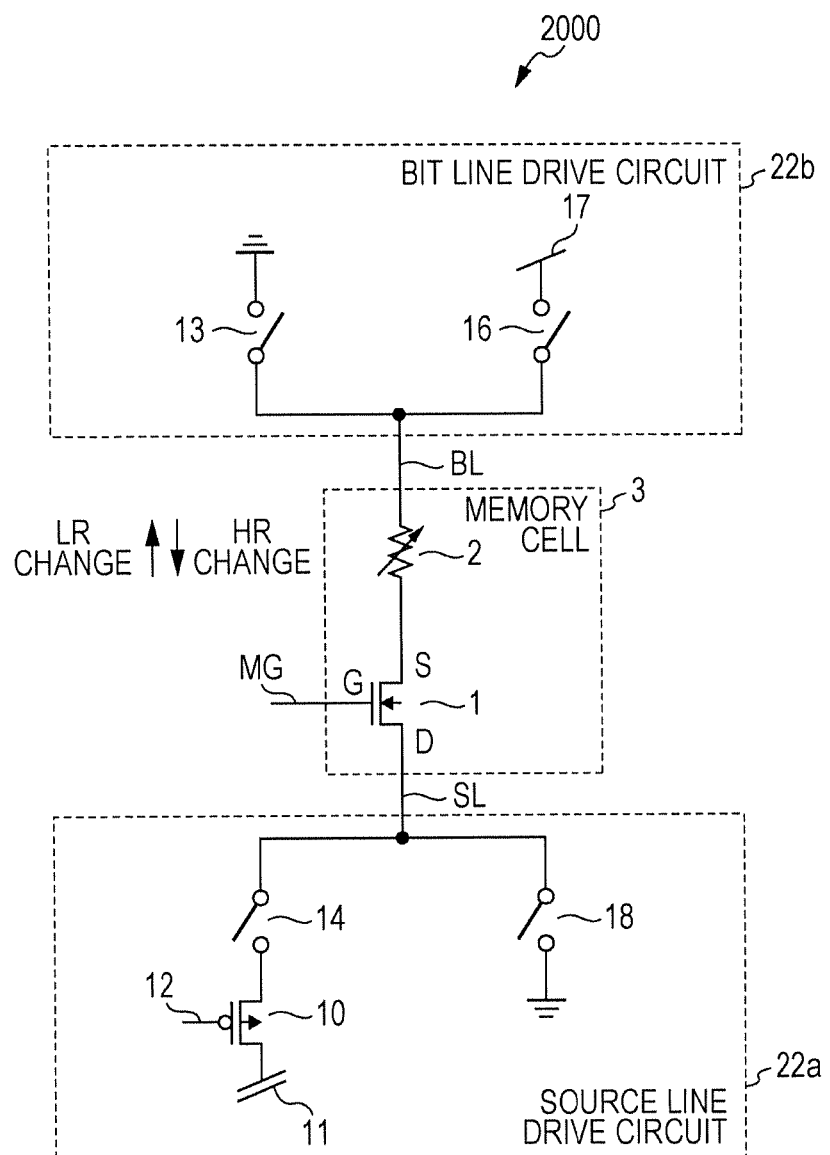
FIG. 2 is a circuit diagram of a 1T1R memory cell including a current steering circuit in an embodiment.

FIG. 2 is a circuit diagram of a 1T1R memory cell 2000 (circuit for evaluation) including a current steering circuit in the embodiment of the present disclosure. The same component as in FIG. 1 is denoted by the same symbol.

In the 1T1R memory cell 2000 including the current steering circuit in the present embodiment, a source line drive circuit 22a is connected to the source line SL of the memory cell 3, and a bit line drive circuit 22b is connected to the bit line BL of the memory cell 3.

A current steering element 10 for LR change including a PMOS transistor is an example of the current steering circuit connected to the first voltage source, and steers a current at the time of resistance change operation. The first voltage source is the voltage source that supplies a voltage to a power source terminal 11 for LR change. The drain of the current steering element 10 for LR change is connected to the source line SL via a source line selection switch 14 for LR change, and the source of the current steering element 10 for LR change is connected to the power source terminal 11 for LR change. The source line selection switch 14 for LR change is an example of the first switch circuit that connects the output of the current steering circuit and the source line. The gate of the current steering element 10 for LR change is a clamp control terminal 12 for LR change. Furthermore, the source line SL is connected to a ground power source terminal (that is, reference potential) via a source line selection switch 18 for HR change. The source line selection switch 18 for HR change is an example of the second switch circuit that connects the source line and the reference potential.

The bit line BL is connected to a ground power source terminal (that is, reference potential) via a bit line selection switch 13 for LR change. The bit line selection switch 13 for LR change is an example of the third switch circuit that connects the bit line and the reference potential. The bit line BL is further connected to a power supply terminal 17 for HR change via a bit line selection switch 16 for HR change. The bit line selection switch 16 for HR change is an example of the fourth switch circuit that connects the bit line and the second voltage source. The second voltage source is a power source that supplies a voltage to the power source terminal 17 for HR change.

When the memory cell 3 is changed to a low resistance state, the bit line selection switch 13 for LR change and the source line selection switch 14 for LR change are brought into conduction (turned on) for a predetermined period, and the bit line selection switch 16 for HR change and the source line selection switch 18 for HR change are brought out of conduction (turned off), thereby causing a current to flow from the source line SL to the bit line BL.

When the memory cell 3 is changed to a high resistance state, the bit line selection switch 13 for LR change and the source line selection switch 14 for LR change are turned off, and the bit line selection switch 16 for HR change and the source line selection switch 18 for HR change are turned on for a predetermined period, thereby causing a current to flow from the bit line BL to the source line SL.

In this circuit for evaluation, the purpose is to evaluate the memory cell 3 for each bit by applying a predetermined voltage to each of the terminals of the source line drive circuit 22a and the bit line drive circuit 22b.

It is to be noted that when a memory cell array is formed, the source line drive circuit 22a and bit line drive circuit 22b are shared by plural memory cells 3.

The bit line selection switch 13 for LR change, the source line selection switch 14 for LR change, the bit line selection switch 16 for HR change, and the source line selection switch 18 for HR change are each a general selection circuit including a transistor. The sizes, the configuration, and the gate voltages of those transistors are set so as to reduce the voltage drop at those switches to a low level as much as possible and to avoid effects due to current.

Figure 3A:
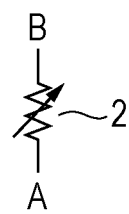
FIG. 3A is a circuit diagram of a variable resistance nonvolatile memory element in the embodiment.
Figure 3B:
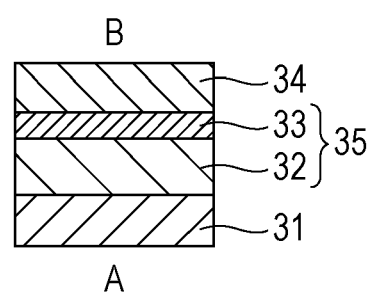
FIG. 3B is a sectional view of the variable resistance nonvolatile memory element before forming is performed in the embodiment.
Figure 3C:
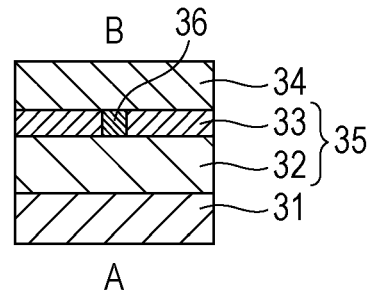
FIG. 3C is a sectional view of the variable resistance nonvolatile memory element after forming is performed in the embodiment.

FIGS. 3A, 3B, and 3C are each a graph illustrating a cross-sectional structure of the variable resistance nonvolatile memory element 2. FIG. 3A is a circuit diagram of the variable resistance nonvolatile memory element 2. FIG. 3B is a cross-sectional view of the variable resistance nonvolatile memory element 2 before forming is performed. FIG. 3C is a cross-sectional view of the variable resistance nonvolatile memory element 2 after forming is performed.

The variable resistance nonvolatile memory element 2 in FIG. 3A is an element that is used in both the conventional 1T1R memory cell 1000 described with reference to in FIG. 1 and the 1T1R memory cell 2000 including a current steering circuit in the present embodiment, described with reference to in FIG. 2.

In the variable resistance nonvolatile memory element 2 illustrated in FIGS. 3A, 3B, and 3C, terminal A indicates the terminal connected to the memory cell transistor 1, and terminal B indicates the terminal connected to the bit line BL.

The variable resistance nonvolatile memory element 3000a illustrated in FIG. 3B indicates the structure after the variable resistance nonvolatile memory element is manufactured and before forming is performed. It is to be noted that a variable resistance nonvolatile memory element, after being manufactured, enables a resistance change operation only after voltage application processing called forming is performed on the variable resistance nonvolatile memory element.

The variable resistance nonvolatile memory element 3000a includes a first electrode 31 (lower electrode) corresponding to the terminal A, a second electrode 34 (upper electrode) corresponding to the terminal B, and a variable resistance layer 35 including an oxygen-deficient metal oxide. The variable resistance layer 35 includes a first metal oxide layer 32 and a second metal oxide layer 33 that are stacked on top of each other, the first metal oxide layer 32 being composed of oxygen-deficient metal oxide, the second metal oxide layer 33 being composed of metal oxide having a lower degree of oxygen deficiency than the first metal oxide layer 32 has.

A variable resistance nonvolatile memory element 3000b illustrated in FIG. 3C indicates the structure after forming is performed. An electric stress is applied by voltage application processing called forming to the variable resistance nonvolatile memory element 3000a that has not undergone forming. As a result, as illustrated in FIG. 3C, a fine filament 36, which serves as a conductive path, is formed in a local region of the second metal oxide layer 33. An oxidation-reduction reaction occurs in the fine filament 36, and resistance change phenomenon occurs due to change of the resistance value of the fine filament 36. Hereinafter, the resistance change operation described in the present embodiment is based on the structure of the variable resistance nonvolatile memory element 3000b after forming is performed.

Here, the variable resistance layer 35 is a layer which is interposed between the first electrode 31 and the second electrode 34 and in which a resistance value changes reversibly according to an electrical signal applied across the first electrode 31 and the second electrode 34. For example, the variable resistance layer 35 is a layer which changes reversibly between a high resistance state and a low resistance state according to the polarity of a voltage applied across the first electrode 31 and the second electrode 34. The variable resistance layer 35 includes at least two stacked layers: the first metal oxide layer 32 connected to the first electrode 31 and the second metal oxide layer 33 connected to the second electrode 34.

The first metal oxide layer 32 is composed of a first oxygen-deficient metal oxide, and the second metal oxide layer 33 is composed of a second metal oxide having a lower degree of oxygen deficiency than the first metal oxide layer has. Since the second metal oxide has a lower degree of oxygen deficiency (that is, higher content of oxygen) than the first metal oxide, and thus forms a higher resistance layer than the first metal oxide. In the second metal oxide layer 33, a tiny local region is formed where the degree of oxygen deficiency changes reversibly according to application of electrical pulses. It is presumed that the local region contains the filament 36 which includes an oxygen defective site.

The "degree of oxygen deficiency" in metal oxide indicates the ratio of insufficient oxygen to the amount of oxygen included in an oxide having a stoichiometric composition (when plural stoichiometric compositions exist, the one having the highest resistance value). An metal oxide having a stoichiometric composition is more stable and has a higher resistance value compared with any metal oxide having another composition.

For example, when a metal is tantalum (Ta), the oxide having a stoichiometric composition according to the definition is $Ta_2O_5$, which can be expressed as $TaO_{2.5}$. The degree of oxygen deficiency of $TaO_{2.5}$ is 0%, and the degree of oxygen deficiency of $TaO_{1.5}$ is given by $(2.5-1.5)/2.5=40\%$. The degree of oxygen deficiency of metal oxide with excess oxygen has a negative value. It is to be noted that unless otherwise stated, description is given under the assumption that the degree of oxygen deficiency herein includes a positive value, 0, and a negative value.

An oxide having a low degree of oxygen deficiency is similar to oxide having a stoichiometric composition, and thus has a high resistance value, whereas an oxide having a high degree of oxygen deficiency is similar to the metal included in oxide, and thus have a low resistance value.

The "oxygen content atomic percentage" is the ratio of the number of oxygen atoms to the total number of atoms. For example, the oxygen content atomic percentage of $Ta_2O_5$ is the ratio (O/(Ta+O)) of the number of oxygen atoms to the total number of atoms, which is 71.4 atm %. Therefore, the oxygen content atomic percentage of an oxygen-deficient tantalum oxide is higher than 0 and lower than 71.4 atm %. For example, In the case where the metal included in the first metal oxide layer 32 and the metal included in the second metal oxide layer 33 are the same type, the oxygen content atomic percentage and the degree of oxygen deficiency have a correlation. That is, when the oxygen content atomic percentage of the second metal oxide is higher than that of the first metal oxide, the degree of oxygen deficiency of the second metal oxide is lower than that of the first metal oxide.

For example, in the case where a tantalum oxide is used and the first metal oxide has a composition of $TaO_x$ and the second metal oxide has a composition of $TaO_y$, when x is 0.8 or greater and 1.9 or less and y is greater than the value of x, it is possible to change the resistance value of the variable resistance layer 35 rapidly in a stable manner. In this case, the coating thickness of the second metal oxide may be 1 to 8 nm or less.

A metal other than tantalum may be used as the metal included in the variable resistance layer 35. A transition metal or aluminum (Al) may be used as the metal included in the variable resistance layer 35. As a transition metal, tantalum (Ta), titanium (Ti), hafnium (Hf), a zirconium (Zr), niobium (Nb), tungsten (W), nickel (Ni) and others may be used. Because the transition metal can have plural oxidation states, it is possible to achieve different resistance states by an oxidation reduction reaction.

Different metals may be used for a first metal included in the first metal oxide and a second metal included in the second metal oxide. In this case, the second metal oxide may have a lower degree of oxygen deficiency, that is, a higher resistance than the first metal oxide. By adopting such a configuration, the majority of a voltage applied across the first electrode 31 and the second electrode 34 is distributed to the second metal oxide at the time of resistance change, and thus an oxidation reduction reaction induced in the second metal oxide is more likely to occur.

In the case where different materials are used for the first metal included in the first metal oxide forming the first metal oxide layer 32 and the second metal included in the second metal oxide forming the second metal oxide layer 33, the standard electrode potential of the second metal may be lower than the standard electrode potential of the first metal. The standard electrode potential indicates the characteristics that higher the value thereof, more resistant to oxidation. Therefore, an oxidation reduction reaction is likely to occur in the second metal oxide having a relatively lower standard electrode potential. Resistance change phenomenon is presumed to occur by the following mechanism: an oxidation reduction reaction occurs in a tiny local region which is formed in the second metal oxide having high resistance, and the filament (conductive path) 36 is transformed, thereby causing the resistance value (degree of oxygen deficiency) to change.

For example, by using an oxygen-deficient tantalum oxide ($TaO_x$) for the first metal oxide, and titanium oxide ($TiO_2$) for the second metal oxide, a stable resistance change operation is achieved. Titanium (standard electrode potential=−1.63 eV) is a material having a lower standard electrode potential than Tantalum (standard electrode potential=−0.6 eV). In this manner, a metal oxide having a lower standard electrode potential than the first metal oxide is used for the second metal oxide, and thus an oxidation reduction reaction is likely to occur in the second metal oxide. As another combination, aluminum oxide ($Al_2O_3$) may be used for the second metal oxide that forms a high resistance layer. For example, an oxygen-deficient tantalum oxide ($TaO_x$) may be used for the first metal oxide, and aluminum oxide ($Al_2O_3$) may be used for the second metal oxide.

Each resistance change phenomenon in the variable resistance layer 35 in a stacked layer structure is presumed to occur by the following mechanism: an oxidation reduction reaction occurs in a tiny local region which is formed in the second metal oxide having high resistance, and the filament (conductive path) 36 in the local region is transformed, thereby causing the resistance value to change.

That is, when a positive voltage relative to the first electrode 31 as a reference is applied to the second electrode 34 connected to the second metal oxide, oxygen ions in the variable resistance layer 35 are attracted to the second metal oxide. Thus, an oxidation reaction occurs in the tiny local region which is formed in the second metal oxide, and the degree of oxygen deficiency decreases. Consequently, the filament 36 in the local region is presumed to become less conductive, and the resistance value increases.

Conversely, when a negative voltage relative to the first electrode 31 as a reference is applied to the second electrode 34 connected to the second metal oxide (that is, a positive voltage relative to the second electrode 34 as a reference is applied to the first electrode 31), oxygen ions in the second electrode 34 are attracted to the first metal oxide. Thus, a reduction reaction occurs in the tiny local region which is formed in the second metal oxide, and the degree of oxygen deficiency increases. Consequently, the filament 36 in the local region is presumed to become more conductive, and the resistance value decreases.

The second electrode 34 connected to the second metal oxide having a lower degree of oxygen deficiency is composed of a material such as platinum (Pt), iridium (Ir), or palladium (Pd) that has a higher standard electrode potential compared with the metal included in the second metal oxide and the material included in the first electrode 31. The first electrode connected to the first metal oxide having a higher degree of oxygen deficiency may be composed of a material such as tungsten (W), nickel (Ni), tantalum (Ta), titanium (Ti), aluminum (Al), tantalum nitride (TaN), titanium nitride (TiN) that has a lower standard electrode potential compared with the metal included in the first metal oxide. The standard electrode potential indicates the characteristics that higher the value thereof, more resistant to oxidation.

That is, the relationship of Vr2<V2 and V1<V2 may be satisfied between a standard electrode potential V2 of the second electrode 34, a standard electrode potential Vr2 of the metal included in the second metal oxide, a standard electrode potential Vr1 of the metal included in the first metal oxide, and a standard electrode potential V1 of the first electrode 31. Optionally, the relationship of V2>Vr2 and Vr1≥V1 may be satisfied.

By adopting the above-described configuration, an oxidation reduction reaction selectively occurs in the second metal oxide in the vicinity of the interface between the second electrode 34 and the second metal oxide, and stable resistance change phenomenon is achieved.

The resistance value of the second metal oxide layer 33 having a higher resistance value than the first metal oxide layer 32 is, for example, several 100 MΩ to 1 GΩ approximately. On the other hand, even when the variable resistance nonvolatile memory element 2 changes to a high resistance state due to an oxidation reaction, the resistance value of the filament 36 is 100 kΩ to several MΩ. Consequently, the voltage applied across the first electrode 31 and the second electrode 34 is divided into the first metal oxide layer 32 and the second metal oxide layer 33, and the second metal oxide layer 33 having a higher resistance value receives a higher divided voltage, and current paths created accordingly are not uniform in the second metal oxide layer 33. Voltage and current are concentrated on the region of the filament 36 in the second metal oxide layer 33, the region having a lower resistance value. For this reason, it is useless to control voltage for preventing dielectric breakdown of an insulating layer with an extremely small thickness illustrated in the above-described Patent Documents 1 and 3. On the other hand, in the case of the variable resistance nonvolatile memory element 2 that operates according to a filament model, current and voltage have to be controlled additionally in order to allow a resistance change operation in the filament 36 to occur stably and continuously.

FIG. 4 is an evaluation flow diagram for the conventional 1T1R memory cell 1000 and the 1T1R memory cell 2000 including the current steering circuit in the present embodiment.

First, a low resistance operation (S10) and measurement of cell current (S11) are performed. Subsequently, change to a high resistance (S12) and measurement of cell current (S13) are performed. These resistance change operations are repeated for 100,000 times and completed (S14). The cell current measurement (S11, S13) is the step of checking whether the memory cell 3 has a desired resistance state due to the resistance change operations and also the step of measuring a current value by applying a low voltage to the variable resistance nonvolatile memory element 2, the low voltage causing no disturbance to the variable resistance nonvolatile memory element 2. Here, the disturbance indicates a phenomenon that affects a resistance state stored in the variable resistance nonvolatile memory element 2 with application of a voltage to the variable resistance nonvolatile memory element 2.

Figure 5A:
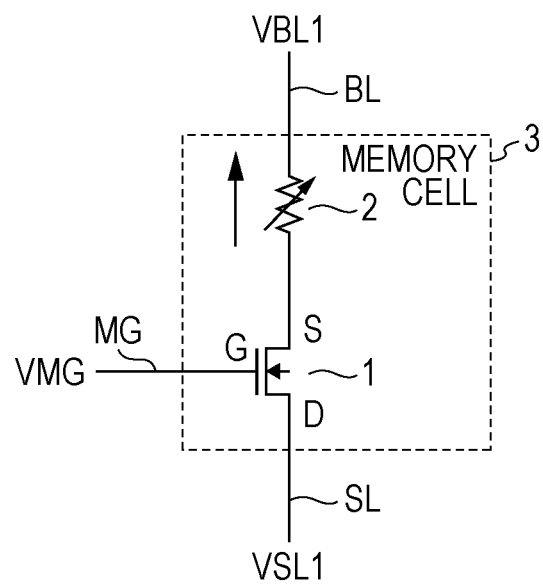
FIG. 5A is a diagram illustrating drive conditions at the time of change of the conventional 1T1R memory cell to a low resistance.
Figure 5B:
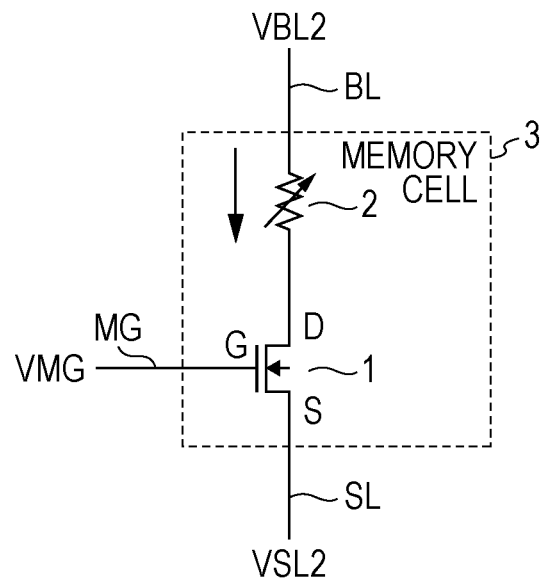
FIG. 5B is a diagram illustrating drive conditions at the time of change of the conventional 1T1R memory cell to a high resistance.

FIGS. 5A and 5B are each a diagram illustrating drive conditions for the conventional 1T1R memory cell 1000. FIG. 5A illustrates drive conditions for low resistance change, and FIG. 5B illustrates drive conditions for high resistance change.

In the low resistance change illustrated in FIG. 5A, a voltage pulse for 100 ns is applied to the bit line BL at voltage VBL1 of 0 [V], to the memory cell gate MG at voltage VMG of 2.4 [V], and to the source line SL at voltage VSL1 of 2.4 [V].

In the high resistance change illustrated in FIG. 5B, a voltage pulse for 50 ns is applied to the source line SL at voltage VSL2 of 0 [V], to the memory cell gate MG at voltage VMG of at 2.4 [V], and to the bit line BL at voltage VBL2 of 2.35[V].

In the cell current measurement, 0.4 [V] is applied to both ends of the memory cell 3, and a current flow at the moment is measured.

Figure 6A:
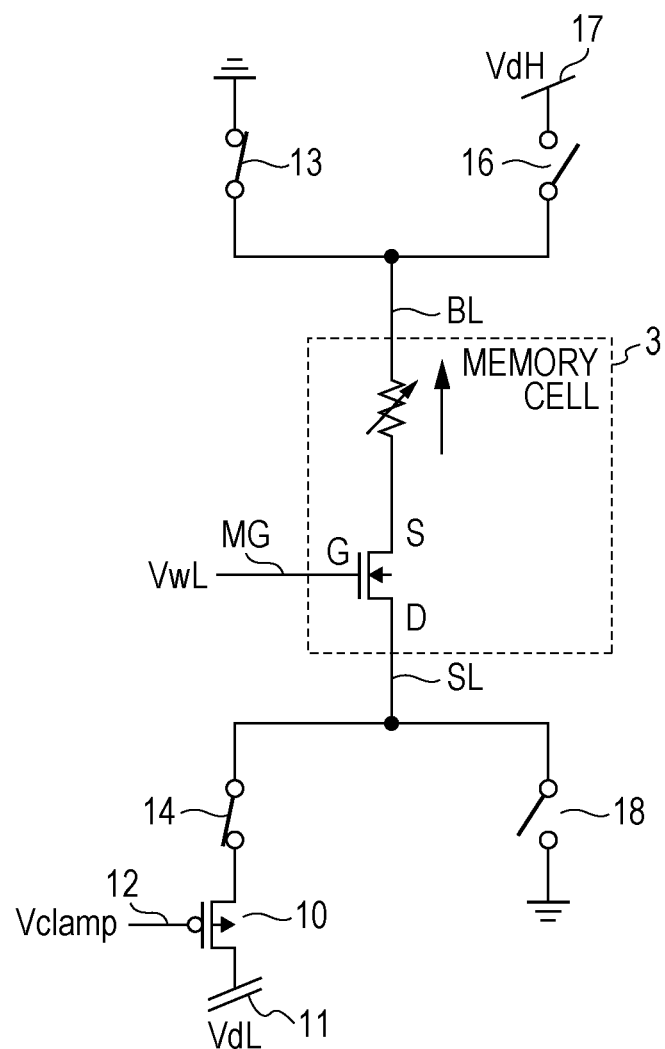
FIG. 6A is a diagram illustrating drive conditions at the time of change of 1T1R memory cell to a low resistance, the 1T1R memory including the current steering circuit in the embodiment.
Figure 6B:
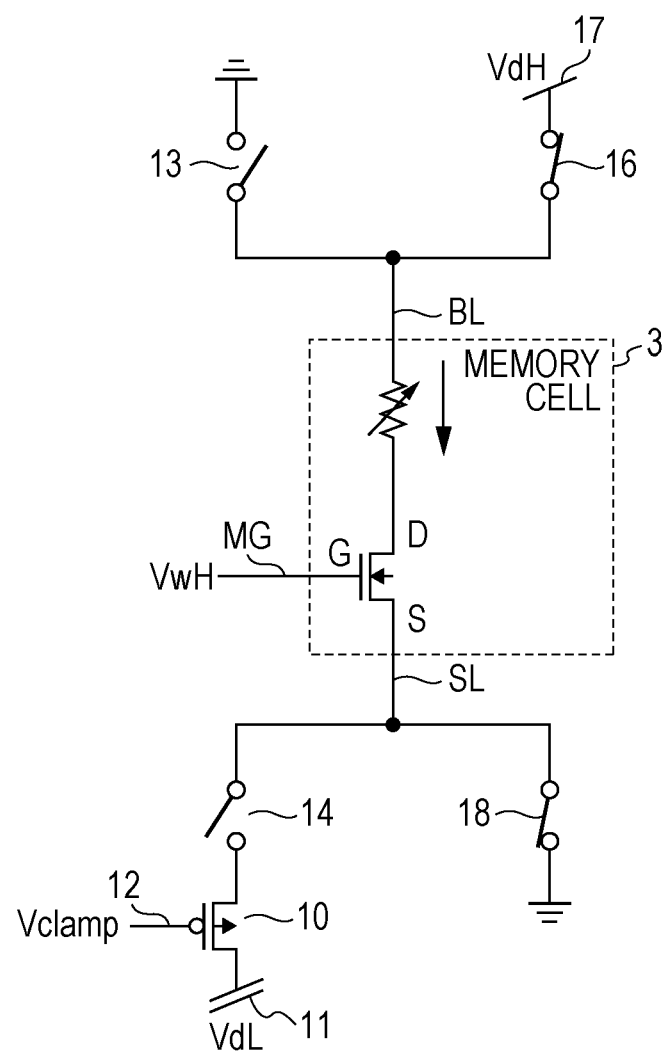
FIG. 6B is a diagram illustrating drive conditions at the time of change of 1T1R memory cell to a high resistance, the 1T1R memory including the current steering circuit in the embodiment.

FIGS. 6A and 6B are each a diagram illustrating drive conditions for the 1T1R memory cell 2000 including the current steering circuit in the embodiment. FIG. 6A illustrates drive conditions for low resistance change, and FIG. 6B illustrates drive conditions for high resistance change.

For both low resistance operation and high resistance operation, a voltage is regularly applied to the power source terminal 11 for LR change at voltage VdL of 2.8 [V], to the clamp control terminal 12 for LR change at voltage Vclamp of 2.15 [V], and to the power source terminal 17 for HR change at voltage VdH of 2.35 [V]. It is to be noted that the voltage Vclamp of the clamp control terminal 12 for LR change is preferably set to a nearly constant voltage that satisfies 0 [V]<Vclamp<VdL−Vtp, where Vtp is a threshold value voltage of the PMOS transistor included in the current steering element 10 for LR change.

In the low resistance operation illustrated in FIG. 6A, 2.8 [V] as voltage VwL (the first gate voltage) is applied to the memory cell gate MG connected to the gate G of the memory cell transistor 1, and the bit line selection switch 13 for LR change and the source line selection switch 14 for LR change are turned on during a period of 100 ns. During the period in which the bit line selection switch 13 for LR change and the source line selection switch 14 for LR change are turned on, the bit line selection switch 16 for HR change and the source line selection switch 18 for HR change are turned off.

In the high resistance operation illustrated in FIG. 6B, 1.45 [V] as the voltage VwH (the second gate voltage) lower than the voltage VwL (the first gate voltage) is applied to the memory cell gate MG connected to the gate G of the memory cell transistor 1, and the bit line selection switch 16 for HR change and the source line selection switch 18 for HR change are turned on. During the period in which the bit line selection switch 16 for HR change and the source line selection switch 18 for HR change are turned on, the bit line selection switch 13 for LR change and the source line selection switch 14 for LR change are turned off.

Similarly to the conventional technique, in the cell current measurement, both ends of the memory cell 3 are set to 0.4 [V] and a current flow at the moment is measured.

Next, a result of evaluation will be described. First, part of measurement data for 100,000 times of resistance change is used and tendency is described.

Figure 7A:
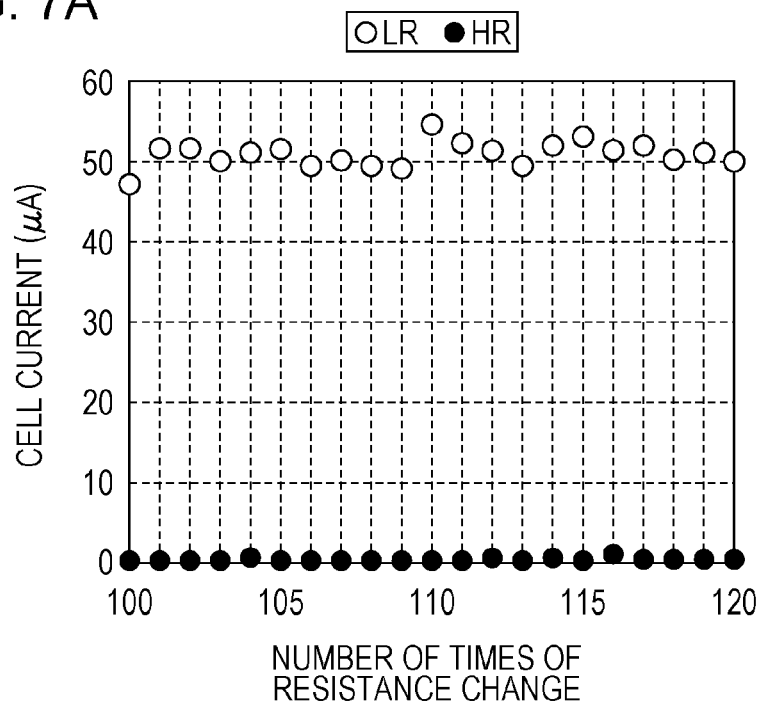
FIG. 7A is a graph illustrating a result of evaluation of cell current in resistance change of the conventional 1T1R memory cell.
Figure 7B:
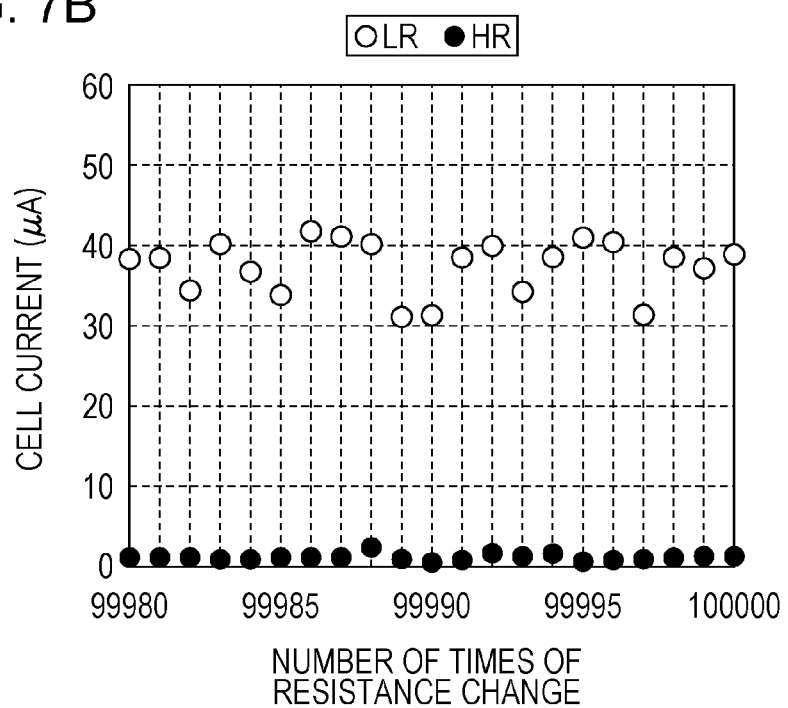
FIG. 7B is a graph illustrating a result of evaluation of cell current in resistance change of the conventional 1T1R memory cell.

FIGS. 7A and 7B are each a graph illustrating a result of evaluation of the conventional 1T1R memory cell 1000. FIG. 7A is a graph illustrating change in cell current in a high resistance state and a low resistance state each for the 100th time immediately after the start of evaluation to the 120th time (referred to as Number of Times of Resistance Change) where resistance change operation is stable after forming is performed. FIG. 7B is a graph illustrating change in cell current in a high resistance state and a low resistance state each for the 99980th time before the end of evaluation to the 100,000th time (referred to as Number of Times of Resistance Change). Each white circle indicates cell current in a low resistance state (referred to as LR) and each black circle indicates cell current in a high resistance state (referred to as HR).

In FIG. 7A, in a low resistance state, cell current stays around 50 [μA] with a variation of several [μA], whereas in a high resistance state, cell current stably stays around 1 [μA].

In FIG. 7B, in a low resistance state, cell current decreases compared with FIG. 7A and stays between 30 [μA] and 40 [μA] with a variation of 101 [μA], and in a high resistance state, cell current stays in a relatively stable manner.

Figure 8A:
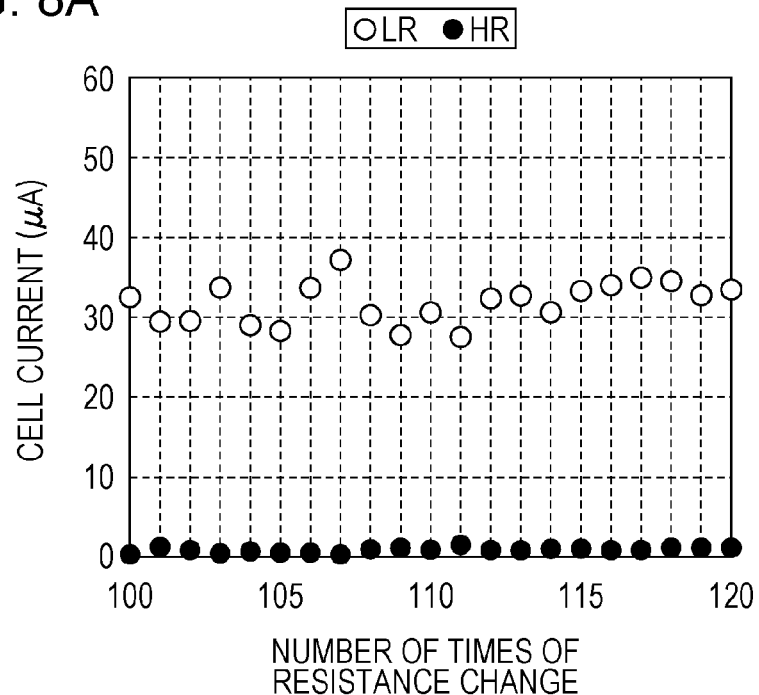
FIG. 8A is a graph illustrating a result of evaluation of cell current in resistance change of the 1T1R memory cell including the current steering circuit in the embodiment.
Figure 8B:
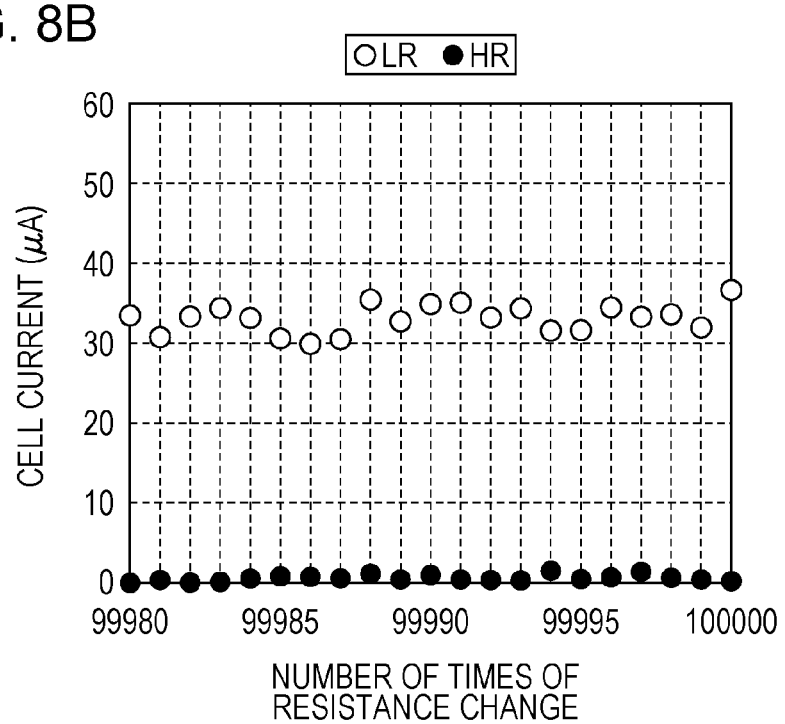
FIG. 8B is a graph illustrating a result of evaluation of cell current in resistance change of the 1T1R memory including the current steering circuit in the embodiment.

FIGS. 8A and 8B are each a graph illustrating a result of evaluation of the 1T1R memory cell 2000 including the current steering circuit in the present embodiment. FIG. 8A is a graph illustrating change in cell current in a high resistance state and a low resistance state each for the 100th time immediately after the start of evaluation to the 120th time (referred to as Number of Times of Resistance Change) where resistance change operation is stable after forming is performed. FIG. 8B is a graph illustrating change in cell current in a high resistance state and a low resistance state each for the 99,980th time before the end of evaluation to the 100,000th time (referred to as Number of Times of Resistance Change). Each white circle indicates cell current in a low resistance state (referred to as LR) and each black circle indicates cell current in a high resistance state (referred to as HR). In a low resistance state, the cell current is 30 [μA] to slightly less than 40 [μA] and the initial cell current is low. However, it can be seen that variation and change in cell current are small by comparison between FIG. 8A and FIG. 8B.

Next, statistical description is given using all the measurement data for 100,000 times of resistance change.

Figure 9:
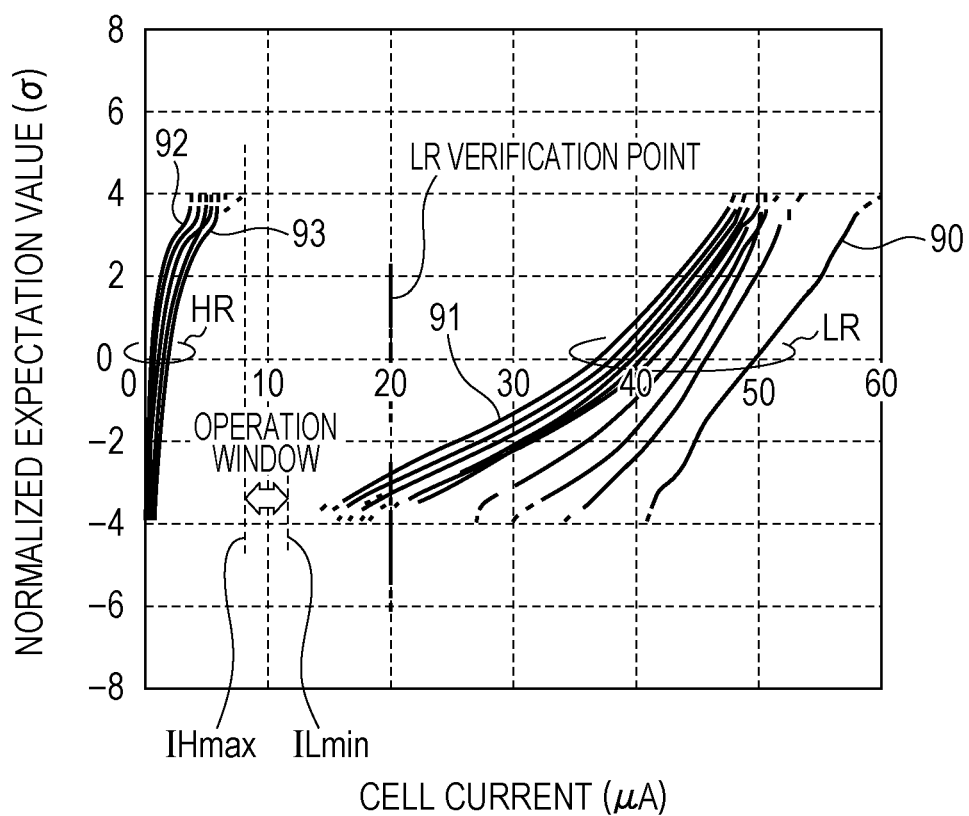
FIG. 9 is a graph illustrating plotted points for normalized expectation values that indicate distributions of cell current of the conventional 1T1R memory cell.

FIG. 9 is a graph illustrating plotted points for normalized expectation values for 10,000 times each of cell current of the conventional 1T1R memory cell 1000. For example, a cell current distribution 90 is a distribution indicated by plotted points for normalized expectation values of 10,000 cell currents from the 1st time to the 10,000th time in low resistance change, and the cell current of FIG. 7A is included to this region. A cell current distribution 91 is a distribution indicated by plotted points for normalized expectation values of 10,000 cell currents from the 90,001st time to the 100,000th time, and the cell current of FIG. 7B is included to this region.

It is to be noted that the cell current distributions between the cell current distribution 90 and the cell current distribution 91 in FIG. 9 are indicated by plotted points for normalized expectation values of 10,000 cell currents for each of the 10,001st time to the 20,000th time, the 20,001st time to the 30,000th time, the 30,001st time to the 40,000th time, the 40,001st time to the 50,000th time, the 50,001 st time to the 60,000th time, the 60,001st time to the 70,000th time, the 70,001st time to the 80,000th time, and the 80,001st time to the 90,000th time from the right to the left subsequent to the cell current distribution 90.

Similarly, a cell current distribution 92 indicates plotted points for normalized expectation values of 10,000 cell currents from the 1st time to the 10,000th time in high resistance change, and a cell current distribution 93 indicates plotted points for normalized expectation values of 10,000 cell currents from the 90,001st time to the 100,000th time.

The cell current distributions between the cell current distribution 92 and the cell current distribution 93 in FIG. 9 are indicated by plotted points for normalized expectation values for each of the 10,001st time to the 20,000th time, the 20,001st time to the 30,000th time, the 30,001st time to the 40,000th time, the 40,001st time to the 50,000th time, the 50,001st time to the 60,000th time, the 60,001st time to the 70,000th time, the 70,001st time to the 80,000th time, and the 80,001 st time to the 90,000th time from the left to the right subsequent to the cell current distribution 92.

The tendency seen in FIG. 7A and FIG. 7B is clearly understood when expressed statistically with reference to FIG. 9. For example, the cell current distribution 90 (plotted points for normalized expectation values for the 1st time to the 10,000th time) is substantially linear, and thus it can be seen that the cell currents (between the cell current distribution 90 and the cell current distribution 91) in a low resistance state have approximately a normal distribution. However, as the number of resistance changes increases, the cell current value successively decreases in overall, and the cell current distributions corresponding to sigma ($\sigma$)=0 or lower in normalized expectation values significantly extend toward the low current side.

Obvious change is also seen in the cell currents (between cell current distribution 92 and the cell current distribution 93) in a high resistance state. As the number of resistance changes increases, the cell current successively increases in overall, and the cell current distributions in the high current side, corresponding to sigma=0 or higher in normalized expectation values significantly extend.

In a storage device using a variable resistance nonvolatile memory element, a written low resistance state or high resistance state is read by a sense amplifier circuit, and it is determined whether read data is "1" or "0". In order to make the determination, a predetermined difference (operation window) or greater has to be provided between a minimum cell current value (ILmin) in a low resistance state and a maximum cell current value (IHmax) in a high resistance state.

When a memory cell array is formed, although a margin for several variations is taken into consideration, such as manufacturing variation in memory cell arrays, and variation in memory cells within each memory cell array, a predetermined operation window has to be ensured.

For this purpose, the operation window may be ensured, for example, by limiting the number of rewrite to approximately 10,000 times in which reduction and variation in cell current distribution in a low resistance state is small.

However, since the number of times of rewriting is limited, the application range of the variable resistance nonvolatile memory device is restricted.

As disclosed in the above-mentioned Non-Patent Document 1, verification writing may also be performed. In order to ensure a predetermined operation window, low resistance (LR) verification is performed, for example, relative to a cell current of 20 [μA] as a reference value for determination. When rewriting is performed on the memory cells with a cell current of 20 [μA] or lower until a cell current of 20 [μA] or higher is achieved, the operation window may be ensured and the number of times of rewriting has not to be limited.

In the example illustrated in FIG. 9 where the reference value for low resistance verification is set to 20 [μA], in the cell current distribution having 40,001 times to 50,000 times of rewriting, and subsequent cell current distributions, memory cells to be rewritten are found. As the number of times of rewriting increases, the number of memory cells to be rewritten increases.

In view of this characteristic, in addition to the problem that writing speed is reduced due to verification operations, as the number of times of rewriting increases, writing speed is presumed to be reduced.

Figure 10:
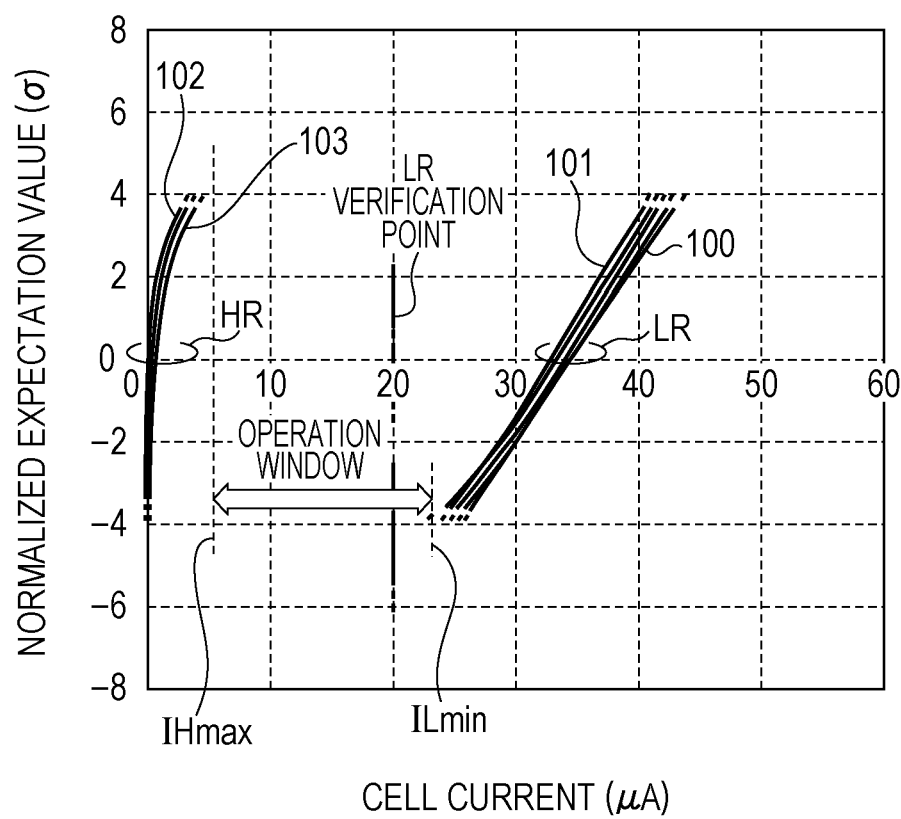
FIG. 10 is a graph illustrating distributions of cell current of the 1T1R memory cell including the current steering circuit in the embodiment.

FIG. 10 is a graph illustrating plotted points for normalized expectation values for 10,000 times each of cell current of the 1T1R memory cell 2000 including the current steering circuit in the present embodiment. For example, a cell current distribution 100 is a distribution indicated by plotted points for normalized expectation values of 10,000 cell currents from the 1st time to the 10,000th time in low resistance change, and the cell current of FIG. 8A is included to this region. Also, a cell current distribution 101 is a distribution indicated by plotted points for normalized expectation values of 10,000 cell currents from the 90,001st time to the 100,000th time, and the cell current of FIG. 8B is included to this region.

The cell current distributions between the cell current distribution 100 and the cell current distribution 101 in FIG. 10 are indicated by plotted points for normalized expectation values for each of the 10,001st time to the 20,000th time, the 20,001st time to the 30,000th time, the 30,001st time to the 40,000th time, the 40,001st time to the 50,000th time, the 50,001st time to the 60,000th time, the 60,001st time to the 70,000th time, the 70,001st time to the 80,000th time, and the 80,001st time to the 90,000th time from the right to the left subsequent to the cell current distribution 100.

Similarly, a cell current distribution 102 indicates plotted points for normalized expectation values of 10,000 cell currents from the 1st time to the 10,000th time in high resistance change, and a cell current distribution 103 indicates plotted points for normalized expectation values of 10,000 cell currents from the 90,001st time to the 100,000th time.

The cell current distributions between the cell current distribution 102 and the cell current distribution 103 in FIG. 10 are indicated by plotted points for normalized expectation values for each of the 10,001st time to the 20,000th time, the 20,001st time to the 30,000th time, the 30,001st time to the 40,000th time, the 40,001 st time to the 50,000th time, the 50,001st time to the 60,000th time, the 60,001 st time to the 70,000th time, the 70,001st time to the 80,000th time, and the 80,001st time to the 90,000th time from the left to the right subsequent to the cell current distribution 102.

As seen from FIG. 10, in contrast to the plotted points for normalized expectation values for the conventional 1T1R memory cell 1000 illustrated in FIG. 9, in the plotted points for normalized expectation values for the 1T1R memory cell 2000 including the current steering circuit in the present embodiment, both in a low resistance state and a high resistance state, there is almost no variation in linear distribution profile in the measurement up to 100,000 times, and substantially a normal distribution is maintained.

This indicates that the reliability in terms of the number of times of rewriting varies with difference types of memory cell drive device or driving method even when the same variable resistance nonvolatile memory element is used.

When the 1T1R memory cell 2000 including the current steering circuit in the present embodiment is used, the operation window is sufficiently ensured even for 100,000 times of rewriting, and change in the operation window depending on the number of times of rewriting is very small, thereby providing favorable characteristics, the operation window being determined by the minimum cell current value ILmin in a low resistance state and the maximum cell current value IHmax in a high resistance state.

Therefore, in contrast to the conventional technique, the 1T1R memory cell 2000 including the current steering circuit in the present embodiment allows the number of times of rewriting to increase significantly without using verification writing.

On the other hand, in order to assure a predetermined operation window by assuming several variations such as manufacturing variation in memory cell arrays, and variation in memory cells within each memory cell array, verification writing may be performed as needed. As described above, even when LR verification is performed using a cell current of 20 [μA] as a reference value for determination i.e. LR verification point, the 1T1R memory cell 2000 including the current steering circuit in the present embodiment hardly produces a memory cell to be rewritten, and thus even when the number of times of writing increases, the number of memory cells to be rewritten hardly increases. Therefore, the writing speed is not reduced by an increase in the number of times of rewriting.

FIGS. 11A, 11B, 11C, 11D, 11E, and 11F are each a graph illustrating dependence of drive conditions for high resistance change under the same conditions of cell current measurement in low resistance change and at the time of low resistance change in 100,000 resistance change operations using the 1T1R memory cell 2000 including the current steering circuit in the present embodiment. Similarly to FIG. 10, each of FIGS. 11A, 11B, 11C, 11D, 11E, and 11F illustrates plotted points for normalized expectation values for 10,000 times each of the cell current up to 100,000 times. In FIGS. 11A, 11B, 11C, 11D, 11E, and 11F, as the drive conditions for high resistance change, voltages of the memory cell gate MG (see FIG. 2) of the memory cell 3 are different. Each gate voltage is 1.16 [V](FIG. 11A) in condition A, 1.31 [V](FIG. 11B) in condition B. 1.45 [V](FIG. 11C) in condition C, 1.60 [V] (FIG. 11D) in condition D, 1.76 [V](FIG. 11E) in condition E, and 2.40 [V](FIG. 11F) in condition F, and the gate voltage increases in that order. The condition C is the same as the condition described with reference to FIG. 10. It is to be noted that measurement is performed with different samples (variable resistance nonvolatile memory elements).

Figure 11A:
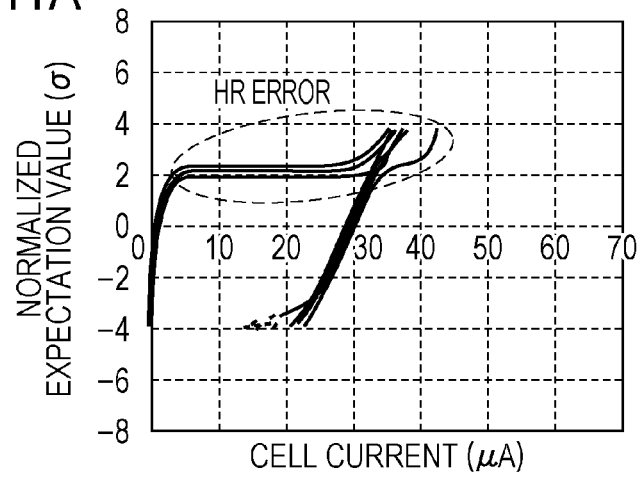
FIG. 11A is a graph illustrating distributions of cell current, in condition A, of the 1T1R memory cell including the current steering circuit in the embodiment.

As illustrated in FIG. 11A, for the distribution of low resistance states in condition A, there is no significant change in distribution profile through the 100,000 resistance change operations. However, in the distribution of high resistance states, state of failure in high resistance change indicated by "HR error" occurs at near 2 sigma ($\sigma$) of normalized expectation value, and the operation window has disappeared. Although the distribution near sigma=0 provides a sufficient operation window, in the distribution near 2 sigma indicated by "HR error" in high resistance change in FIG. 11A, a state occurs which remains to be fixed to a low resistance state or for which change to a high resistance is insufficient.

Although resistance change operations are performed on the same memory cells in the same drive condition, even in the same low resistance state, a state with much cell current (state with further change to a low resistance), and a state with less cell current (state with less further change to a low resistance) occur with approximately a normal distribution. When a low resistance state occurs with much cell current and further change to a low resistance, it is presumed that drive capability for high resistance change is insufficient compared with drive capability for low resistance change.

Figure 11B:
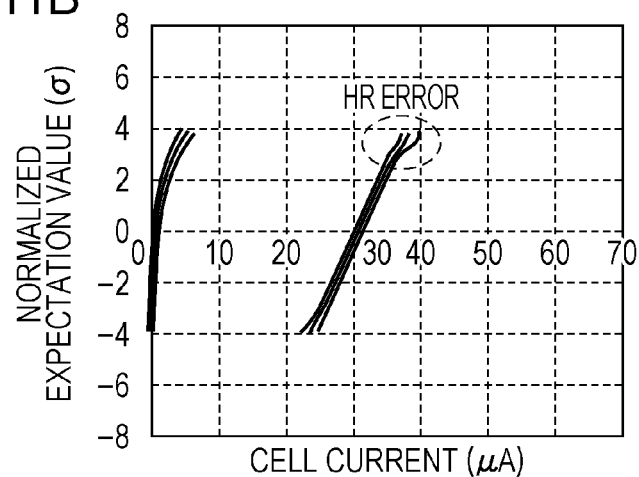
FIG. 11B is a graph illustrating distributions of cell current, in condition B, of the 1T1R memory cell including the current steering circuit in the embodiment.
Figure 11C:
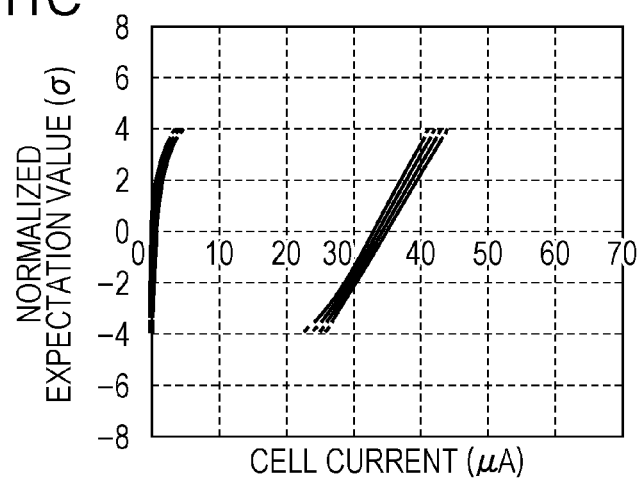
FIG. 11C is a graph illustrating distributions of cell current, in condition C, of the 1T1R memory cell including the current steering circuit in the embodiment.

In the condition B illustrated in FIG. 11B, there is obtained an operation window nearly the operation window in the condition C illustrated in FIG. 11C. Through the 100,000 resistance change operations, there is no significant change in distribution profile of low resistance states and high resistance states. However, a state, which remains to be fixed to a low resistance state, occurs about 11 times in the 100,000 resistance changes, and the state, which is indicated by "HR error" in FIG. 11B, stays near a maximum of the distribution of cell current in low resistance. That is, it is demonstrated that a case occurs with a very low probability in which rewriting to a high resistance state is not possible in a state with further change to a low resistance due to insufficient drive capability for high resistance change.

Figure 11D:
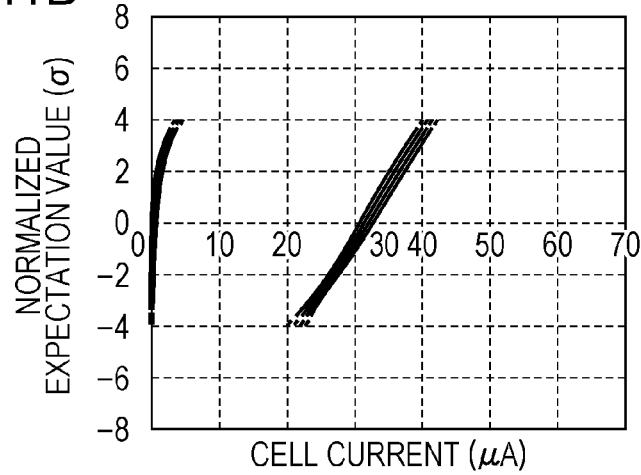
FIG. 11D is a graph illustrating distributions of cell current, in condition D, of the 1T1R memory cell including the current steering circuit in the embodiment.

In the condition D illustrated in FIG. 11D, there is obtained an operation window nearly the operation window in the condition C illustrated in FIG. 11C, and no HR error occurs. In addition, through the 100,000 resistance change operations, there is no significant change in distribution profile of low resistance states and high resistance states.

Figure 11E:
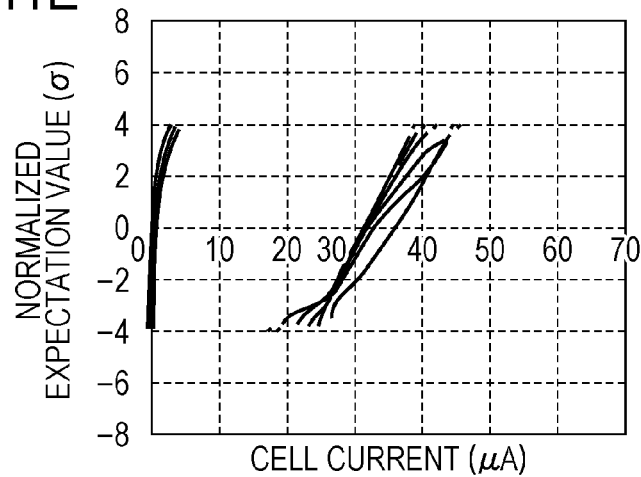
FIG. 11E is a graph illustrating distributions of cell current, in condition E, of the 1T1R memory cell including the current steering circuit in the embodiment.

In the condition E illustrated in FIG. 11E, the operation window tends to be reduced compared with the condition C illustrated in FIG. 11C. Although no HR error occurs and there is no significant change in distribution profile of high resistance states through the 100,000 resistance change operations, the distribution of low resistance states is slightly varied.

In the condition F illustrated in FIG. 11 IF, through the 100,000 resistance change operations, the distribution of low resistance states is further varied compared with the condition E illustrated in FIG. 11E.

Based on the results so far, in order to ensure a predetermined operation window even with an increase in the number of resistance changes and to achieve reduced variation in cell current distribution, the balance between the drive capabilities for low resistance change and high resistance change is important, and it is seen that an optimal drive region exists. Even when change to a low resistance is driven in the same condition, when the drive capability for high resistance change is too low, a state occurs with a certain probability in which change to a high resistance state is not possible as in the condition A illustrated in FIG. 11A and in the condition B illustrated in FIG. 11B. On the other hand, when the drive capability for high resistance change is too high as in condition F illustrated in FIG. 11F, the characteristics of low resistance states are effected. In view of this, the drive conditions of the condition C illustrated in FIG. 11C and the condition D illustrated in FIG. 11D provide favorable conditions.

Next, the operation based on these experimental results will be described using operating point analysis charts.

Figure 12:
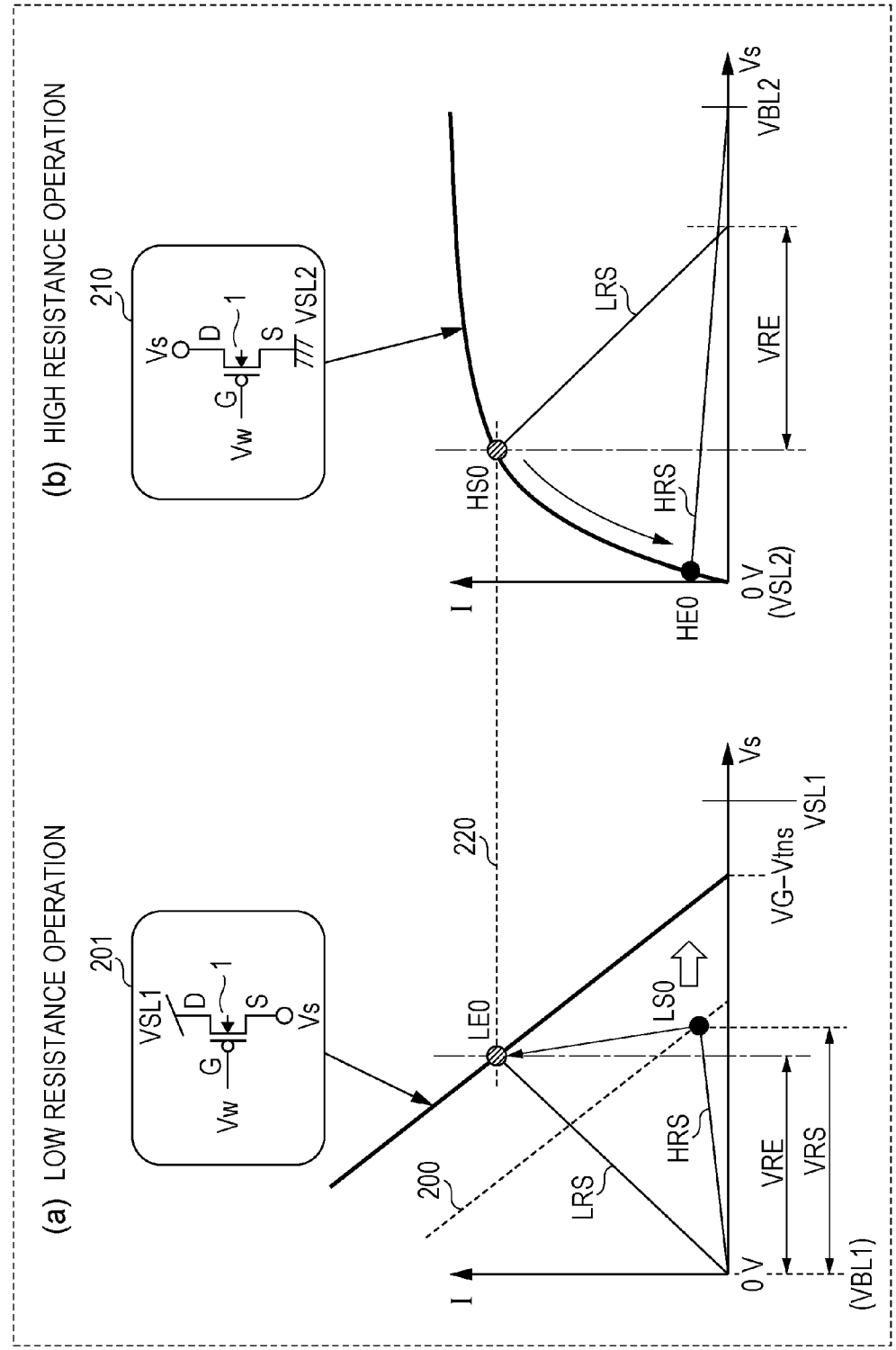
FIG. 12 illustrates an operating point analysis chart in low resistance operation of the conventional 1T1R memory cell and an operating point analysis chart in high resistance operation of the conventional 1T1R memory cell.

First, knowledge related to the operation of the conventional 1T1R memory cell known in, for example, Japanese Patent No. 5287544 (hereinafter referred to as Patent Document 4) will be described. FIG. 12 illustrates an operating point analysis chart in low resistance operation of the conventional 1T1R memory cell and an operating point analysis chart in high resistance operation of the conventional 1T1R memory cell.

FIG. 12A illustrates an operating point analysis chart in low resistance operation of the conventional 1T1R memory cell. FIG. 12B illustrates an operating point analysis chart in high resistance operation of the conventional 1T1R memory cell.

The horizontal axis indicates voltage Vs of source S (or drain D) of the memory cell transistor 1, the source S (or drain D) being a connection point between the memory cell transistor 1 included in the memory cell 3 and the variable resistance nonvolatile memory element 2. The vertical axis indicates the current that flows through the memory cell transistor 1. It is to be noted that the directions of current are reversed in a low resistance operation (FIG. 12A) and in a high resistance operation (FIG. 12B), and so the current is expressed in absolute value.

As illustrated in FIG. 12A, in a low resistance operation, voltage VSL1 is supplied to the source line, voltage VBL1 (0 [V]) is supplied to the bit line, and a positive voltage is applied in the direction from the source line to the bit line. When the voltage at both ends of the variable resistance nonvolatile memory element 2 reach low resistance change starting voltage VRS, low resistance change starts.

A memory cell transistor load characteristic 200 and a memory cell transistor load characteristic 201 are voltage-current characteristic diagram of the source follower operation of the memory cell transistor 1. The memory cell transistor load characteristic 200 indicates an intermediate state before the source line voltage reaches the final voltage VSL1. In a low resistance operation, the memory cell transistor 1 performs the source follower operation, and consequently, in the memory cell transistor load characteristic 201, the source voltage Vs along with its increase approaches asymptotically to gate voltage VG−Vtns, and current linearly decreases substantially. Here, Vtns is a threshold value voltage of the memory cell transistor 1, and in this case, the threshold value voltage is provided in consideration of the substrate bias effect along with increase in the source voltage.

The variable resistance nonvolatile memory element 2 starts a resistance change operation from high resistance state HRS when low resistance change starting point LS0 is achieved, at which the voltage across both ends is the low resistance change starting voltage VRS and which is the cross point of voltage-current characteristic (HRS in FIG. 12A) and the memory cell transistor load characteristic 200 in high resistance state HRS of the variable resistance nonvolatile memory element 2. Finally, the variable resistance nonvolatile memory element 2 ends the resistance change operation and changes to low resistance state LRS at low resistance change ending point LE0, at which the voltage across both ends is the low resistance change ending voltage VRE and which is the cross point of voltage-current characteristic (LRS in FIG. 12A) and the memory cell transistor load characteristic 201 in low resistance state LRS of the variable resistance nonvolatile memory element 2.

It is to be noted that the low resistance change ending voltage VRE is equal to or lower than the low resistance change starting voltage VRS.

As illustrated in FIG. 12B, a high resistance operation generally occurs at a point of symmetry with a low resistance operation. Voltage VBL2 is applied to the bit line, voltage VSL2 (0 [V]) is applied to the source line, and a positive voltage is applied in the direction from the bit line to the source line. The voltage across both ends of the variable resistance nonvolatile memory element 2 reaches approximately the same voltage as the low resistance change ending voltage VRE in absolute value, the variable resistance nonvolatile memory element 2 starts a high resistance operation. For this reason, in the present description, as the notation for high resistance change starting voltage, VRE is denoted which is the same as the notation for low resistance change ending voltage.

A memory cell transistor load characteristic 210 corresponds to drain output operation in the voltage-current characteristic diagram of the memory cell transistor 1.

The variable resistance nonvolatile memory element 2 starts a resistance change operation from the low resistance state LRS when high resistance change starting point HS0 is achieved, at which the absolute value of the voltage across both ends is the low resistance change ending voltage VRE and which is an operating point with the same current as low resistance change ending current 220, that is, the cross point of voltage-current characteristic (LRS in FIG. 12B) and the memory cell transistor load characteristic 210 in low resistance state LRS of the variable resistance nonvolatile memory element 2. Finally, the variable resistance nonvolatile memory element 2 ends the resistance change and changes to high resistance state HRS at high resistance change ending point HE0, which is the cross point of voltage-current characteristic (HRS in FIG. 12B) and the memory cell transistor load characteristic 210 in high resistance state HRS of the variable resistance nonvolatile memory element 2.

It is to be noted that strictly speaking, the voltage-current characteristic of the variable resistance nonvolatile memory element 2 in high resistance state is nonlinear, however, for the sake of simplicity, the voltage-current characteristic is illustrated as linear characteristic.

In this manner, low resistance operation and high resistance operation occur at approximately symmetrical points, and thus by configuring the memory cell 3 to have the low resistance operation in the direction of a source follower operation, in which the substrate bias effect is large, high resistance operation may also be performed easily with the same gate voltage.

After change to high resistance, voltage VBL2, which is a relatively high voltage, is applied as a high resistance voltage to both ends of the variable resistance nonvolatile memory element 2 in high resistance state HRS. In Patent Documents 1 and 3 described above, effectiveness of steering voltage has been proposed to avoid breakage of the variable resistance nonvolatile memory element in high resistance operation. However, such a phenomenon has not been observed in the variable resistance nonvolatile memory element 2 in the present embodiment. The variable resistance nonvolatile memory element used in the above-described Patent Documents 1 and 3 includes an extremely thin insulating layer. On the other hand, the variable resistance nonvolatile memory element used in the present embodiment is an element that exhibits a resistance change operation caused by an oxidation reduction reaction which occurs in a filament formed in a local region. Those variable resistance nonvolatile memory elements are presumed to exhibit a resistance change operation caused by different mechanisms.

As is apparent from the operational description in the above, in the conventional 1T1R memory cell 1000, the resistance change operation is stable up to approximately 10,000 times as described with reference to FIG. 9. However, when the resistance change operation is repeated up to 100,000 times, the cell current value in a low resistance state decreases successively and significantly extends to lower current. Also, a phenomenon of fixation of a high resistance state, which happens accidentally, exhibits instability of the resistance change operation and is difficult to be explained by conventionally accepted knowledge. The phenomenon is illustrated in FIG. 27 which is disclosed in the above-mentioned Non-Patent Document 1.

Thus, the factors adversely affecting the stability of resistance change operation will be described below based on the knowledge discovered by the inventors.

Figure 13A:
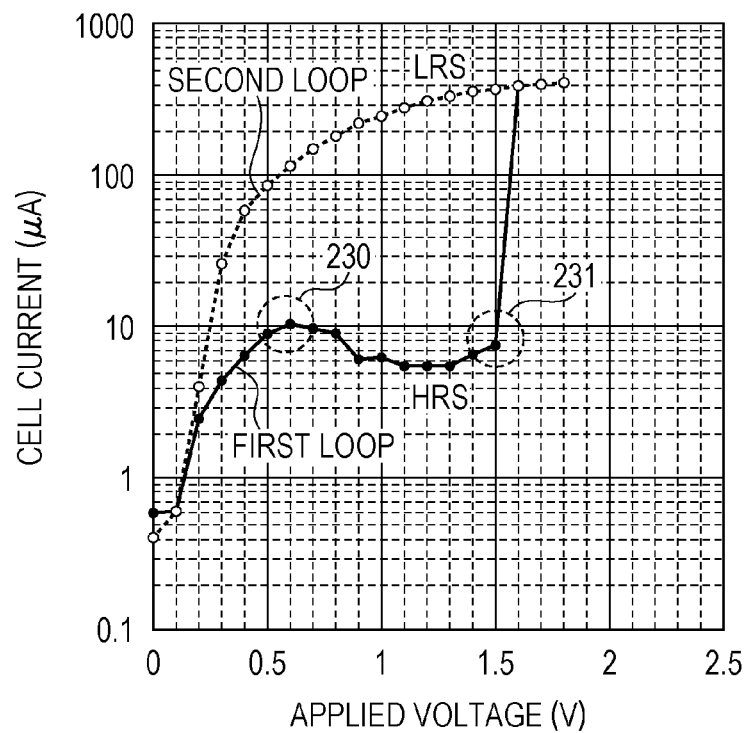
FIG. 13A is a voltage-current characteristic graph representing typical behavior in low resistance operation of the conventional 1T1R memory cell.
Figure 13B:
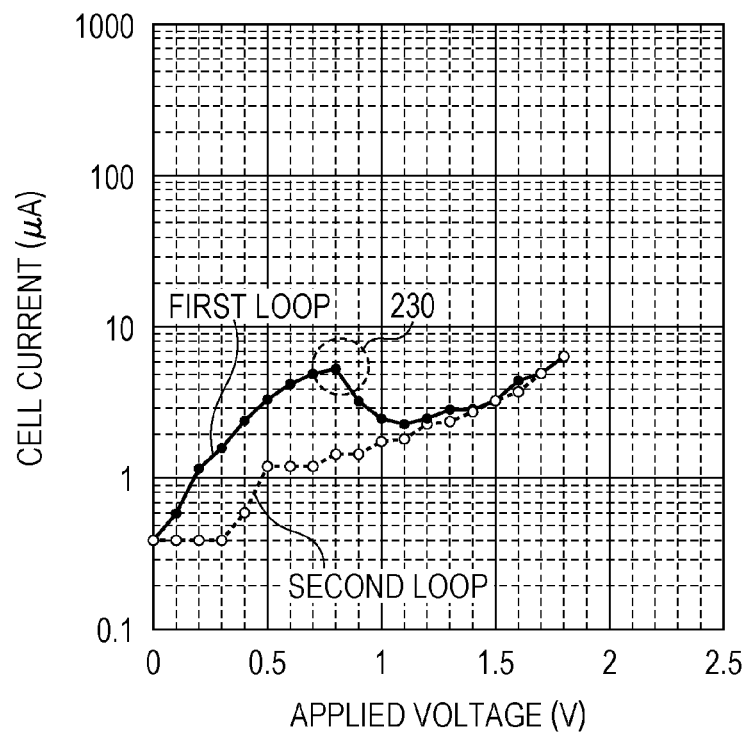
FIG. 13B is a voltage-current characteristic graph representing behavior that causes no low resistance in low resistance operation of the conventional 1T1R memory cell.

FIGS. 13A and 13B are each a graph illustrating a voltage-current characteristic (V-I characteristic) of low resistance operation, measured by using the conventional 1T1R memory cell 1000. Here, in order to clarify the behavior in a low current region, the vertical axis indicates logarithm. In a state where the variable resistance nonvolatile memory element 2 set to a high resistance state, the ground voltage (reference potential) is applied to the bit line BL, and 3 [V] is applied to the memory cell gate MG, current measurement (VSIM) was repeated twice while a voltage is applied to the source line SL up to 1.8 [V] with an increment of 0.1 [V]. The line connecting black dots indicates the first loop and the line connecting white dots indicates the second loop. In the measurement, in order to avoid the effect of the threshold value voltage of the memory cell transistor 1, the gate voltage is set be higher than normal voltage.

FIG. 13A illustrates a typical behavior (voltage-current characteristic) observed when many samples (variable resistance nonvolatile memory elements 2) are measured.

The first loop indicates that the current is 10 [μA] or low which is small in amount and the present state is a high resistance state. At low resistance change starting point 231, the current increases discontinuously, which indicates that change is taking place from high resistance state HRS to low resistance state LRS. The second loop indicates that the current is several 100 [μA] which is large in amount and the present state is a low resistance stat LRS. At approximately 0.6 [V], the first loop has an extreme point 230 where the current value once decreases, and it can be seen that a second high resistance state is achieved in which the resistance value is increased than in a first high resistance state previously achieved.

FIG. 13B illustrates a behavior (voltage-current characteristic) of samples, which is observed as behavior causing no change to a low resistance through measurement of many samples (resistance variable type nonvolatile memory elements 2).

Similarly to FIG. 13A, the first loop indicates that the current is 10 [μA] or low which is small in amount and the present state is a high resistance state. Also, at approximately 0.8 [V], the first loop has an extreme point 230 where the current value once decreases, and it can be seen that a second high resistance state is achieved in which the resistance value is increased than in a first high resistance state previously achieved.

However, change to a low resistance state has not occurred by application of voltage up to 1.8 [V]. In the second loop, the current is smaller in amount than in the first loop. That is, the present state has changed to the second high resistance state in which the resistance value is higher.

This phenomenon may be understood as follows. In the samples (resistance variable type nonvolatile memory elements), a low resistance change voltage is happened to be 1.8 [V] or higher, and thus a low resistance operation is not feasible. In this case, the previous first high resistance state is not continued because of unachievable low resistance change simply due to shortage of voltage, but change to the second high resistance state, in which the resistance value is higher, is made with a voltage higher than at the extreme point 230.

Once in this state, change to a low resistance is difficult to be made by a normal drive method, and thus stable resistance change operation is inhibited.

The phenomenon described above corresponds to a state 520 illustrated in FIG. 27 disclosed in the above-mentioned Non-Patent Document 1, the state 520 in which the present state accidentally remains to be a high resistance state regardless of performing a low resistance operation while a high resistance operation and a low resistance operation are repeated. It is demonstrated that the memory cell current (referred to as Cell Current @ 0.4V) indicated in Non-Patent Document 1 is smaller than the memory cell current in the previous high resistance state. This may be explained as a phenomenon described with reference to FIG. 13B, in which the low resistance change voltage is insufficient and change to the second high resistance state is made.

In the case of being in such a state, Non-Patent Document 1 proposes a method by which a normal state of rewriting operation is recovered by performing verification rewriting including a rewriting algorithm in which application voltage is devised. However, it is more desirable to avoid such a state or reduce the frequency of such a state as much as possible. For this purpose, it is preferable to identify a maximum voltage that may cause the low resistance change starting point 231 during repetition of resistance change operation and to apply a voltage higher than the maximum voltage.

Figure 14:
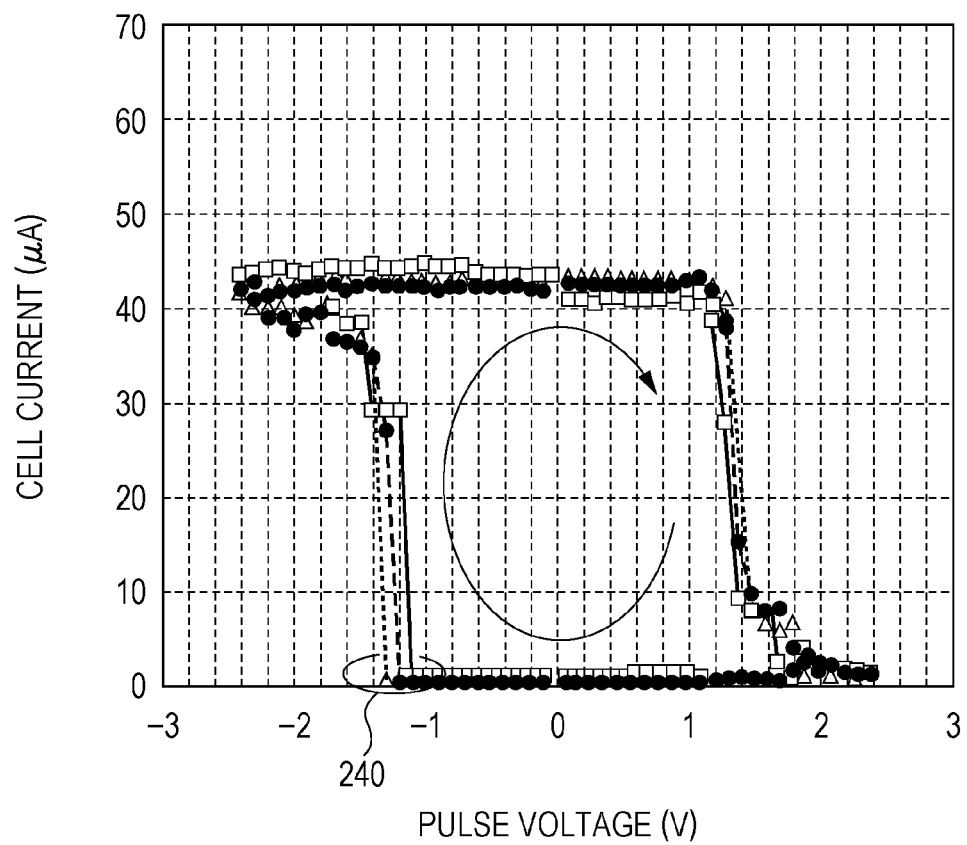
FIG. 14 is a graph illustrating a hysteresis loop of the conventional 1T1R memory cell.

FIG. 14 is a graph illustrating a hysteresis loop of the memory cell 3, which is measured using the conventional 1T1R memory cell 1000. This is for measuring a variation in the low resistance change starting voltage (VRS).

A region denoted by negative voltage on the horizontal axis is a low resistance operation region, the bit line BL is set to 0 [V], a pulse voltage is applied for 50 ns to the source line SL with an increment of 0.1 [V], and cell current measurement is repeated to obtain a result. It is to be noted that the polarity of voltage is indicated relative to the source line SL as a reference.

A region denoted by positive voltage on the horizontal axis is a high resistance operation region, the source line SL is set to 0 [V], a pulse voltage is applied for 50 ns to the bit line BL with an increment of 0.1 [V], and cell current measurement is repeated to obtain a result.

It is to be noted that the conditions for the gate voltage and cell current measurement are the same as the conditions which have been described with reference to FIGS. 5A and 5B.

Here, the measurement is repeated on the same memory cell for 5 loops (for 3 loops in FIG. 14) continuously in a clockwise direction. A low resistance change starting voltage 240 is a low resistance change starting voltage at which change is made from a high resistance state to a low resistance state. It is seen that even with the same memory cell, a low resistance change starting voltage slightly varies with loop and is approximately centered on 1.2 [V].

Many samples (variable resistance nonvolatile memory elements) are similarly measured by this method, and the distribution of low resistance change starting voltage of the same memory cell was statistically analyzed.

Figure 15:
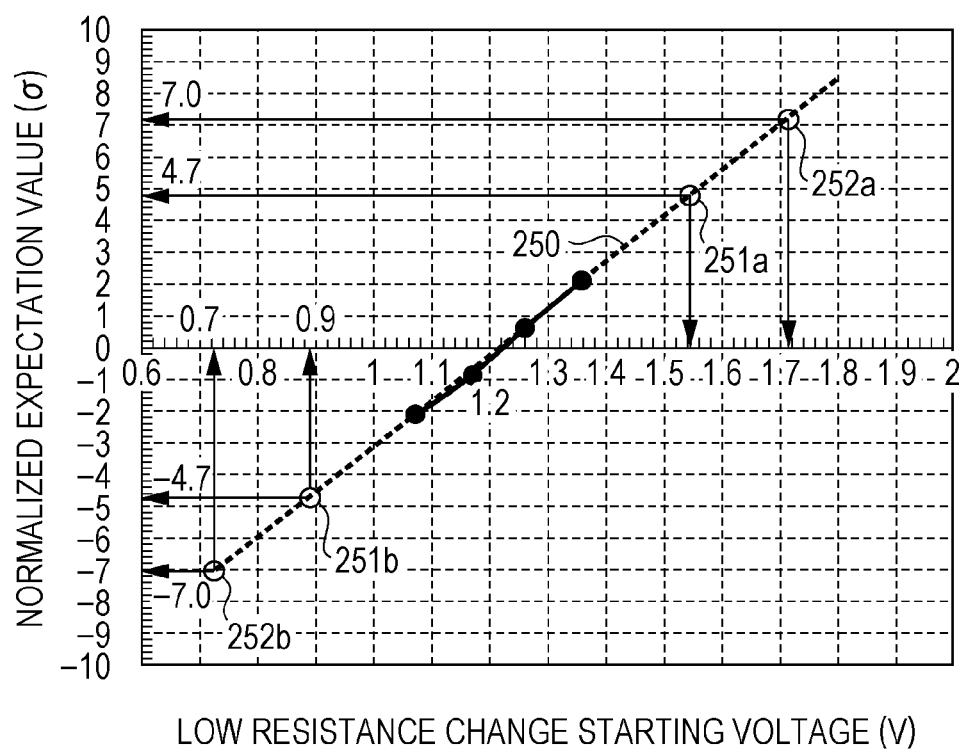
FIG. 15 is a graph illustrating plotted points for normalized expectation values that indicate a distribution of low resistance change starting voltage.

FIG. 15 is a graph illustrating plotted points for normalized expectation values of measured distribution data of the low resistance change starting voltage 240. The V-I characteristic evaluation illustrated in FIGS. 13A and 13B is a result of observation of resistance change phenomenon with a pulse width longer than the pulse width used in normal resistance change operation. On the other hand, FIG. 15 is a graph illustrating a result of observation of resistance change phenomenon with the pulse width used in normal resistance change operation, and thus provides a result under the conditions substantially used for actual operation.

As seen from FIG. 15, the low resistance change starting voltage is centered on 1.2 [V], approximately 1.06 [V] at −2 sigma (σ) of normalized expectation value, and approximately 1.36 [V] at +2 sigma of normalized expectation value, that is, linear, and thus approximately a normal probability distribution is presented.

The distribution data includes both elements: variation when resistance change operation is repeated on the same memory cell, and variation in different memory cells.

In Japanese Patent No. 5138836 (hereinafter referred to as Patent Document 5), the inventors have disclosed that as the characteristics of variable resistance nonvolatile memory element, in related to the variation in cell current observed in low resistance operation and high resistance operation, manufacturing variation in memory cell arrays and variation in memory cells within each memory cell array are approximately the same (see FIGS. 5A and 5B of Patent Document 5). That is, the cell current distribution when resistance change operation is repeated N times with the same memory cell, and the cell current distribution of N memory cells when resistance change operation is performed only once in each of N different memory cells are approximately the same.

In view of this knowledge, based on this distribution data, an application voltage needed for low resistance change may be estimated by an extrapolated line 250 illustrated in FIG. 15.

For example, assume that the capacity of memory cell array is 1 M bits. A maximum value of probability ($\approx 1/1,000,000$) of occurring only one state by one resistance change operation is normalized expectation value of 4.7 sigma (σ) indicated by an extrapolated line 251$a$, and the voltage then is approximately 1.55 [V]. Also, a minimum value of probability of occurring only one state by one resistance change operation is normalized expectation value of −4.7 sigma indicated by an extrapolated line 251$b$, and the voltage then is approximately 0.89 [V].

On the other hand, when it is assumed that the same probability of occurrence is applied to repeated resistance change operation 1 million times with a specific memory cell only, the probability (=1/1,000,000) of occurring only one state is the same as above and is indicated by the extrapolated line 251$a$ and extrapolated line 251$b$.

That is, a state may occur in which a maximum low resistance change starting voltage VRSmax (second voltage VRS2) is approximately 1.55 [V]. Thus, the memory cell transistor load characteristic 201 described with reference to FIG. 12 is defined so that a voltage value at least 1.55 [V] or higher is applied to both ends of the variable resistance nonvolatile memory element 2.

The same approach is applied for the case where the number of times of rewriting is regulated due to a predetermined memory cell array capacity. For example, a specification is considered, in which the memory cell array capacity is presumed to be 1M bit and a maximum of 1 million times of rewriting is needed for each memory cell. In this case, a maximum value of probability ($\approx 1/10^{12}$) of occurring only one state is normalized expectation value of 7.0 sigma (σ) indicated by an extrapolated line 252$a$, and the voltage then is approximately 1.72 [V]. Also, a minimum value of probability of occurring only one state is normalized expectation value of −7.0 sigma indicated by an extrapolated line 252$b$, and the voltage then is approximately 0.72 [V].

Thus, for the case of such a memory specification, as the maximum low resistance change starting voltage VRSmax (the second voltage VRS2), a voltage value of at least 1.72 [V]

or higher may be used. The memory cell transistor load characteristic 201 described with reference to FIG. 12 is defined so that for example, 1.8 [V] as a standard is applied to both ends of the variable resistance nonvolatile memory element 2.

The distribution data illustrated in FIG. 15 is sampled as actual measurement data in a wide range and not as extrapolated data, and thus the estimation accuracy of desired voltage increases but has a certain limit. By applying such an extrapolation method, approximate maximum voltage and minimum voltage of low resistance drive voltage may be estimated beforehand according to the specification including the capacity of the memory cell array to be mounted in the variable resistance nonvolatile memory device, and the number of times of rewriting. Therefore, without setting unnecessarily high voltage, it is possible to avoid occurrence of a state which is unable to change to a low resistance probabilistically.

In summary of the knowledge above, when writing to a high resistance state and writing to a low resistance state are alternately repeated, the variable resistance nonvolatile memory element exhibits the characteristic that low resistance change starting voltage has approximately a normal distribution, the low resistance change starting voltage being an application voltage that causes a change from a high resistance state to a low resistance state. Assume that A is the number of memory cells mounted in a memory cell array and B is the maximum number of times of rewriting the memory cell array to a high resistance state or a low resistance state, then the voltage higher than or equal to a certain voltage that is derived with the occurrence probability of 1/(A×B) is preferably controlled to be a maximum voltage of low resistance change starting voltage which has approximately a normal distribution.

Figure 16:
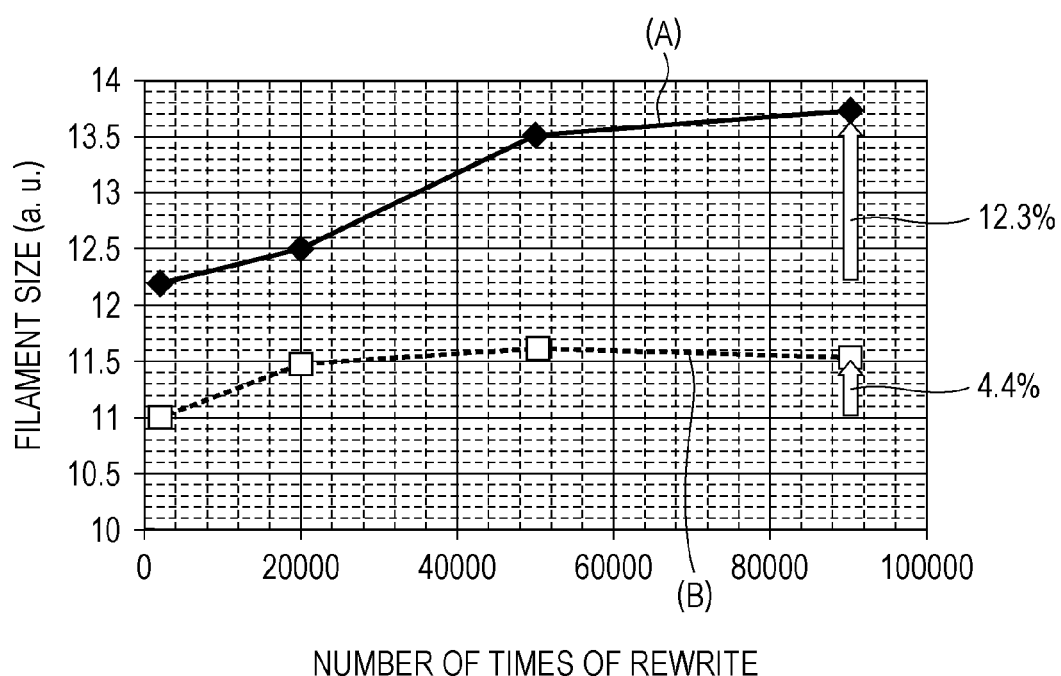
FIG. 16 is a graph illustrating change in filament size of a conventional variable resistance nonvolatile memory element and the variable resistance nonvolatile memory element in the present embodiment.

FIG. 16 is a graph illustrating change in filament size which is calculated based on 100,000 times resistance change operations performed by the conventional 1T1R memory cell 1000 illustrated in FIG. 9 and the 1T1R memory cell 2000 including the current steering circuit in the present embodiment illustrated in FIG. 10. The filament size is derived as a relative magnitude based on the cell current illustrated in FIGS. 9 and 10 using the technique disclosed in 2013 Symposium on VLSI Technology Digest of Technical Papers T62 (hereinafter referred to as Non-Patent Document 2). It is to be noted that the filament size illustrated in FIG. 16 corresponds to the diameter of the filament 36 illustrated in the cross-sectional view of FIG. 3C after forming is performed.

In FIG. 16, the horizontal axis indicates the number of times of rewriting and the vertical axis indicates filament size. In FIG. 16, curve (A) indicates change in filament size in the conventional 1T1R memory cell 1000, and curve (B) indicates change in filament size in the 1T1R memory cell 2000 including the current steering circuit in the present embodiment.

In the derivation, the filament sizes for the 2000th time, the 20,000th time, the 50,000th time, and the 90,000th time are derived using the cell current data for 100 times from the 2000th time, the cell current data for 100 times from the 20,000th time, the cell current data for 100 times from the 50,000th time, and the cell current data for 100 times from the 90,000th time based on the cell current data for the conventional 1T1R memory cell 1000 illustrated in FIG. 9 and the cell current data for the 1T1R memory cell 2000 including the current steering circuit in the present embodiment illustrated in FIG. 10.

As the number of times of rewriting increases, an obvious difference is seen between curve (A) and curve (B). In the curve (A) indicating the characteristic of the conventional 1T1R memory cell 1000, the filament size gradually increases as the number of times of rewriting increases. The filament size at the 90,000th is greater than the filament size at the 2000th by 12.3%. On the other hand, in the curve (B) indicating the characteristic of the cell current data for the 1T1R memory cell 2000 including the current steering circuit in the present embodiment, the filament size at the 90,000th is greater than the filament size at the 2000th by 4.4%. In particular, subsequent to the 20,000th time, almost no change occurs. This indicates that writing state hardly changes even when the number of times of rewriting is increased, thus the illustrated control method is stable.

Figure 17:
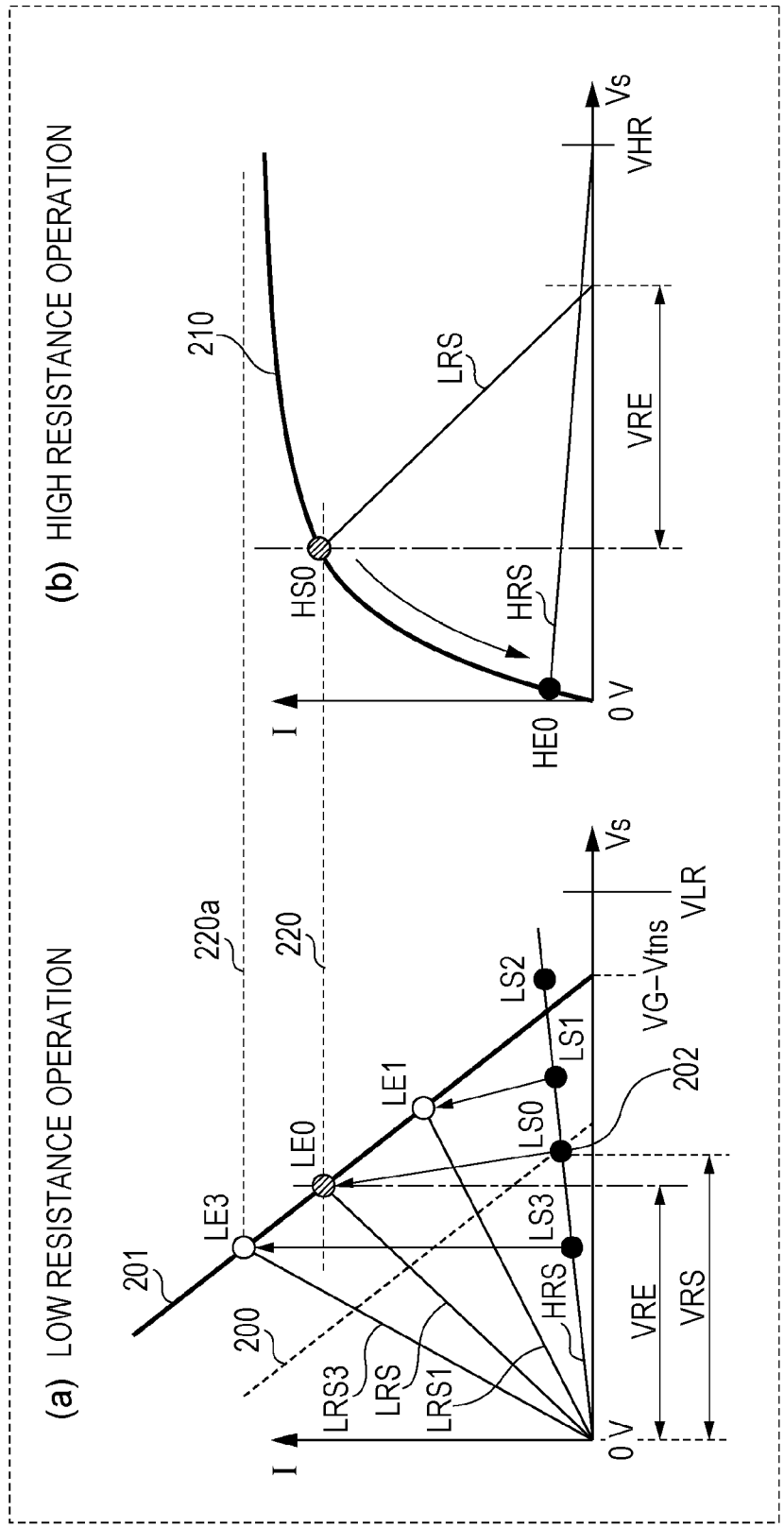
FIG. 17 illustrates an operating point analysis chart in law resistance operation of the conventional 1T1R memory cell and an operating point analysis chart in high resistance operation of the conventional 1T1R memory cell.

FIG. 17 is a chart reflecting new knowledge described with reference to FIGS. 13A to 16 to the operating point analysis chart of the conventional 1T1R memory cell 1000 described with reference to FIG. 12, and illustrates a problem found. FIG. 17 illustrates an operating point analysis chart in low resistance operation of the conventional 1T1R memory cell and an operating point analysis chart in high resistance operation of the conventional 1T1R memory cell.

FIG. 17A illustrates an operating point analysis chart in low resistance operation, and FIG. 17B illustrates an operating point analysis chart in high resistance operation.

The same component as in FIG. 12 is denoted by the same symbol and description of repeated component will be omitted.

The low resistance change starting voltage VRS varies each time a resistance change operation is performed even on the same memory cell, and possible maximum voltage (second voltage) and minimum voltage (first voltage) are determined probabilistically according to the capacity of a memory cell array included and the number of times of rewriting.

Similarly, the low resistance change ending voltage VRE is also not constant and is in conjunction with the low resistance change starting voltage. Thus, it is presumed that when the low resistance change starting voltage is high, the low resistance change ending voltage is also high, and when the low resistance change starting voltage is low, the low resistance change ending voltage is also lower.

When it is assumed that the low resistance change starting voltage VRS and the low resistance change ending voltage VRE described with reference to FIG. 12 are based on average voltage, an operating point having a probabilistically possible maximum voltage in memory cell array A having specified predetermined memory cell array capacity and number of times of rewriting is expressed by low resistance change starting point LS1.

Finally, the variable resistance nonvolatile memory element 2 completes low resistance change at low resistance change ending point LE1 and is in low resistance state LRS1. The memory cell transistor load characteristic 201 represents a source follower operation and has a linear characteristic, and thus even when the low resistance change ending voltage is slightly higher than average voltage VRE, current decrease at low resistance change ending point is large and consequently, the resistance value is set be high (state with low cell current). For this reason, a variation in the set cell current increases, and if the cell current is low, a problem arises that a read margin decreases.

Furthermore, when memory cell array B is assumed to have large memory cell array capacity and number of times of rewriting, probabilistically possible maximum voltage is further increased. In the case where a low resistance change starting voltage, which relatively exceeds the maximum application voltage (VG−Vtns) in the memory cell transistor load characteristic 201, is equal to low resistance change starting point LS2, change to a low resistance is not possible but change to the second high resistance state is made, and thus a problem arises that low resistance operation is not possible.

On the other hand, the case where a low resistance change starting voltage is low is denoted by low resistance change starting point LS3 in FIG. 17A. Finally, low resistance change is completed at low resistance change ending point LE3 and low resistance state LRS3 is achieved. The current at the low resistance change ending point is large which is low resistance change ending current 220a, and the resistance value is set be lower (state with high cell current). Because a low resistance operation occur at a point symmetrical to a high resistance operation, with the memory cell transistor load characteristic 210, a problem arises that drive current is insufficient and a state probabilistically occurs where high resistance operation is unable to occur.

In addition, the following problem also arises. Repetition of resistance change operation causes occurrence of an operating point of low resistance change end to accumulatively increases on the low resistance change ending point LE1 side where less current flows as well as the low resistance change ending point LE3 side where more current flows with respect to average low resistance change ending point LE0. When much more current flows via a filament, the filament size is presumed to increase. In the conventional 1T1R memory cell 1000 illustrated in the curve (A) of FIG. 16, the filament size increases as the number of times of rewriting increases. This is probably because occurrence of an operating point accumulatively increases on the low resistance change ending point LE3 side where more current flows. The above-mentioned Non-Patent Document 2 claims that a variation in cell current depends the deficit density of oxygen ions filled in a filament, and it is important to ensure proper filament size. When the filament size increases, the deficit density of oxygen ions decreases, and thus a problem of variation in cell current is caused. In order to provide a more reliable variable resistance nonvolatile memory device, it is effective to control the resistance change to avoid change in the filament size as much as possible.

Figure 18:
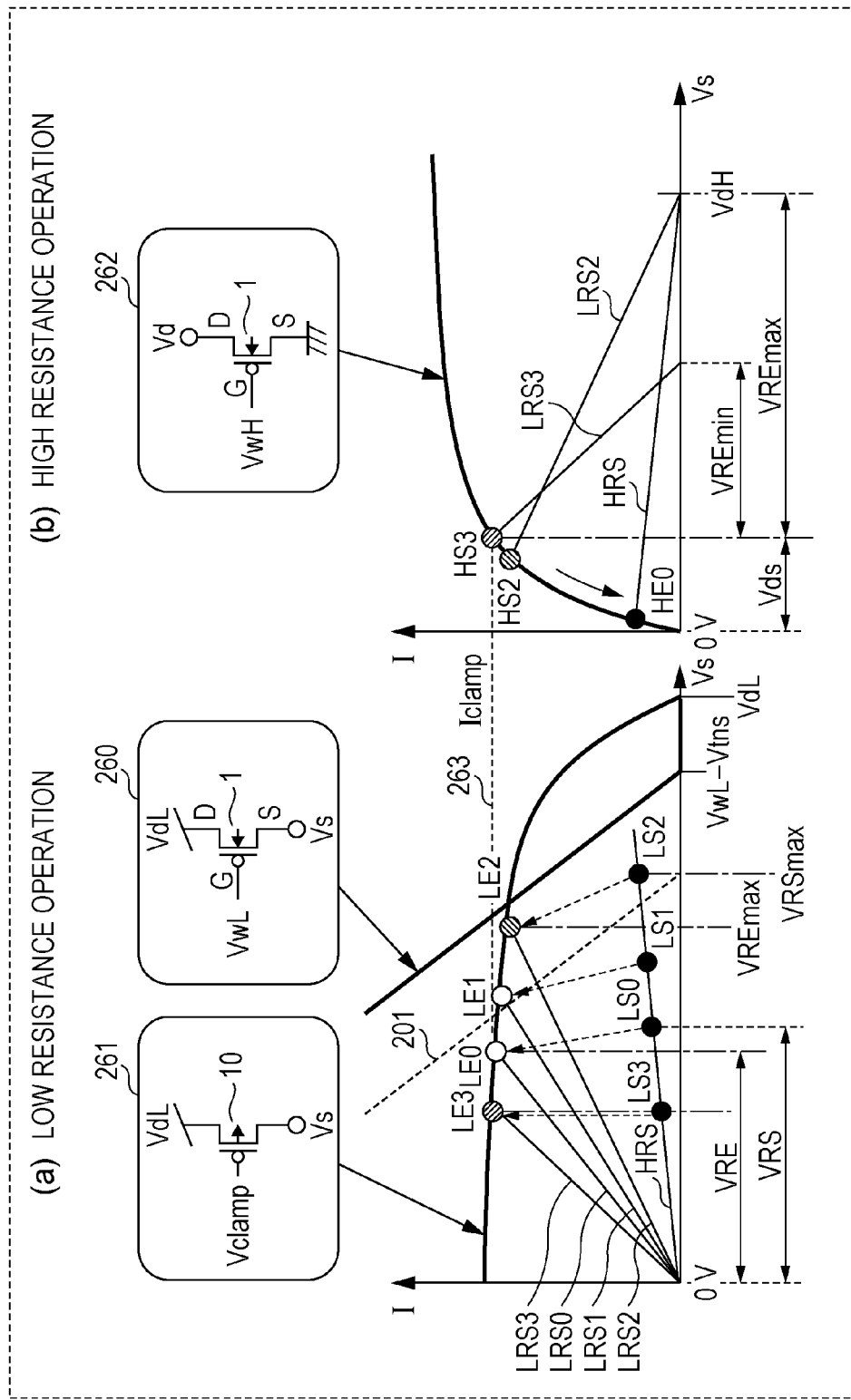
FIG. 18 illustrates an operating point analysis chart in low resistance operation of the 1T1R memory cell including the current steering circuit in the embodiment and an operating point analysis chart in high resistance operation of the 1T1R memory cell including the current steering circuit in the embodiment.

FIG. 18 illustrates an operating point analysis chart in low resistance operation of the 1T1R memory cell 2000 including the current steering circuit in the embodiment and an operating point analysis chart in high resistance operation of the 1T1R memory cell including the current steering circuit in the present embodiment. FIG. 18A illustrates an operating point analysis chart in low resistance operation, and FIG. 18B illustrates an operating point analysis chart in high resistance operation.

First, the low resistance operation illustrated in FIG. 18A will be described.

The variable resistance nonvolatile memory element starts to change from a high resistance state to a low resistance state when a voltage (voltage with a positive polarity) higher than or equal to the low resistance change starting voltage relative to the second electrode 34 is applied to the first electrode 31 in FIG. 3C. The variable resistance nonvolatile memory element has the following characteristic: then the low resistance change starting voltage VRS varies in a range from a first voltage to a second voltage higher than the first voltage, and the low resistance change ending voltage VRE varies in a range from a third voltage to a fourth voltage higher than the third voltage, the low resistance change ending voltage being a voltage when change of the variable resistance nonvolatile memory element to a low resistance state has ended.

A memory cell transistor load characteristic 260 illustrates voltage-current characteristic (drain current characteristic) of the memory cell transistor 1 in the source follower operation where the drain is at voltage VdL and the source voltage Vs is varied. The source voltage Vs along with its increase approaches gate voltage VwL−Vtns, and the current decreases substantially linearly. Here, Vtns is a threshold value voltage of the memory cell transistor 1, and in this case, the threshold value voltage is provided in consideration of the substrate bias effect along with increase in the source voltage. In FIG. 18, the memory cell transistor load characteristic 201 in conventional technique is also illustrated, and in contrast to the memory cell transistor load characteristic 201, in the present embodiment, the gate voltage is set be high and the linear characteristic is shifted to the right.

A PMOS load characteristic 261 is a voltage-current characteristic (drain current characteristic) of the drain output operation of the PMOS transistor included in the current steering element 10 for LR change, where the drain is at voltage VdL and the source voltage Vs is varied. The current amount is controlled by the gate voltage Vclamp.

The operation of the 1T1R memory cell 2000 including the current steering circuit in the present embodiment is approximately regarded as an operation having the combined characteristics of the current steering element 10 for LR change and the memory cell transistor 1 and being closer to the characteristics with a higher impedance except for the vicinity of its cross-point.

Similarly to the voltages mentioned in the description of conventional technique for low resistance change operation with reference to FIG. 17 for, the low resistance change operation will be described under the assumption that LS0 is the low resistance change starting point corresponding to an average low resistance change starting voltage VRS, LS3 is a low resistance change starting point on lower voltage side, LS1 is a low resistance change starting point on higher voltage side, and LS2 is a low resistance change starting point on further higher voltage side.

For the memory cell transistor load characteristic 260, conditions are set so that a voltage exceeding the low resistance change starting point LS2 may be applied at an assumed maximum voltage. Specifically, for a low resistance change operation, a voltage of VRSmax+Vtns or higher is applied to the gate voltage VwL (the first gate voltage) of the memory cell transistor 1, where VRSmax (the second voltage VRS2) is the low resistance change starting voltage at the low resistance change starting point LS2. That is, it is preferable that the voltage VwL (the second gate voltage) satisfy VwL>VRSmax+Vtns, that is, VwL>VRS2+Vtns.

According to the distribution data of low resistance change starting voltage described with reference to FIG. 15, the maximum value VRSmax (the second voltage VRS2) of low resistance change starting voltage is presumed to be approximately 1.8 [V] theoretically. Therefore, it is sufficient that the gate voltage VwL (the first gate voltage) be set with a lower limit of the gate voltage VwL=1.8 [V]+Vtns. That is, it is preferable that the gate voltage VwL (the first gate voltage) satisfying VwL>1.8 [V]+Vtns be applied to the gate of the memory cell transistor 1.

In the present embodiment illustrated in FIG. 10 and others, the gate voltage VwL (first gate voltage) is set to 2.8 [V], and Vtns is approximately 0.6 [V]. Therefore, the gate voltage VwL is preferably set so that gate voltage VwL≥2.2 [V]+Vtns is satisfied.

With this setting, even at the low resistance change starting point LS2, the resistance state does not stay at the second high resistance state. Consequently, resistance change may start from any low resistance change starting point.

At the low resistance change ending point, the current is steered by the PMOS load characteristic 261.

It is observed the low resistance change ending voltage VRE is equal to or lower than the low resistance change starting voltage VRS. That is, the variable resistance nonvolatile memory element has the characteristic that VRE≤VRS, where VRE is the low resistance change ending voltage and VRS is the low resistance change starting voltage. Let LE0 be the average low resistance change ending point for the average low resistance change starting point LS0, then the current is regulated to the current value Iclamp in nearly constant by the saturation region characteristic (the characteristic of a saturation region in drain current characteristic) of the current steering element 10 for LR change at each of the low resistance change ending point LE3 on lower voltage side, the low resistance change ending point LE1 on high voltage side, and the low resistance change ending point LE2 on further higher voltage side.

That is, at least lower than or equal to VREmax (the fourth voltage VRE2) which is assumed maximum low resistance change ending voltage, in order to allow the operation (drain drive operation) of the PMOS load characteristic 261 in the saturation region (saturation region in the drain current characteristic), the voltage VdL (voltage of the first voltage source) of the power source terminal 11 for LR change as the source voltage source is set.

Alternatively, for the purpose of having a larger margin, in order to allow the operation of the PMOS load characteristic 261 at a voltage lower than or equal to VRSmax (for example, 1.8 [V]) which is the maximum voltage (the second voltage VRS2) of the low resistance change starting voltage, the voltage VdL (voltage of the first voltage source) of the power source terminal 11 for LR change as the source voltage source may be set.

Furthermore, the current is regulated using the PMOS load characteristic 261 but not the memory cell transistor load characteristic 260. That is, the application voltage Vclamp to the clamp control terminal 12 for LR change is set to have the relationship that the current of PMOS load characteristic 261 is less the current of the memory cell transistor load characteristic 260 so that the current of the current steering element 10 for LR change is set. That is, when a resistance variable nonvolatile memory element is written to a low resistance state, the voltage VdL (voltage of the first voltage source) of the power source terminal 11 for LR change is set so that the current steering element 10 for LR change drives nearly constant current in the saturation region in the drain current characteristic at the application voltage to the resistance variable nonvolatile memory element at least VREmax (the fourth voltage VRE2) or lower. The first gate voltage VwL and the application voltage Vclamp to the clamp control terminal (PMOS clamp control terminal) 12 are set so that Iclamp<Ids is satisfied, where Ids is the drive current in the source follower operation of the memory cell transistor.

With this setting, even when the low resistance change ending voltage varies to higher voltage side due to repeat of a resistance change operation, the resistance state does not stay at the second high resistance state. Also, even when the low resistance change ending voltage varies to lower voltage side, no excessive current flows through the variable resistance nonvolatile memory element, and the low resistance change operation is performed with a nearly constant current all the time. Thus, as illustrated by the curve (B) of FIG. 16, that is, the change in the filament size of the 1T1R memory cell 2000 including the current steering circuit in the present embodiment, increase in the filament size is reduced compared with the conventional technique.

Although it is desirable that the current value Iclamp is nearly constant as much as possible, practically, in the PMOS load characteristic 261, as the source-drain voltage increases, the current gradually increases and is not constant. In the present embodiment illustrated in FIG. 10 and others, the change rate of the drain current with respect to the drain voltage was approximately 2 [µA]/0.1 [V]. Therefore, the effect of the present embodiment is achieved when the change rate is at least 2 [µA]/0.1 [V], and a lower value than 2 [µA]/0.1 [V] is more desirable.

Next, the high resistance change operation illustrated in FIG. 18B will be described.

The variable resistance nonvolatile memory element starts to change from a low resistance state to a high resistance state when a certain voltage (voltage with a positive polarity) higher than or equal to the high resistance change starting voltage relative to the first electrode 31 is applied to the second electrode 34 in FIG. 3C. The certain voltage has substantially the same absolute value as the low resistance change ending voltage VRE has. The low resistance change ending voltage VRE has the characteristic of varying in a range from the third voltage (VRE1) to the fourth voltage (VRE2) higher than the third voltage. Thus, the high resistance change starting voltage (VRE) has also the characteristic of varying in a range from a fifth voltage (VRE1) to a sixth voltage (VRE2) higher than the fifth voltage. The variable resistance nonvolatile memory element has the characteristic that VRE≤VRS, where VRE is the high resistance change starting voltage and VRS is the low resistance change starting voltage.

The flows of current of a high resistance change operation and a low resistance change operation are opposite to each other. The memory cell transistor load characteristic 262 is indicated by a voltage-current characteristic chart of drain output operation with the source of the memory cell transistor 1 at 0 [V] and the drain voltage Vd varied.

The high resistance change operation is performed in the non-saturation region of the memory cell transistor load characteristic 262 (non-saturation region in the drain current characteristic).

Ending of low resistance change and starting of high resistance change have symmetrical characteristic and the current is regulated in nearly constant at a low resistance change ending point. Therefore, the current is also nearly constant at a high resistance change starting point.

For example, at LE3 low resistance change ending point at which the low resistance change ending voltage is the lowest, high resistance change starts at a high resistance change starting point HS3 and the high resistance change ends at a high resistance change ending point HE0. At this moment, a high resistance change starting current 263 (same as the greatest low resistance ending current) has a maximum. The current is less than the saturation region current of the PMOS load characteristic 261 (current in the saturation region in the drain current characteristic).

Thus, in high resistance change operation, the gate voltage VwH of the memory cell transistor 1 is set so that the non-saturation region current of the memory cell transistor load characteristic 262 exceeds the saturation region current of the PMOS load characteristic 261.

With this setting, even at the high resistance change starting point HS3 with a maximum current, the resistance state does not remains to be a low resistance state and high resistance change may start stably.

Figure 11F:
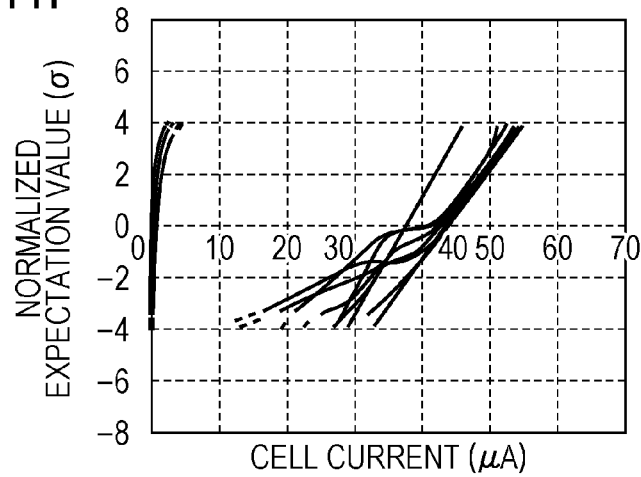
FIG. 11F is a graph illustrating distributions of cell current, in condition F, of the 1T1R memory cell including the current steering circuit in the embodiment.

Base on the description above, the result of the embodiment illustrated in FIGS. 11A and 11F will be reviewed.

In the case of the present embodiment illustrated in FIGS. 11A to 11F, it was verified that the saturation region current of the PMOS load characteristic 261 has a drive capability which causes a current flow of 103.6 [μA] at the drain voltage Vs=0 [V].

On the other hand, it was verified that the non-saturation region current of the memory cell transistor load characteristic 262 provides drive capability of 89.4 [μA] in the condition A illustrated in FIG. 11A, 112.9 [μA] in the condition B illustrated in FIG. 11B, and 133.8 [μA] in the condition C illustrated in FIG. 11C when Vd=0.5 [V] where linearity is obvious.

Although HR error occurs frequently in the condition A illustrated in FIG. 11A, whose drive capability falls below the saturation-region current of PMOS load characteristic 261, HR error hardly occurs in the condition B illustrated in FIG. 11B, whose drive capability is substantially equal to the saturation-region current of the PMOS load characteristic 261.

More suitably, the condition C illustrated in FIG. 11C is provided in which 133.8 [μA]/103.6 [μA]≈1.3. That is, it is desirable that the gate voltage VwH (the second gate voltage) of the memory cell transistor 1 be set so that the non-saturation region current of the memory cell transistor load characteristic 262 is greater than or equal to 1.3 times the saturation-region current of the PMOS load characteristic 261.

Also, at the low resistance change ending point LE2 with the highest low resistance change ending voltage, high resistance change starts at the high resistance change starting point HS2 which has slightly less current than at the high resistance change starting point HS3, and the high resistance change ends at the high resistance change ending point HE0. Under the assumption of this state, the voltage VdH (voltage of the second voltage source), for which the voltage in the saturation region of the memory cell transistor load characteristic 262 is approximately VREmax or higher, is applied to the power source terminal 17 for HR change. In this manner, even when the high resistance change starting voltage takes a value at the high resistance change starting point HS2, the resistance state does not remains to be a low resistance state and high resistance change may start stably.

Furthermore, it is preferable that the voltage VdH of the second voltage source satisfy VdH≤Vdd+VREmax (VRE2), where Vdd is the drain voltage in the non-saturation region in the drain current characteristic of the memory cell transistor 1. This is because the satisfying the inequality allows high resistance change to occur in the non-saturation region of the memory cell transistor 1.

On the other hand, it has been described with reference to in FIGS. 11A to 11F that when the drive capability in high resistance change is excessive like the condition F (FIG. 11F), resistance change operation is also affected, which is not well explained by the operating point analysis chart. However, this may be understood in the following manner.

Although high resistance state HRS has been described as linear characteristic for the sake of simplicity in the description using the operating point analysis chart. However, in reality, it is known that high resistance state HRS has a non-linear characteristic. Regarding the control of nonlinear state, according to Japanese Patent No. 4722230, it has been shown that at an operating point after high resistance change, corresponding to the high resistance change ending point HE0, a current with a nonlinear characteristic flows, and favorable resistance change characteristic is provided by regulating the current to the driving current or lower in low resistance change, that is, the current Iclamp.

The current driven at the high resistance change ending point HE0 depends on the gate voltage VwH of the memory cell transistor 1.

In the case of the present embodiment illustrated in FIGS. 11A to 11F, it was verified that the non-saturation region current of the memory cell transistor load characteristic 262 provides drive capability of 154.6 [μA] in the condition D (FIG. 11D), 1174.6 [μA] in the condition E (FIG. 11E), and 232.3 [μA] in the condition F (FIG. 11F) when Vd=0.5 [V] where linearity is obvious.

The distribution of low resistance state in the condition E has slightly changed (FIG. 11E) and the distribution in the condition F has significantly expanded (FIG. 11F).

Thus, the gate voltage VwH (the second gate voltage) of the memory cell transistor 1 is set so that the ratio of the current in the non-saturation region of the memory cell transistor load characteristic 262 with respect to the saturation region current of the PMOS load characteristic 261 is the rate in the condition E or lower, that is, 174.6 [μA]/103.6 [μA]≈1.7 or lower, more suitably, the rate in the condition D or lower, that is, 154.6 [μA]/103.6 [μA]≈1.5 or lower.

In summary of the above, it is desirable that the gate voltage VwH (the second gate voltage) of the memory cell transistor 1 be set so that the ratio of the current in the non-saturation region of the memory cell transistor load characteristic 262 with respect to the saturation region current of the PMOS load characteristic 261 is higher than 1 and lower than or equal to 1.7. More suitably, the current ratio is 1.3 or higher and 1.5 or lower. That is, when the variable resistance nonvolatile memory element is written to a high resistance state, it is preferable that the gate voltage VwH be applied to the gate of the memory cell transistor 1 so that the drain current in the non-saturation region in the drain current characteristic of the memory cell transistor 1 is between 1 and 1.7 times the saturation region current of the PMOS load characteristic 261. More preferably, the drain current in the non-saturation region in the drain current characteristic of the memory cell transistor 1 is between 1.3 and 1.5 times the saturation region current of the PMOS load characteristic 261.

[Variable Resistance Nonvolatile Memory Device]

Next, as a variable resistance nonvolatile memory device in this embodiment, a variable resistance nonvolatile memory device utilizing the above-described 1T1R memory cell 2000 using a current steering circuit will be described.

Figure 19:
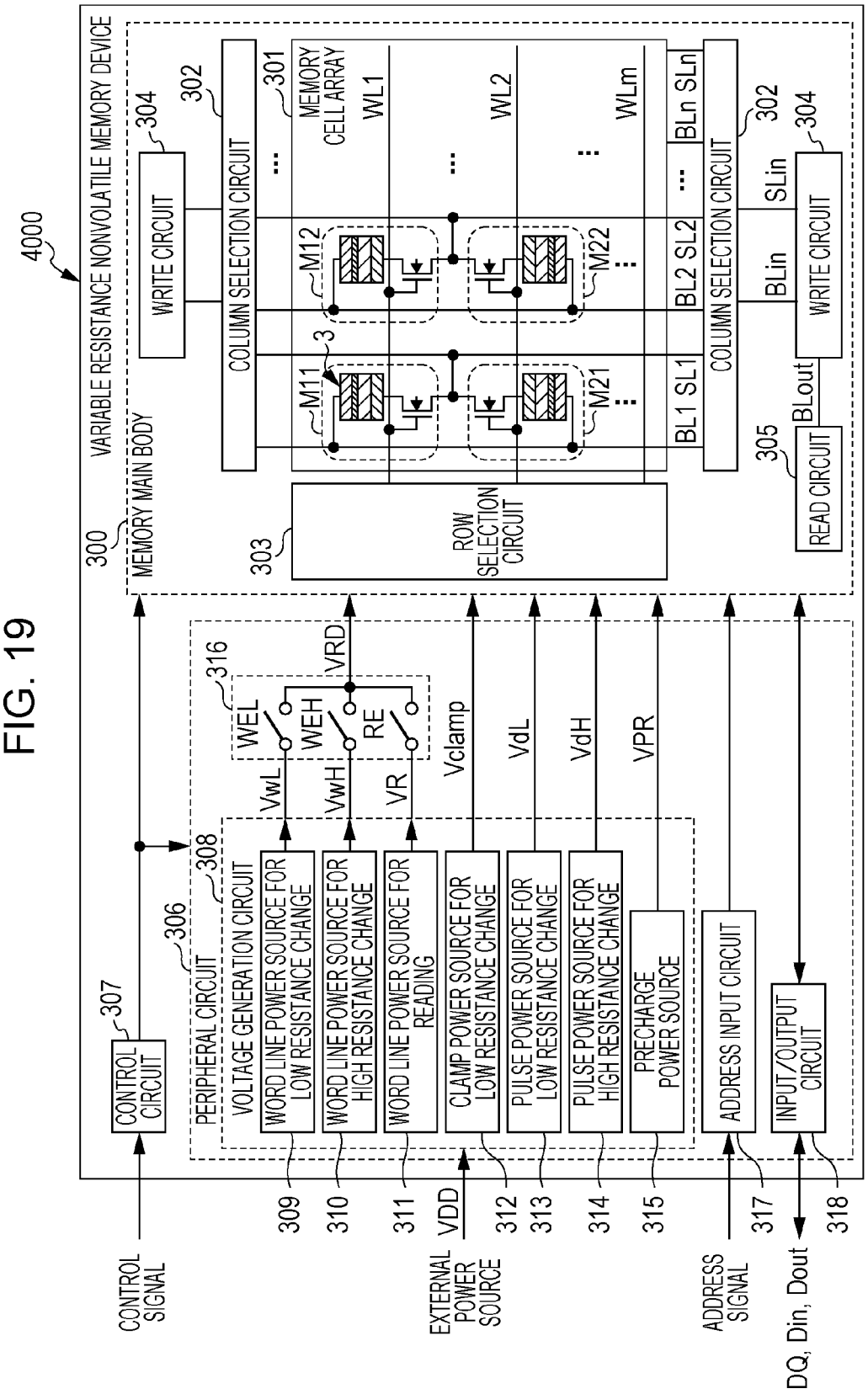
FIG. 19 is a block diagram of the variable resistance nonvolatile memory device in the embodiment.

FIG. 19 is a block diagram illustrating the configuration of the variable resistance nonvolatile memory device in the present embodiment.

A variable resistance nonvolatile memory device 4000 according to the present implementation includes a memory main body 300, a peripheral circuit unit 306, and a control circuit 307 on a semiconductor substrate.

The memory main body 300 includes a memory cell array 301, a column selection circuit 302, a row selection circuit 303, a write circuit 304 that writes data in a variable resistance nonvolatile memory element, and a read circuit 305 that detects an amount of current flowing through a bit line selected by the column selection circuit 302 and determines whether stored data "1" or "0".

The peripheral circuit unit 306 includes a voltage generation circuit 308, a word line voltage switching circuit 316, an address input circuit 317, and an input/output circuit 318.

The control circuit 307 is a circuit that controls the operation of the memory main body 300 and the peripheral circuit unit 306 based on a control signal inputted from the outside. The control circuit 307 controls the operation to achieve resistance change operation of the 1T1R memory cell 2000 including the current steering circuit, which has been described in the section of Basic Data of the Present Disclosure. Referring to FIG. 2, for example, when a variable resistance nonvolatile memory element 2 is written to a low resistance state, the control circuit 307 turned on a source line selection switch 14 (first switch circuit) for LR change and a bit line selection switch 13 (third switch circuit) for LR change, turned off a source line selection switch 18 (second switch circuit) for HR change and a bit line selection switch 16 (fourth switch circuit) for HR change, and performs control to apply a first gate voltage to the gate of the memory cell transistor (NMOS transistor) 1. On the other hand, when the variable resistance nonvolatile memory element 2 is written to a high resistance state, the control circuit 307 turned off the source line selection switch 14 for LR change and the bit line selection switch 13 (third switch circuit) for LR change, turned on the source line selection switch 18 for HR change and the bit line selection switch 16 for HR change, and performs control to apply a second gate voltage to the gate of the memory cell transistor (NMOS transistor) 1, the second gate voltage being lower than the first gate voltage.

The voltage generation circuit 308 includes a word line power source 309 for low resistance change, a word line power source 310 for high resistance change, a word line power source 311 for reading, a clamp power source 312 for low resistance change, a pulse power source 313 for low resistance change, a pulse power source 314 for high resistance change, and a precharge power source 315.

These power sources input voltage VDD of an external power source, and generate predetermined set voltage values illustrated in the following Table 1.

TABLE 1

| POWER SOURCE | VOLTAGE | SET VOLTAGE VALUE |
|---|---|---|
| EXTERNAL POWER SOURCE | VDD | 3.3 V |
| WORD LINE POWER SOURCE FOR LOW RESISTANCE CHANGE | VwL | 2.8 V |
| WORD LINE POWER SOURCE FOR HIGH RESISTANCE CHANGE | VwH | 1.45 V |
| WORD LINE POWER SOURCE FOR READING | Vr | 1.1 V |
| CLAMP POWER SOURCE FOR LOW RESISTANCE CHANGE | Vclamp | 2.15 V |
| PULSE POWER SOURCE FOR LOW RESISTANCE CHANGE | VdL | 2.8 V |
| PULSE POWER SOURCE FOR HIGH RESISTANCE CHANGE | VdH | 2.35 V |
| PRECHARGE POWER SOURCE | VPR | 1.1 V |

The values provided are based on the drive voltage value of the 1T1R memory cell 2000 including the current steering circuit in the present embodiment which has been described with reference to FIGS. 6A and 6B.

The word line power source 309 for low resistance change is a power source that outputs voltage VwL to be applied to a selected word line (that is, the gate of a selected memory cell transistor) when a selected memory cell is written to a low resistance state. The word line power source 309 for low resistance change is an example of power source that outputs the first gate voltage.

The word line power source 310 for high resistance change is a power source that outputs voltage VwH to be applied to a selected word line when a selected memory cell is written to a high resistance state. The word line power source 310 for high resistance change is an example of power source that outputs the second gate voltage.

The word line power source 311 for reading is a power source that outputs voltage Vr to be applied to a selected word line when reading from a selected memory cell is performed. The word line power source 311 for reading is an example of power source that outputs a third gate voltage to the gate of an NMOS transistor connected to a variable resistance nonvolatile memory element from which a resistance state is read by the read circuit 305.

The clamp power source 312 for low resistance change is a power source that outputs voltage Vclamp to be applied to the gate of current steering circuit (PMOS transistor serving as the current steering element 10 for LR change) when a selected memory cell is written to a low resistance state. The clamp power source 312 for low resistance change is an example of gate clamp power source connected to the gate of the current steering element 10 for LR change included in the current steering circuit.

The pulse power source 313 for low resistance change is a power source that outputs voltage VdL to generate a pulse voltage to be applied to a variable resistance nonvolatile memory element in the memory cell when a selected memory cell is written to a low resistance state. The pulse power source 313 for low resistance change is an example of the power source terminal 11 (first voltage source) for LR change that is connected to the current steering circuit and supplies a voltage.

The pulse power source 314 for high resistance change is a power source that outputs voltage VdH to generate a pulse voltage to be applied to a variable resistance nonvolatile memory element in the memory cell when a selected memory cell is written to a high resistance state. The pulse power source 314 for high resistance change is an example of the power source terminal 17 (second voltage source) for HR change that supplies a voltage to a bit line via the bit line selection switch 16 (fourth switch circuit) for HR change.

The precharge power source 315 is a power source that outputs voltage VPR to precharge a source line and a bit line. The precharge power source 315 is an example of a third voltage source that supplies a voltage to a bit line or a source line via the later-described non-selection source line switch 19c (seventh switch circuit), non-selection bit line switch 19d (eighth switch circuit), source line drive circuit precharge switch 20a (ninth switch circuit), and bit line drive circuit precharge switch 20b (tenth switch circuit).

Voltage VwL (the first gate voltage) of the word line power source 309 for low resistance change, voltage VwH (the second gate voltage) of the word line power source 310 for high resistance change, and voltage Vr (the third gate voltage) of the word line power source 311 for reading are supplied to the word line voltage switching circuit 316. One of voltage VwL, voltage VwH, and voltage Vr is selected by low resistance write instruction signal WEL, high resistance write instruction signal WEH, and read instruction signal RE, respectively, and is supplied to the row selection circuit 303 as output voltage VRD from the word line voltage switching circuit 316.

That is, the word line voltage switching circuit 316 is a voltage switching circuit that selectively supplies one of the first gate voltage (voltage VwL), the second gate voltage (voltage VwH), and the third gate voltage (voltage Vr) to the row selection circuit 303. When a variable resistance nonvolatile memory element is written to a low resistance state, the control circuit 307 selects the first gate voltage, when a variable resistance nonvolatile memory element is written to a high resistance state, the control circuit 307 selects the second gate voltage, and when a read operation is performed on a variable resistance nonvolatile memory element, the control circuit 307 controls the word line voltage switching circuit 316 so as to select the third gate voltage.

Voltage Vclamp of the clamp power source 312 for low resistance change, voltage VdL of the pulse power source 313 for low resistance change, and voltage VdH of the pulse power source 314 for high resistance change are supplied to the write circuit 304. Voltage VPR of the precharge power source 315 is supplied to the column selection circuit 302 and the write circuit 304. Each of the power source circuits includes a general step-down circuit that decreases voltage VDD of an external power source to generate a predetermined voltage, and detailed description is omitted.

Depending on voltage VDD of an external power source, some or all of these power source circuits may increase the voltage VDD to generate a predetermined voltage.

Also, some or all of the power source circuits do not have to be installed in the variable resistance nonvolatile memory device 4000 and may provide a predetermined voltage as external power sources.

The address input circuit 317 is an example of circuit that receives an address signal inputted from the outside and controls the column selection circuit 302 and the row selection circuit 303 according to the received address signal.

The address input circuit 317 designates a predetermined memory cell 3 in the memory cell array 301.

The input/output circuit 318 is an example of circuit that supplies write data sent from the outside to the write circuit 304 and outputs read data to the outside, the read data indicating a resistance state read by the read circuit 305. Here, the input/output circuit 318 receives data input signal Din which is inputted to DQ terminal from the outside and supplies a write signal based on the data input signal Din to the memory main body 300, or receives a read output signal from the memory main body 300 and outputs an output signal Dout to the outside via DQ terminal.

The memory cell array 301 includes memory cells 3 that are arranged in a matrix of m rows by n columns, which have been described in the section of Basic Data of the Present Disclosure. Here, the upper left memory cell is denoted by M11, and memory cells are denoted by M11, M21, ..., Mm1 in the column direction, and M11, M12, ..., M1n in the row direction.

Each memory cell 3 is as described in the section of Basic Data of the Present Disclosure, and includes the variable resistance nonvolatile memory element 2 and the memory cell transistor 1 (NMOS transistor) that are connected. The variable resistance nonvolatile memory element 2 includes a first electrode 31, a second electrode 34, and a variable resistance layer 35 which is interposed between the first electrode 31 and the second electrode 34, and which changes reversibly between a low resistance state and a high resistance state according to one of electrical signals having different polarities applied across the first electrode 31 and the second electrode 34. The memory cell transistor 1 includes a first diffusion layer region, a gate, and a second diffusion layer region that is formed in the opposite side of the first diffusion layer region with respect to the gate. In the memory cell 3, the first electrode 31 and the first diffusion layer region of the memory cell transistor 1 are connected. The source line is connected to the second diffusion layer region of the memory cell transistor 1, and the bit line is connected to the second electrode 34.

The row selection circuit 303 is a circuit that selects one of a plurality of word lines as a row of the memory cell array 301. That is, the word lines WL1, WL2, ..., WLm outputted by the row selection circuit 303 in the row direction are connected to the memory cell gate MG of each memory cell 3.

The column selection circuit 302 is a circuit that selects a column of the memory cell array 301. That is, a plurality of bit lines BL1, BL2, ..., BLn and a plurality of source lines SL1, SL2, ..., SLn outputted by the column selection circuit 302 in the column direction are alternately arranged in parallel so as to intersect perpendicularly to a plurality of word lines WL1, WL2, .... WLm, and are connected to the bit line BL and the source line SL of each memory cell 3.

The column selection circuit 302 and the write circuit 304 are on the upper side and the lower side of the memory cell array 301, and writing is performed from both of the bit lines array BL1, BL2, ..., BLn and the source lines SL1, SL2, ..., SLn.

For the purpose of reducing the effect of IR drop (voltage drop) due to wiring resistance of the bit lines and the source lines, the circuits are divided into two sides. However, the circuits may be arranged on one side without being divided into two sides when the effect of IR drops is small due to the number of memory cell 3 to be arranged or the value of wiring resistance of a manufacturing process applied.

Write operation to the memory cell 3 is the same as described in the section of Basic Data of the Present Disclosure. The memory cell 3 changes to a low resistance state when the bit line BL is set to a low potential and the source line SL is set to a high potential, and changes to a high resistance state when the bit line BL is set to a high potential and the source line SL is set to a low potential. It is to be noted that "a memory cell changes to a high resistance state (or a low resistance state)" indicates that a variable resistance nonvolatile memory element within the memory cell changes to a high resistance state (or a low resistance state), and more technically, indicates that a variable resistance layer within the variable resistance nonvolatile memory element changes to a high resistance state (or a low resistance state).

Figure 20:
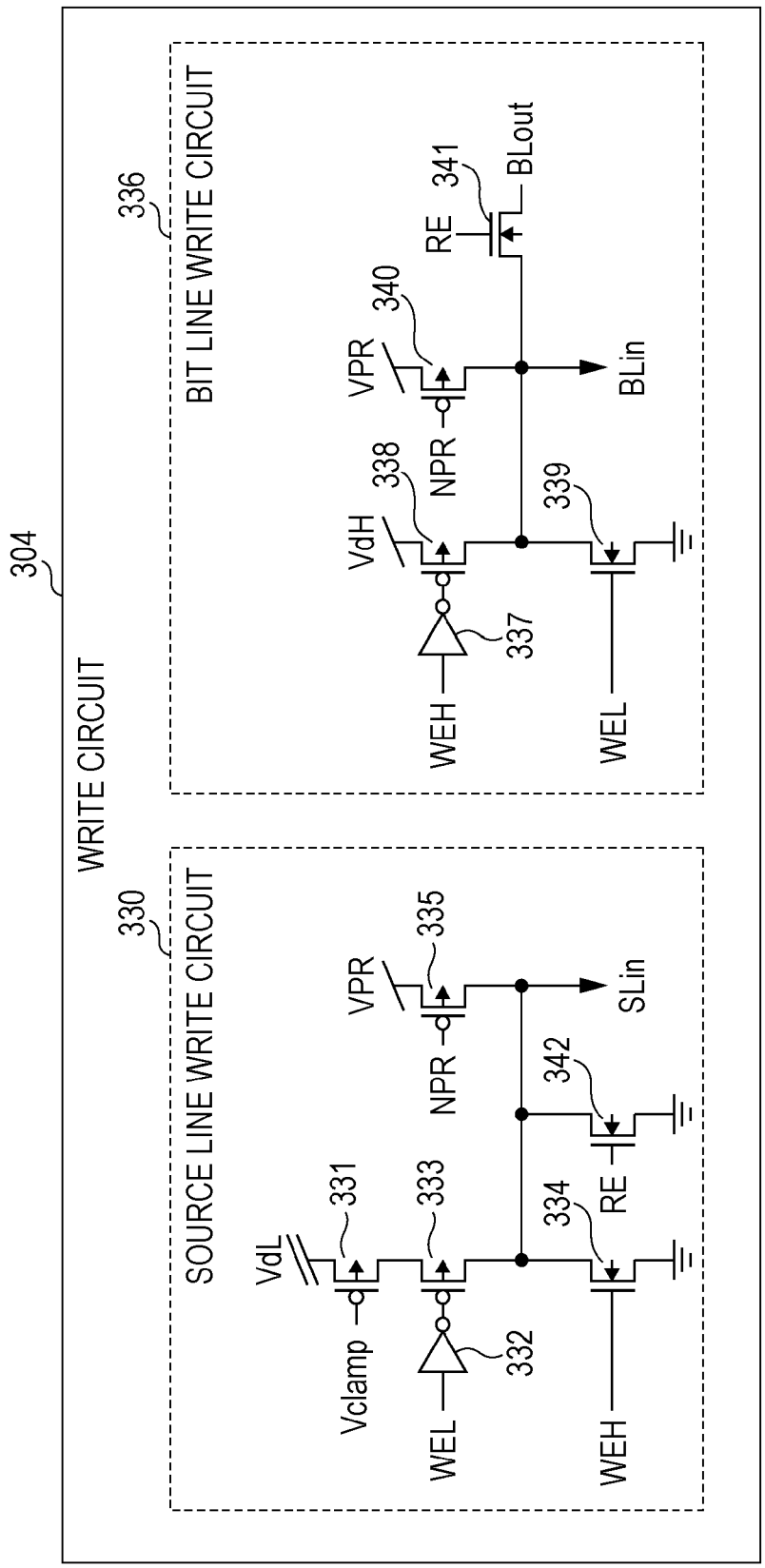
FIG. 20 is a detailed circuit diagram of a write circuit of the variable resistance nonvolatile memory device in the embodiment.

FIG. 20 illustrates a detailed circuit diagram of the write circuit 304 included in the variable resistance nonvolatile memory device 4000 according to the present embodiment.

The write circuit 304 is a circuit that causes a variable resistance nonvolatile memory element to be written to a low resistance state or a high resistance state, the variable resistance nonvolatile memory element being included in a memory cell corresponding to a column selected by the column selection circuit 302 and a row selected by the row selection circuit 303. Specifically, in the present embodiment, the write circuit 304 includes a source line write circuit 330 and a bit line write circuit 336 as illustrated in FIG. 20.

In the source line write circuit 330, the drain of the current steering element 331 for LR change including a PMOS transistor and the source of the PMOS transistor 333 are connected to each other, the PMOS transistor having an source input of voltage VdL of the pulse power source 313 for low resistance change and a gate input of voltage Vclamp of the clamp power source 312 for low resistance change. An output of an inverter 332, which receives an input of a low resistance write instruction signal WEL, is inputted to the gate of the PMOS transistor 333, and the drain of the PMOS transistor 333 is connected to a source line input terminal SLin. In addition, the source line input terminal SLin includes an NMOS transistor 334 that receives a gate input of a high resistance write instruction signal WEH and has a source connected to the ground (reference potential). Furthermore, the source line input terminal SLin is connected a PMOS transistor 335 and an NMOS transistor 342, the PMOS transistor 335 having a gate input of a precharge instruction signal NPR and a source voltage application of voltage VPR of the precharge power source 315, the NMOS transistor 342 having a gate which receives an input of a read instruction signal RE and a source which is connected to the ground (reference potential).

In the bit line write circuit 336, the drain of a PMOS transistor 338 is connected to the bit line input terminal BLin, the PMOS transistor 338 having an source input of voltage VdH of the pulse power source 314 for high resistance change and a gate input of an output from an inverter 337 that receives an input of a high resistance write instruction signal WEH. In addition, the bit line input terminal BLin includes an NMOS transistor 339 that receives a gate input of a low resistance write instruction signal WEL and has a source connected to the ground (reference potential). Furthermore, the bit line input terminal BLin is connected to a PMOS transistor 340 and an NMOS transistor 341, the a PMOS transistor 340 having a gate input of a precharge instruction signal NPR and a source voltage of voltage VPR of the precharge power source 315, the NMOS transistor 341 having a gate input of a read instruction signal RE and a source of bit line output signal BLout.

The bit line output signal BLout is supplied to the read circuit 305.

It is to be noted that correspondence between the components of the 1T1R memory cell 2000 including the current steering circuit in the present embodiment which has been described with reference to FIGS. 6A and 6B, and the components of the write circuit 304 in this embodiment is as follows. That is, the current steering element 10 for LR change as an example of current steering circuit corresponds to the current steering element 331 for LR change, and the source line selection switch 14 for LR change as an example of the first switch circuit corresponds to the PMOS transistor 333. Also, the bit line selection switch 13 for LR change as an example of the third switch circuit corresponds to the NMOS transistor 339, the bit line selection switch 16 for HR change as an example of the fourth switch circuit corresponds to the PMOS transistor 338, and the source line selection switch 18 for HR change as an example of the second switch circuit corresponds to the NMOS transistor 334.

Figure 21:
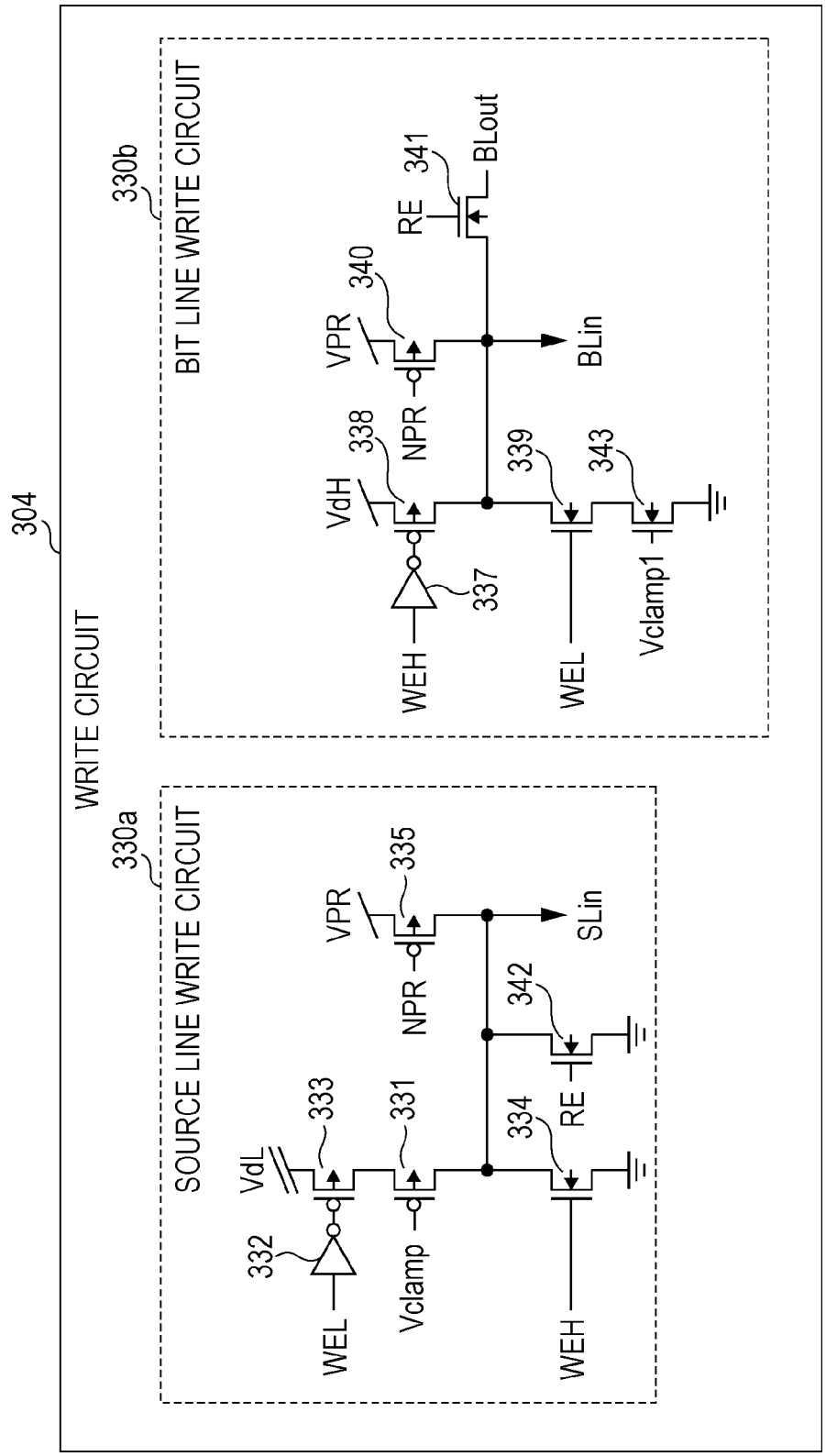
FIG. 21 is a circuit diagram of a modification of the write circuit of the variable resistance nonvolatile memory device in the embodiment.

The source line write circuit 330 is functionally equivalent to the source line write circuit 330a illustrated in FIG. 21, in which the connection order of the current steering element 331 for LR change and the PMOS transistor 333 is reversed. However, the source of the current steering element 331 for LR change is the connection point with the drain of the PMOS transistor 333, and the potential of the connection point may transiently vary according to the amount of write current. When the potential of the connection point varies, the voltage between vclamp and the above-mentioned connection point also varies, the vclamp being the gate-source potential of the current steering element 331 for LR change. Consequently, constant current characteristic of the current steering element 331 for LR change is changed.

Therefore, with the source line write circuit 330 illustrated in FIG. 20, in which the source voltage of the current steering element 331 for LR change is fixed to VdL, the voltage between the gate and the source may be maintained at VdL− Vclamp nearly constantly all the time and is controlled at nearly constant current with high accuracy, and thus more favorable configuration is achieved.

As another configuration, instead of disposing the current steering element 331 for LR change including a PMOS transistor in the source line write circuit 330, a current steering element 343 for LR change including an NMOS transistor may be disposed in the bit line write circuit 330b as in the bit line write circuit 330b illustrated in FIG. 21, which provides the equivalent functional. This has something in common with the configuration presented in the above-described Patent Document 1, and the following problem occurs.

In a low resistance change operation, the current is regulated to a predetermined current value Iclamp. Thus, the voltage of the bit line input terminal BLin as an output node increases with respect to the ground voltage (reference potential) and transiently varies. Since the memory cell transistor 1 exhibits a source follower operation, when the potential on the source side varies, the voltage between the gate and the source of the memory cell transistor 1 also varies. That is, this variation has an effect equivalent to leftward transient shifting of the memory cell transistor load characteristic 260 described with reference to FIG. 18. Thus, in order to drive the same amount of current, voltage VwL of the word line power source has to be set higher.

When a fine manufacturing process is adopted, the area of each memory cell is more reduced, and so as the memory cell transistor 1, a transistor having a thinner gate oxide film is selected because such a transistor is advantageous for high integration. Therefore, it is desirable that an application voltage be low as much as possible. Therefore, it is preferable that when the memory cell transistor is in a source follower operation, a current steering element 343 for LR change be disposed on the drain side of the memory cell transistor and connected thereto to serve as a drain output, thereby avoiding the effect from a transient variation and providing a more favorable configuration.

Figure 22:
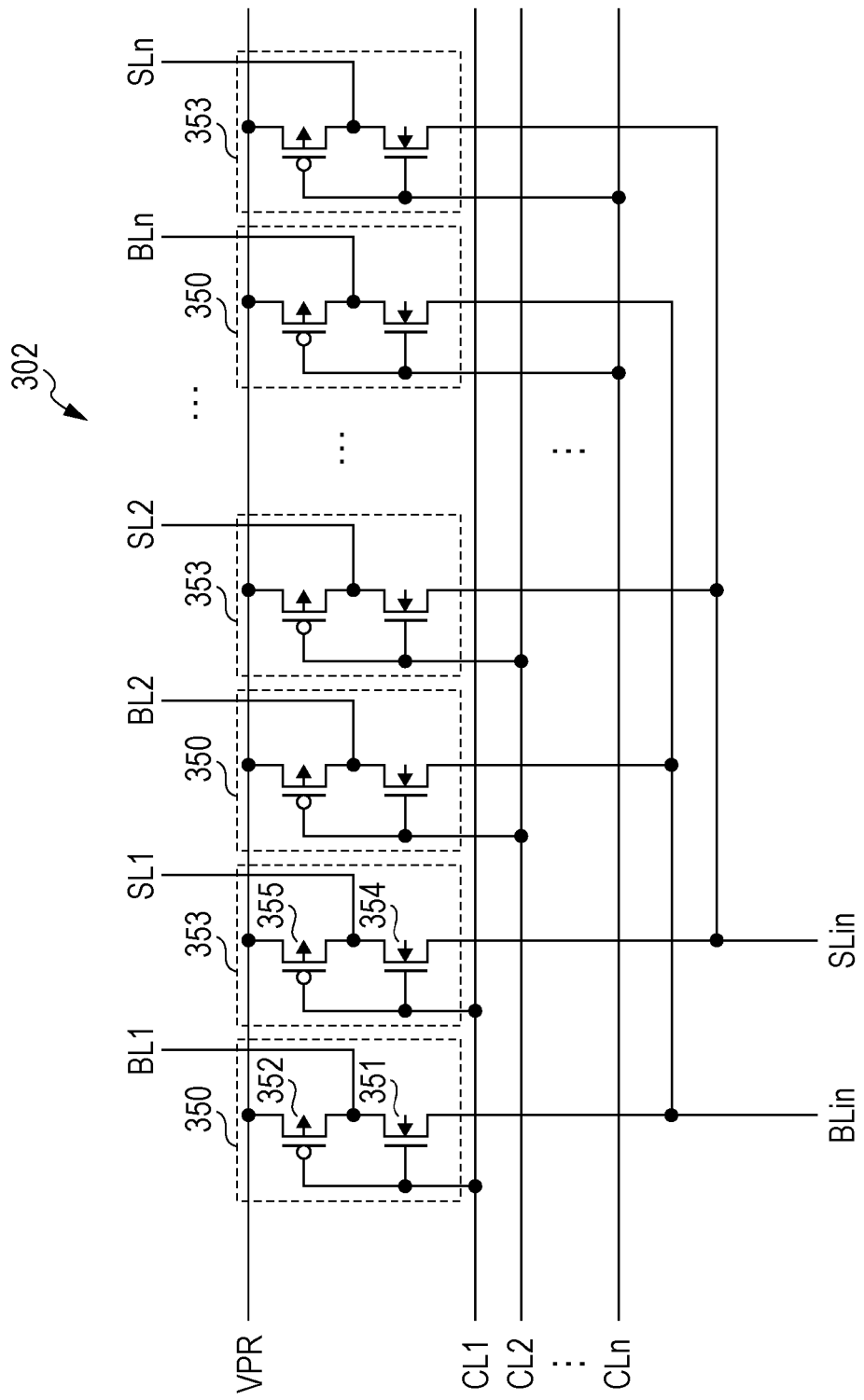
FIG. 22 is a detailed circuit diagram of a column selection circuit of the variable resistance nonvolatile memory device in the embodiment.

FIG. 22 illustrates a detailed circuit diagram of the column selection circuit 302 included in the variable resistance non-volatile memory device 4000 according to the present embodiment.

The bit line selection circuit 350 includes an NMOS transistor 351 and a PMOS transistor 352, the NMOS transistor 351 having one of the source and the drain connected to bit line BLi (i=1 to n) and the other connected to the bit line input terminal BLin, the PMOS transistor 352 having one of the source and the drain connected to bit line BLi (i=1 to n) and the other connected to voltage VPR of the precharge power source 315. The gates of both transistors are connected to the same column selection signal CLi (i=1 to n).

The source line selection circuit 353 includes an NMOS transistor 354 and a PMOS transistor 355, the NMOS transistor 354 having one of the source and the drain connected to source line SLi (i=1 to n) paired with bit line BLi and the other connected to source line input terminal SLin, the PMOS transistor 355 having one of the source and the drain connected to source line SLi (i=1 to n) and the other connected to voltage VPR of the precharge power source 315. The gates of both transistors are connected to the same column selection signal CLi (i=1 to n).

The bit line selection circuit 350 and the source line selection circuit 353 are alternately disposed.

Only one signal selected from column selection signal CLi (i=1 to n) is set to high level and the others are set to low level. Only one pair of selected bit line BLi and source line SLi is connected to bit line input terminal BLin and source line input terminal SLin, and the remaining unselected bit lines BLi and source lines SLi are precharged to voltage VPR.

The high level of column selection signal CLi (i=1 to n) is voltage VDD of an external power source, and in order to avoid the effect of threshold value voltages of the NMOS transistor 351 and the NMOS transistor 354, voltage VDD of an external power source may be set higher or the NMOS transistor may be paired with the PMOS transistor.

Figure 23:
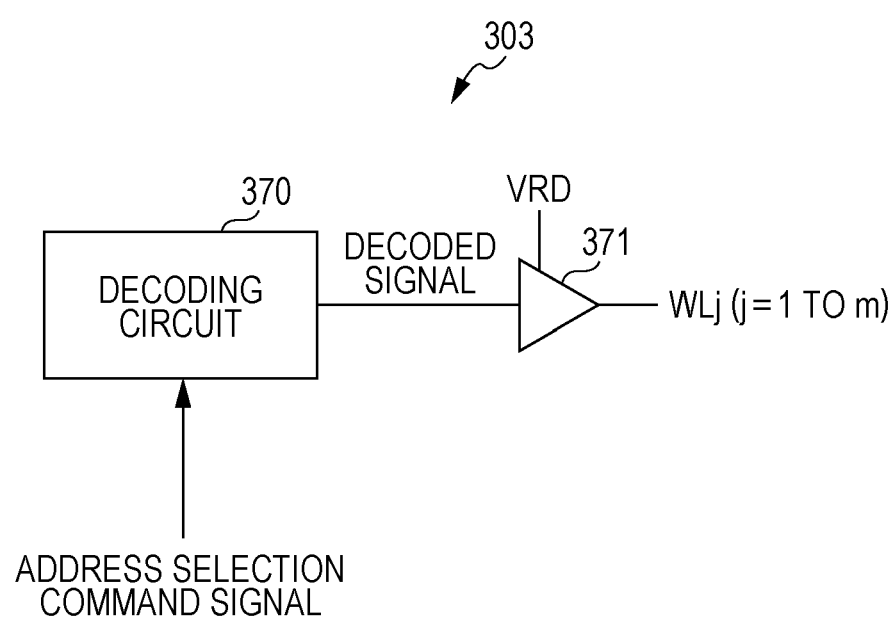
FIG. 23 is a detailed circuit diagram of a row selection circuit of the variable resistance nonvolatile memory device in the embodiment.

FIG. 23 illustrates a detailed circuit diagram of the row selection circuit 303 included in the variable resistance non-volatile memory device 4000 according to the present embodiment.

The row selection circuit 303 includes a decode circuit 370 that generates a decoded signal to designate a selection row based on an address selection command signal generated by the address input circuit 317, and a word line driver 371, and a word line driver 371 connected to the decoded signal. The word line driver 371 has another inputs which are output voltages VRD of the word line voltage switching circuit 316 (see FIG. 19), and includes inputs for the number of word lines (m). The row selection circuit 303 then outputs voltage VwL during low resistance writing, voltage VwH during high resistance writing, and voltage Vr during read operation to word line WLj (j=1 to m) corresponding to a selection row for a specified period.

Figure 24:
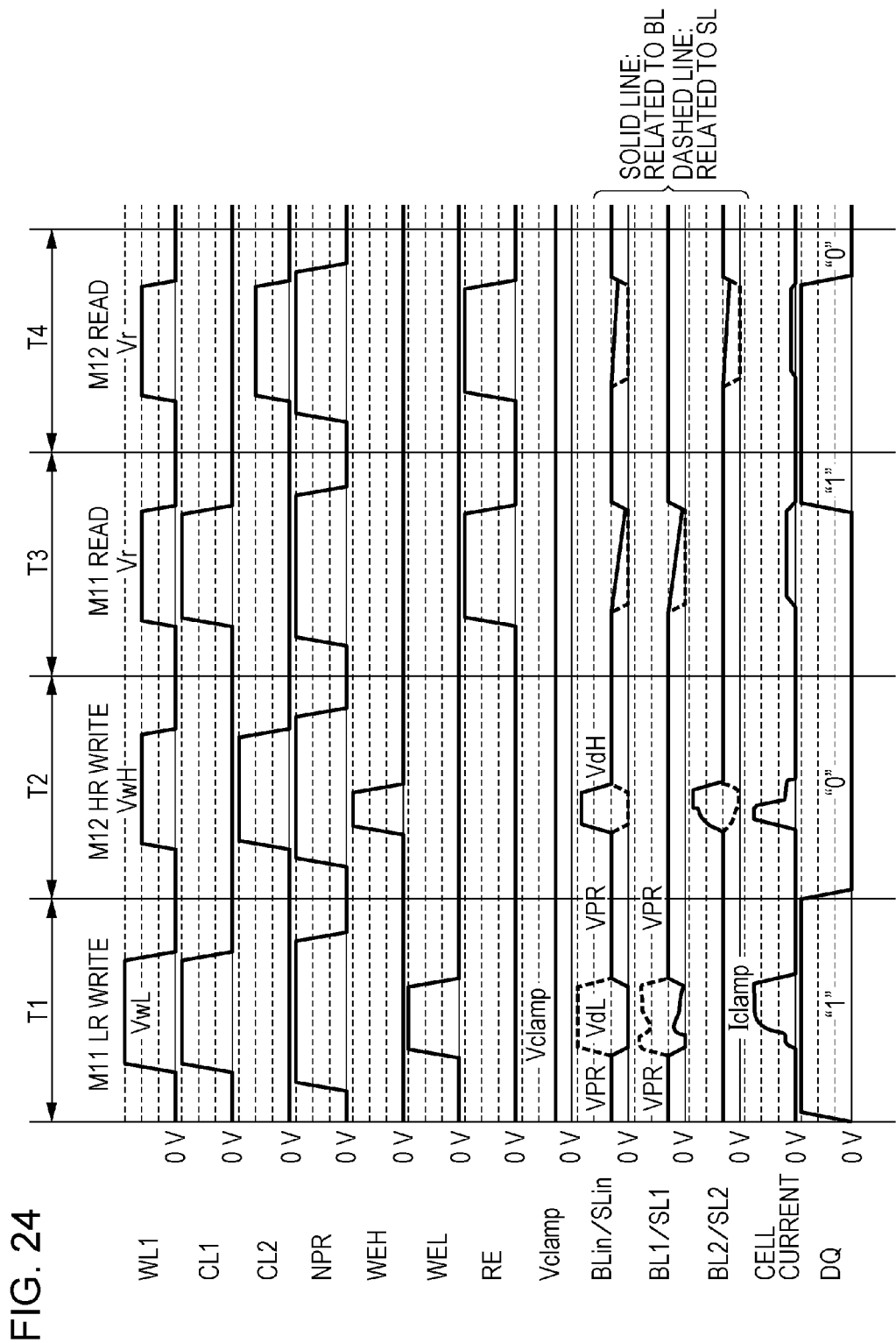
FIG. 24 is a timing chart illustrating an operation of the variable resistance nonvolatile memory device in the embodiment.

The operation of the variable resistance nonvolatile memory device 4000 in this configuration according to the present embodiment will be described with reference to the timing chart illustrated in FIG. 24.

Here, it is defined that data "0" is assigned to a high resistance state of the variable resistance nonvolatile memory element, and data "1" is assigned to a low resistance state thereof. The amplitude level of a control signal, which is not labeled with a voltage symbol, has high level of voltage VDD of an external power source and low level of 0 [V] (reference potential).

In the following description, an example of operation for each of 4 cycles is illustrated. In cycle T1, a low resistance state writing to the memory cell M11 (referred to as M11 LR WRITE), in cycle T2, a high resistance state writing to the memory cell M12 (referred to as M12 HR WRITE), in cycle T3, a low resistance state reading from the memory cell M11 (referred to as M11 READ), and in cycle T4, a high resistance state reading from the memory cell M12 (referred to as M12 READ).

First, a low resistance write operation to the memory cell M11 in cycle T1 will be described.

First, the voltage of all word lines WLj (j=1 to m) and column selection signals CLi (i=1 to n) are set to 0 [V], and each memory cell is in a non-selection state.

On the other hand, precharge instruction signal NPR is a negative logic signal, and precharge instruction issued with 0 [V]. As a result, all bit lines BLi, source lines SLi (i=1 to n), bit line input terminals BLin, and source line input terminals SLin are precharged to voltage VPR.

The input/output DQ terminal is set to high level as write of data "1".

Next, precharge instruction signal NPR is set to high level, and precharged state of bit line input terminal BLin and source line input terminal SLin is released.

Then, upon receiving a selection instruction from the address input circuit 317, word line WL1 which is a selection word line and column selection signal CL1 which is a selection column are set to high level. At this point, voltage of the word line WL1 becomes voltage VwL for low resistance writing. The bit line BL1 and source line SL1, which are in a selection column, are released from precharged state and connected to bit line input terminal BLin and source line input terminal SLin. On the other hand, precharged is maintained for non-selection bit lines and non-selection source lines other than selected lines.

Next, according to data "1" write instruction at input/output DQ terminal, low resistance write instruction signal WEL is set to high level for a period of 100 ns. Upon receiving this, the source line input terminal SLin is driven to high potential side and the bit line input terminal BLin is driven to low potential side, and resistance write operation, which has been described in detail as basic data of the present disclosure, is performed to the selection memory cell M11. At this point, cell current flows through the memory cell M11, the cell current being regulated to current Iclamp by the current steering element 331 for LR change.

Next, upon receiving low resistance write end instruction, selection word line WL1 and selection column selection signal CL1 are set to 0 [V], and the memory cell M11 is set to non-selection state, and precharge to bit line BL1 and source line SL1 is started.

Finally, precharge instruction signal NPR is set to 0 [V], precharge to bit line input terminal BLin and source line input terminal SLin is started, and low resistance write cycle ends.

Next, high resistance write operation to the memory cell M12 in cycle T2 will be described.

First, the voltage of all word lines WLj (j=1 to m) and column selection signals CLi (i=1 to n) are set to 0 [V], and each memory cell is in a non-selection state.

On the other hand, precharge instruction is issued with 0 [V] of precharge instruction signal NPR, and all bit lines BLi, source lines SLi (i=1 to n), bit line input terminals BLin, and source line input terminals SLin are precharged to voltage VPR.

The input/output DQ terminal is set to low level as write of data "1".

Next, precharge instruction signal NPR is set to high level, and the precharged state of bit line input terminal BLin and source line input terminal SLin is released.

Then, upon receiving a selection instruction from the address input circuit 317, word line WL1 which is a selection word line and column selection signal CL2 which is a selection column are set to high level. At this point, voltage of the word line WL1 becomes voltage VwH for high resistance writing. The bit line BL2 and source line SL2, which are in a selection column, are released from precharged state and connected to bit line input terminal BLin and source line input terminal SLin. On the other hand, precharged is maintained for non-selection bit lines and non-selection source lines other than selected lines.

Next, according to data "0" write instruction at input/output DQ terminal, high resistance write instruction signal WEH is set to high level for a period of 50 ns. Upon receiving this, the source line input terminal SLin is driven to low potential side and the bit line input terminal BLin is driven to high potential side, and resistance write operation, which has been described in detail in the section of Basic Data of the Present Disclosure, is performed to the selection memory cell M12.

It is to be noted that the cell current of the timing chart indicates its absolute value and the flow direction is opposite to the flow direction in cycle T1.

Next, upon receiving high resistance write end instruction, selection word line WL2 and selection column selection signal CL2 are set to 0 [V], and the memory cell M12 is set to non-selection state, and precharge to bit line BL2 and source line SL2 is started.

Finally, precharge instruction signal NPR is set to 0 [V], precharge to bit line input terminal BLin and source line input terminal SLin is started, and low resistance write cycle ends.

Next, read operation of a low resistance state of the memory cell M11 in cycle T3 will be described.

First, the voltage of all word lines WLj (j=1 to m) and column selection signals CLi (i=1 to n) are set to 0 [V], and each memory cell is in a non-selection state.

On the other hand, precharge instruction is issued with 0 [V] of precharge instruction signal NPR, and all bit lines BLi, source lines SLi (i=1 to n), bit line input terminals BLin, and source line input terminals SLin are precharged to voltage VPR.

Next, precharge instruction signal NPR is set to high level, and precharged state of bit line input terminal BLin and source line input terminal SLin is released.

Then, upon receiving a selection instruction from the address input circuit 317, word line WL1 which is a selection word line and column selection signal CL1 which is a selection column are set to high level. At this point, voltage of the word line WL1 becomes voltage Vr for writing. The bit line BL1 and source line SL1, which are in a selection column, are released from precharged state and connected to bit line input terminal BLin and source line input terminal SLin. On the other hand, precharged is maintained for non-selection bit lines and non-selection source lines other than selected lines.

Next, read instruction signal RE is set to high level during the period (here, setting is 50 ns), of a read operation, NMOS transistor 342 is turned on, selection source line SL1 is driven to the low voltage side via source line input terminal SLin, and NMOS transistor 341 is turned on and selection bit line BL1 is connected to bit line output signal BLout via bit line input terminal BLin. Bit line output signal BLout is connected to the read circuit 305, and data "1" or data "0" is determined according to magnitude of the amount of current which flows from the bit line side to the source line side. A low resistance state is written in the memory cell M11, and more current flows compared with a high resistance state, and thus the read circuit 305 determines that data is "1" and high level is outputted from input/output DQ terminal.

Next, upon receiving read end instruction, selection word line WL1 and selection column selection signal CL1 are set to 0 [V], and the memory cell M11 is set to non-selection state, and precharge to bit line BL1 and source line SL1 is started.

Finally, precharge instruction signal NPR is set to 0 [V], precharge to bit line input terminal BLin and source line input terminal SLin is started, and read operation cycle is terminated.

A detailed description of read operation for a high resistance state of the memory cell M12 in cycle T4 is omitted because the read operation is the same as that in cycle T3 except for the following: selection column is different from that in cycle T3, selected memory cell M12 is written to a high resistance state, less current flows compared with a low resistance state, the read circuit 305 determines that data is "0", and low level is outputted from input/output DQ terminal.

The operation of the variable resistance nonvolatile memory device 4000 according to the present embodiment has been described above. The effect of precharging non-selection bit line and non-selection source line to a predetermined voltage VPR will be described using a memory cell state diagram 400 illustrated in FIG. 25A, a memory cell state diagram 410 illustrated in FIG. 25B, a memory cell state diagram 420 illustrated in FIG. 25C, and a memory cell state diagram 430 illustrated in FIG. 25D.

Figure 25A:
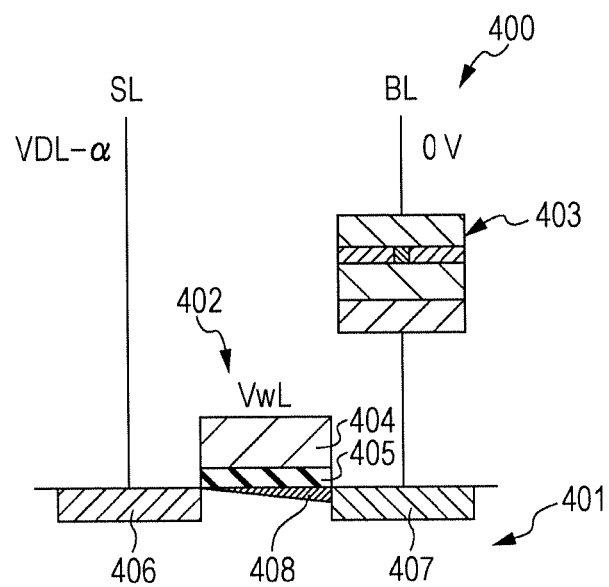
FIG. 25A is a state diagram of a selection memory cell that performs low resistance writing in the variable resistance nonvolatile memory device in the embodiment.

The memory cell state diagram 400 illustrated in FIG. 25A is a schematic sectional view illustrating the state of a selection memory cell that performs low resistance writing, which has been described as the present embodiment, and the memory cell state diagram 400 indicates the state of the selection memory cell M11 in cycle T1 described with reference to FIG. 24.

A memory cell transistor 402 includes a gate electrode 404 which is also a word line, a gate oxide 405, a drain 406 of N-type diffusion layer connected to the source line SL, and a source 407 of N-type diffusion layer on semiconductor substrate 401. The source 407 and the lower electrode of the variable resistance nonvolatile memory element 403 are connected together, and the bit line and the upper electrode are connected together.

In low resistance writing, the source line is set to approximately voltage VdL−α (α indicates a voltage drop due to the current steering element 10 for LR change), the bit line is set to low voltage of 0 [V], and voltage VwL is supplied to the word line. The memory cell transistor 402 is turned on, a channel 408 is formed, and a current flows from the drain 406 to the source 407.

As described with reference to FIG. 18, in low resistance operation, a voltage higher than VRSmax+Vtns has to be provided as the voltage VwL of the gate electrode 404 and in the present embodiment, 2.8 [V] is provided, which is relatively high voltage.

In general, with advancement of fine manufacturing process, fine memory cells are available and higher integration is made possible. In this situation, the plane size of the memory cell transistor 402 is reduced and the gate oxide 405 has less thickness, and thus a maximum voltage which may be applied to the gate electrode 404 decreases along with advancement of fine technology. Therefore, in order to achieve high reliability of memory cells, regulation control of an electric field applied to the gate oxide 405 is important.

In the present embodiment, as illustrated by the memory cell state diagram 400 in FIG. 25A, a channel 408 is formed in the selected memory cell transistor 402, and the electric field between the gate electrode 404 and the channel 408 is substantially applied to the gate oxide 405. In the case of a low resistance writing, a location having the highest electric field with respect to the gate electrode 404 is at the channel 408 near the source 407 with a lower voltage. Although the voltage of the bit line BL is 0 [V], a current flows through the variable resistance nonvolatile memory element 403, and so the potential of the source 407 increases by the resistance change ending voltage VRE (approximately 1 to 1.2 [V]), and practically, the potential difference between the gate electrode 404 and the channel 408 may be reduced to approximately 1.5 to 1.7 [V].

Figure 25B:
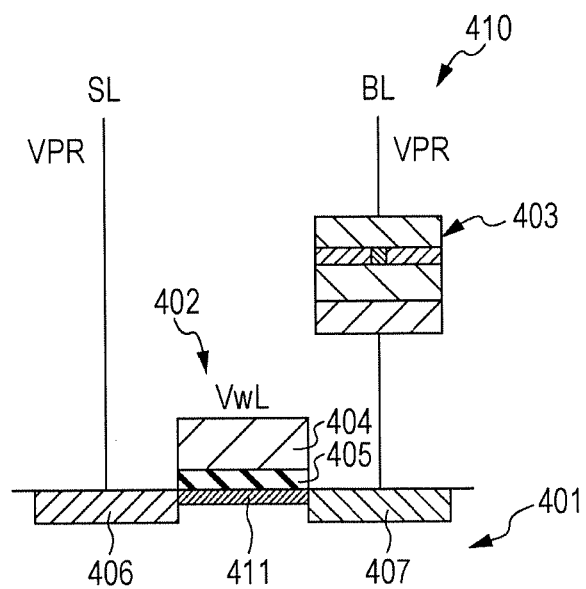
FIG. 25B is a state diagram of a non-selection memory cell in the same row as of the selection memory cell that performs low resistance writing in the variable resistance nonvolatile memory device in the embodiment.

The memory cell state diagram 410 illustrated in FIG. 25B is a schematic sectional view illustrating the state of a non-selection memory cell in the same row as a selection memory cell to which low resistance writing is performed described as the present embodiment. The memory cell state diagram 410 indicates the state of the non-selection memory cell M12 in cycle T1 described with reference to FIG. 24. The source line SL and the bit line BL in each non-selection column are precharged to voltage VPR (1.1 [V]). Since the variable resistance nonvolatile memory element 403 has conductivity, the voltage of N-type diffusion layer 406 as well as N-type diffusion layer 407 is set to VPR. Because the non-selection memory cell is in the same row as the selection memory cell, the gate electrode 404 is at voltage VwL, the voltage between the gate and the source and the voltage between the gate and the drain are both higher than or equal to a threshold value voltage of the memory cell transistor 402, and thus the memory cell transistor 402 is turned on, and a channel 411 is formed. The voltage of the channel 411 is VPR which is the same as the bit line BL and the source line SL.

Therefore, the potential difference between the gate electrode 404 and the channel 411 may be reduced to 1.6 [V].

Figure 25C:
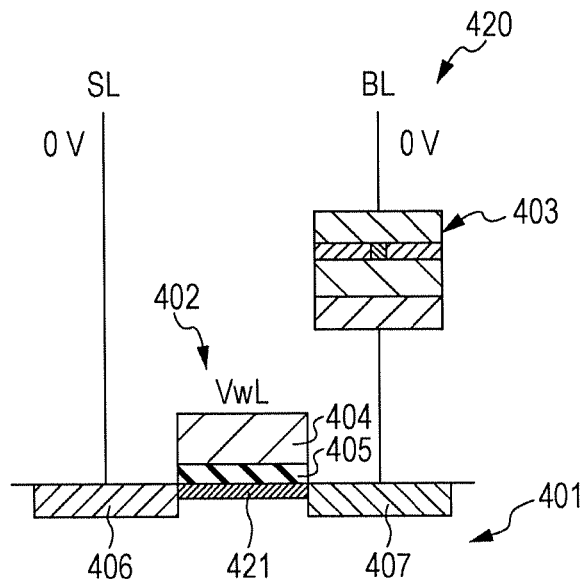
FIG. 25C is a state diagram of a conventional non-selection memory cell (as in the case where the bit line and the source line of the non-selection memory cell are precharged to 0 [V])

On the other hand, the memory cell state diagram 420 illustrated in FIG. 25C is a view depicting the case where the bit line BL and the source line SL of a non-selection memory cell are precharged to 0 [V], which is a conventional approach in general. In this case, the voltage of the channel 421 is the same as the voltage of the bit line BL and the source line SL, which is 0 [V]. The potential difference between the gate electrode 404 and the channel 421 is 2.8 [V] which is higher by at least 1 [V] compared with case of the memory cell state diagram 410 illustrated in FIG. 25B, and this is not desirable for application of fine process.

Figure 25D:
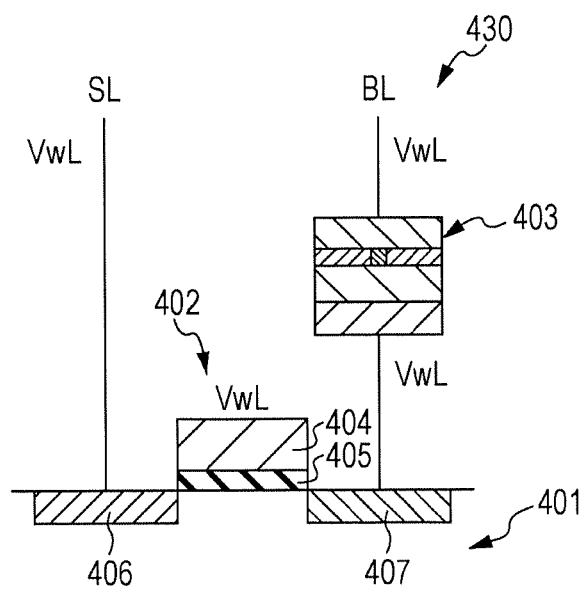
FIG. 25D is a state diagram of a conventional non-selection memory cell (as in the case where the bit line and the source line of the non-selection memory cell are precharged to the same voltage as the gate voltage)

In contrast to the memory cell state diagram 420 illustrated in FIG. 25C, the memory cell state diagram 430 illustrated in FIG. 25D is a view illustrating the state of the case where the bit lines BL and the source lines SL of non-selection memory cells in the same row as a selection memory cell are precharged to the same voltage as the voltage VwL of the gate electrode 404. In this case, the memory cell transistor 402 is turned off and no channel is formed. Therefore, the electric field between the gate electrode 404 and the semiconductor substrate 401 is applied to the gate oxide 405. Since the semiconductor substrate 401 is set at 0 [V] in general, substantially the same electric field 2.8 [V] as in the case of the memory cell state diagram 420 is applied to the gate oxide 405, which is not desirable for application of fine process.

Based on these, precharge voltage VPR for source lines and bit lines of memory cells in non-selection column is preferably lower than voltage VwL by at least threshold value voltage Vtns and higher than or equal to 0[V], the voltage VwL being at selection word line for which a channel is formed. That is, it is desirable to satisfy the relationship of 0 [V]<VPR<VwL−Vtns for application of fine process.

In this case, for the sake of reducing the electric field of the gate oxide 405, it is desirable that the precharge voltage VPR be set to a voltage as high as possible and lower than VwL−Vtns. On the other hand, precharging all non-selection bit lines and non-selection source lines to a predetermined voltage increases power consumption, resulting in contradictory approaches. Thus, in consideration of tradeoff between cost and performance, precharge voltage VPR may be set to an optimal precharge voltage, for example, VPR=(VwL−Vtns)/2.

Figure 26:
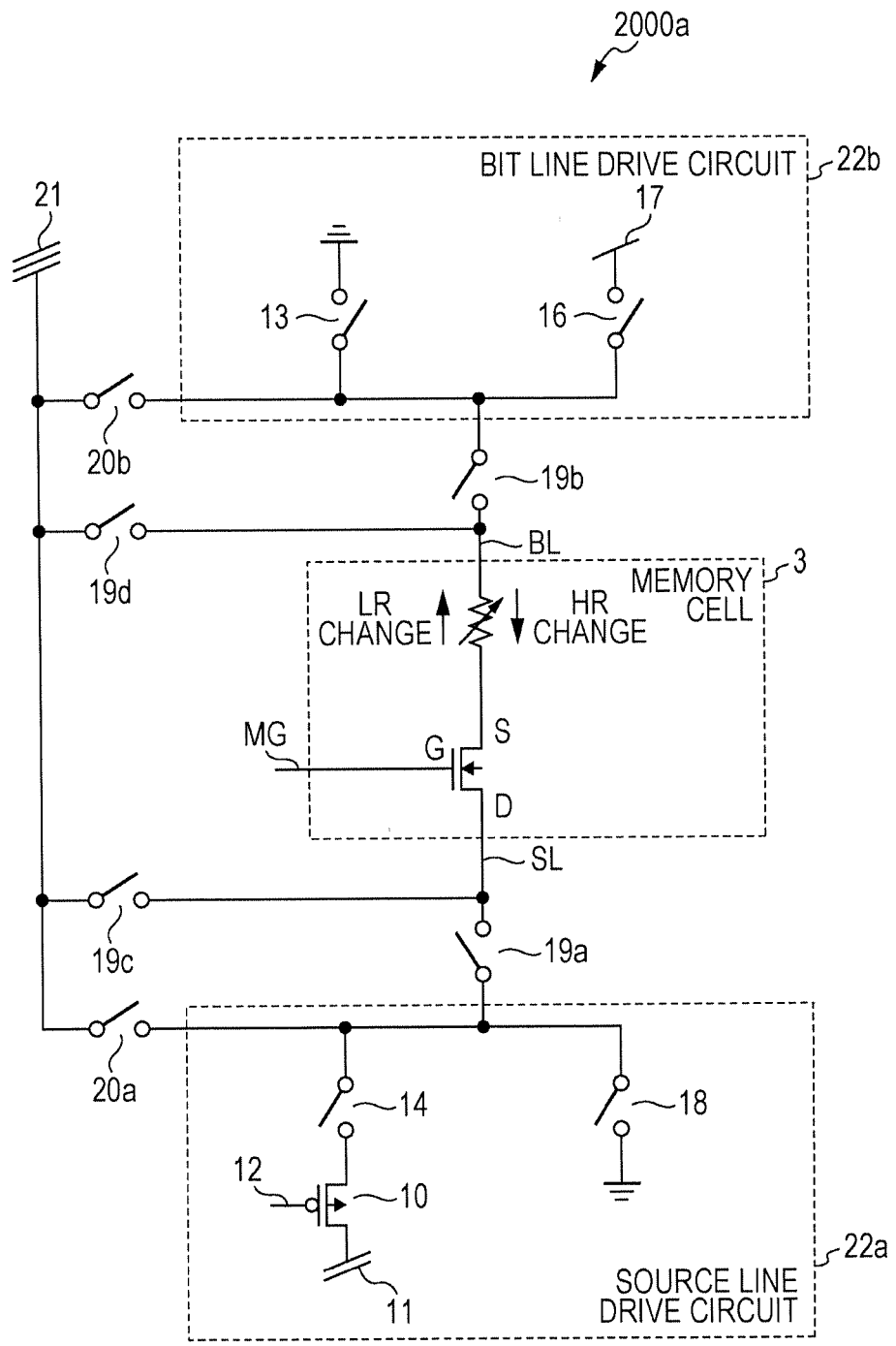
FIG. 26 is an equivalent circuit schematic of the variable resistance nonvolatile memory device in the embodiment.

FIG. 26 is a circuit diagram of a circuit (that is, 1T1R memory cell 2000a including a current steering circuit) in which equivalent circuits are collectively illustrated with respect to one memory cell, the equivalent circuits belonging to a write system circuit included in the variable resistance nonvolatile memory device 4000 according to the present embodiment described with reference to FIG. 19. The same components as in the 1T1R memory cell 2000 including a current steering circuit in the present embodiment described with reference to FIG. 2 are denoted by the same symbol. It is to be noted that precharge power source 21 (corresponding to the precharge power source 315 of FIG. 19) is also illustrated FIG. 26.

In the column selection circuit 302, selection source line switch 19a serving as a source line selection unit is disposed between source line drive circuit 22a and source line SL. Also, source line drive circuit precharge switch 20a is disposed between the source line drive circuit 22a and the precharge power sources 21. Here, the selection source line switch 19a is an example of a fifth switch circuit that is connected between the source line and the first switch circuit (the source line selection switch 14 for LR change), the second switch circuit (the source line selection switch 18 for HR change). The selection source line switch 19a corresponds to the NMOS transistor 354 of the column selection circuit 302 illustrated in FIG. 22. Also, source line drive circuit precharge switch 20a is an example of a ninth switch circuit that connects a connection point and the third source of voltage (precharge power source 315), the connection point being between the first switch circuit (the source line selection switch 14 for LR change) and the second switch circuit (the source line selection switch 18 for HR change), and the fifth switch circuit (the selection source line switch 19a). The source line drive circuit precharge switch 20a corresponds to the PMOS transistor 335 of the source line write circuit 330 illustrated in FIG. 20.

In the column selection circuit 302, selection bit line switch 19b serving as a bit line selection unit is disposed between bit line drive circuit 22b and the bit line BL connected to a bit line paired with the source line. Also, the bit line drive circuit precharge switch 20b is disposed between the bit line drive circuit 22b and the precharge power source 21. Here, the selection bit line switch 19b is an example of a sixth switch circuit connected between the bit line, and the third switch circuit (the bit line selection switch 13 for LR change) and the fourth switch circuit (the bit line selection switch 16 for HR change). The selection bit line switch 19b corresponds to the NMOS transistor 351 of the column selection circuit 302 illustrated in FIG. 22. The bit line drive circuit precharge switch 20b is an example of a tenth switch circuit that connects a connection point and the third source of voltage (precharge power source 315), the connection point being between the third switch circuit (the bit line selection switch 13 for LR change) and the fourth switch circuit (the bit line selection switch 16 for HR change), and the sixth switch circuit (selection bit line switch 19b). The bit line drive circuit precharge switch 20b corresponds to the PMOS transistor 340 of the bit line write circuit 336 illustrated in FIG. 20.

The selection source line switch 19a (the fifth switch circuit) and the selection bit line switch 19b (the sixth switch circuit) are included in the column selection circuit 302 that selects a column of the memory cell array 301.

In addition, non-selection source line switch 19c is disposed between the precharge power source 21 and the source line SL. Here, the non-selection source line switch 19c is an example of a seventh switch circuit that connects the source line and the third source of voltage (precharge power source 315), and corresponds to the PMOS transistor 355 of the column selection circuit 302 illustrated in FIG. 22. The selection source line switch 19a (the fifth switch circuit) and the non-selection source line switch 19c (the seventh switch circuit) are provided correspondingly to each of a plurality of source lines. The selection source line switch 19a and the non-selection source line switch 19c perform complementary operation.

Similarly, non-selecting bit line switch 19d is disposed between the precharge power source 21 and the bit line BL. Here, the non-selecting bit line switch 19d is an example of an eighth switch circuit that connects the bit line and the third voltage source (precharge power source 315), and corresponds to the PMOS transistor 352 of the column selection circuit 302 illustrated in FIG. 22. The selection bit line switch 19b (the sixth switch circuit) and the non-selecting bit line switch 19d (the eighth switch circuit) are provided correspondingly to each of a plurality of bit lines. The selection bit line switch 19b and the non-selecting bit line switch 19d perform complementary operation.

These additional switches selectively control many memory cells or performs control on non-selection memory cells, the control being effective for reliability of transistor. The variable resistance characteristic of each memory cell itself has no difference from the characteristic described with reference to FIG. 2.

The operation of equivalent circuit of the write system circuit illustrated in FIG. 26 is similar to the operation of the variable resistance nonvolatile memory device 4000 illustrated in FIG. 19. The main operations are as follows.

That is, when the control circuit 307 causes the variable resistance nonvolatile memory element to be written to a low resistance state, the control circuit 307 turns on the source line selection switch 14 (the first switch circuit) for LR change and the bit line selection switch 13 (the third switch circuit) for LR change. Also, the control circuit 307 turns on the source line selection switch 18 (the second switch circuit) for HR change and the bit line selection switch 16 (the fourth switch circuit)

for HR change, and performs control to apply a first gate voltage to the gate of the memory cell transistor 1 (NMOS transistor).

On the other hand, when the control circuit 307 causes the variable resistance nonvolatile memory element to be written to a high resistance state, the control circuit 307 turns off the source line selection switch 14 (the first switch circuit) for LR change and the bit line selection switch 13 (the third switch circuit) for LR change. Also, the control circuit 307 turns on the source line selection switch 18 (the second switch circuit) for HR change and the bit line selection switch 16 (the fourth switch circuit) for HR change, and performs control to apply a second gate voltage to the gate of the memory cell transistor 1 (NMOS transistor), the second gate voltage being lower than the first gate voltage.

When the control circuit 307 causes the variable resistance nonvolatile memory element to be written to a low resistance state, the control circuit 307 turns on the selection source line switch 19a (the fifth switch circuit) and the selection bit line switch 19b (the sixth switch circuit), and turns off the non-selection source line switch 19c (the seventh switch circuit) and non-selection bit line switch 19d (the eighth switch circuit).

On the other hand, when the control circuit 307 does not write to the variable resistance nonvolatile memory element, the control circuit 307 turns off the selection source line switch 19a (the fifth switch circuit) and the selection bit line switch 19b (the sixth switch circuit), and turns off the non-selection source line switch 19c (the seventh switch circuit) and non-selection bit line switch 19d (the eighth switch circuit). The control circuit 307 controls the non-selection source line switch 19c (the seventh switch circuit) and non-selection bit line switch 19d (the eighth switch circuit), thereby performing control to precharge unselected source lines and bit lines to the third source of voltage (precharge power source 315), the unselected source lines and bit lines being other than a pair of source line and bit line selected by the column selection circuit 302.

When the control circuit 307 causes the variable resistance nonvolatile memory element to be written to a low resistance state or a high resistance state, immediately before the writing, the control circuit 307 turns off all of the source line selection switch 14 (the first switch circuit) for LR change, and the source line selection switch 18 (the second switch circuit) for HR change, the bit line selection switch 13 (the third switch circuit) for LR change, the bit line selection switch 16 (the fourth switch circuit) for HR change, and turns on the source line drive circuit precharge switch 20a (the ninth switch circuit), and the bit line drive circuit precharge switch 20b (the tenth switch circuit).

Among these operations of the control circuit 307, the main operation is as follows. That is, the writing method in the present embodiment includes: turning on the first switch circuit and the third switch circuit; turning off the second switch circuit and the fourth switch circuit; and performing control to apply the first gate voltage to the gate when the variable resistance nonvolatile memory element is written to a low resistance state. In addition, the writing method in the present embodiment includes: turning off the first switch circuit and the third switch circuit; turning on the second switch circuit and the fourth switch circuit; and performing control to apply the second gate voltage to the gate, the second gate voltage being lower than the first gate voltage when the variable resistance nonvolatile memory element is written to a high resistance state.

As described above, with the variable resistance nonvolatile memory device according to the present embodiment, when the variable resistance nonvolatile memory element is written to a low resistance state, a current steered by the current steering circuit is applied to the variable resistance nonvolatile memory element, whereas when the variable resistance nonvolatile memory element is written to a high resistance state, a gate voltage is applied to the gate of the NMOS transistor included in a memory cell transistor, the gate voltage being lower than the voltage applied to the gate when the variable resistance nonvolatile memory element is written to a low resistance state. Consequently, resistance change operation is continued, that is more stable than in a conventional manner.

A variable resistance nonvolatile memory device according to one or more aspects of the present disclosure has been described above based on the embodiment. However, the present disclosure is not limited to the embodiment. As long as not departing from the spirit of the present disclosure, modified embodiments obtained by making various variations, which occur to those skilled in the art, to the above embodiment, and the embodiments that are constructed by combining the components in different embodiments are also included in the scope of one or more aspects of the present disclosure.

The present disclosure may be utilized, as a variable resistance nonvolatile memory device, for example as a nonvolatile memory used for various electronic devices.

What is claimed is:

1. A variable resistance nonvolatile memory device comprising:
    a nonvolatile memory element that includes a first electrode, a second electrode, and a variable resistance layer between the first electrode and the second electrode, and that changes reversibly between a low resistance state and a high resistance state according to an applied electrical signal;
    an NMOS transistor including a first diffusion layer region, a gate, and a second diffusion layer region, the first diffusion layer region being connected to the first electrode;
    a source line connected to the second diffusion layer region;
    a bit line connected to the second electrode;
    a source line drive circuit that is connected to the source line and that includes i) a current steering circuit connected to a first voltage source, ii) a first switch circuit disposed between the source line and an output of the current steering circuit, iii) a second switch circuit disposed in parallel with the first switch between the source line and a reference potential point;
    a bit line drive circuit that is connected to the bit line and that includes i) a third switch circuit disposed between the bit line and the reference potential point, and ii) a fourth switch circuit disposed in parallel with the third switch between the bit line and a second voltage source; and
    a control circuit that controls at least the NMOS transistor, the source line drive circuit and the bit line drive circuit,
    wherein the nonvolatile memory element completes to change from the high resistance state to the low resistance state when a voltage higher than or equal to a low resistance change ending voltage is applied between the first electrode and the second electrode, wherein the low resistance change ending voltage varies in a range between a first voltage and a second voltage higher than the first voltage, and
    wherein when the control circuit causes the nonvolatile memory element to be in the low resistance state for a writing operation, i) the control circuit turns on the first switch circuit and the third switch circuit, and turns off the second switch circuit and the fourth switch circuit to flow a first current from the first voltage source to the reference potential point, and ii) the control circuit applies a first gate voltage to the gate of the NMOS transistor, and wherein when the control circuit causes the nonvolatile memory element to be in the high resistance state for the writing operation, i) the control circuit turns off the first switch circuit and the third switch circuit, and turns on the second switch circuit and the fourth switch circuit to flow a second current from the second voltage source to the reference potential point, and ii) the control circuit applies a second gate voltage to the gate of the NMOS transistor, the second gate voltage being lower than the first gate voltage.

2. The variable resistance nonvolatile memory device according to claim 1, when the control circuit causes the nonvolatile memory element to be in the low resistance state for the writing operation, the control circuit controls the first current to be a constant current lower than a drive current that flows through the NMOS transistor, by applying the first gate voltage to the gate of the NMOS transistor.

3. The variable resistance nonvolatile memory device according to claim 1, further comprising a gate clamp power source that applies a clamp voltage to the current steering circuit, wherein the current steering circuit comprises a PMOS transistor, a source of the PMOS transistor is connected to the first voltage source, a drain of the PMOS transistor is connected to the first switch circuit, a gate of the PMOS transistor is connected to the gate clamp power source, a voltage Vclamp of the gate clamp power source is a constant voltage satisfying $$0\,[V] < Vclamp < VdL - Vtp,$$

where Vtp is a threshold value voltage of the PMOS transistor, and VdL is a first reference voltage at the first voltage source.

4. The variable resistance nonvolatile memory device according to claim 3, wherein the PMOS transistor has a characteristic in which a change rate of a drain current with respect to a source voltage is 2 [μA]/0.1 [V] or lower in a saturation region of voltage-current characteristic that indicates a relation of the source voltage with the drain current.

5. The variable resistance nonvolatile memory device according to claim 1, wherein the nonvolatile memory element starts to change from the high resistance state to the low resistance state when a voltage higher than or equal to a low resistance change starting voltage is applied between the first electrode and the second electrode, wherein the low resistance change starting voltage varies in a range between a third voltage and a fourth voltage higher than the third voltage, wherein when the control circuit applies the first gate voltage to the gate of the NMOS transistor, at least VwL>VRS2+Vtns is satisfied, where VwL is the first gate voltage, Vtns is a threshold value voltage when the NMOS transistor performs a source follower operation, and VRS2 is the fourth voltage.

6. The variable resistance nonvolatile memory device according to claim 2, wherein when the control circuit applies the second gate voltage to the gate of the NMOS transistor, a drain current of the NMOS transistor is between 1 time and 1.7 times the constant current in a non-saturation region of a voltage-current characteristic that indicates a relation of a source voltage of the NMOS transistor with the drain current of the NMOS transistor.

7. The variable resistance nonvolatile memory device according to claim 6, wherein the drain current of the NMOS transistor is between 1.3 times and 1.5 times the constant current in the non-saturation region.

8. The variable resistance nonvolatile memory device according to claim 6, wherein the nonvolatile memory element has characteristics in which the nonvolatile memory element starts to change from a low resistance state to a high resistance state when a voltage higher than or equal to a high resistance change starting voltage is applied between the first electrode and the second electrode, the high resistance change starting voltage varies in a range between a fifth voltage and a sixth voltage higher than the fifth voltage, and $$VdH \leq Vdd + VRE2$$

is satisfied, where VdH is a second reference voltage at the second voltage source, VRE2 is the sixth voltage, and Vdd is a drain voltage corresponding to the non-saturation region in the voltage-current characteristic of the NMOS transistor.

9. The variable resistance nonvolatile memory device according to claim 2, further comprising:

a third voltage source at which a third reference voltage is set;

a fifth switch circuit having one terminal connected to the second diffusion layer region of the NMOS transistor and having the other terminal connected to both of the first switch circuit and the second switch circuit;

a sixth switch circuit having one terminal connected to the second electrode of the nonvolatile memory element and having the other terminal connected to both of the third switch circuit and the fourth switch circuit;

a seventh switch circuit disposed between the source line and the third voltage source; and an eighth switch circuit disposed between the bit line and the third voltage source, wherein when the control circuit causes the nonvolatile memory element to be in the low resistance state or the high resistance state for the writing operation, the control circuit turns on the fifth switch circuit and the sixth switch circuit, and turns off the seventh switch circuit and the eighth switch circuit, and wherein when the control circuit does not causes the nonvolatile memory element to be in the low resistance state or the high resistance state for the writing operation, the control circuit turns off the fifth switch circuit and the sixth switch circuit, and turns on the seventh switch circuit and the eighth switch circuit.

10. The variable resistance nonvolatile memory device according to claim 8, wherein the nonvolatile memory element has characteristics in which the absolute value of the low resistance change ending voltage is equal to the absolute value of the high resistance change starting voltage, and wherein VRE≤VRS is satisfied, when VRE is the absolute value of the high resistance change starting voltage, and VRS is the absolute value of the low resistance change starting voltage.

11. A variable resistance nonvolatile memory device comprising:
- a memory cell array in which a plurality of memory cells are arranged in a row direction and in a column direction, each of the plurality of memory cells having i) a nonvolatile memory element that includes a first electrode, a second electrode, and a variable resistance layer between the first electrode and the second electrode, and that changes reversibly between a low resistance state and a high resistance state according to an applied electrical signal, and ii) an NMOS transistor including a first diffusion layer region, a gate, and a second diffusion layer region, the first diffusion layer region being connected to the first electrode;
- a plurality of bit lines, each of the plurality of bit lines being connected to the second electrode of corresponding one of the nonvolatile memory elements;
- a plurality of source lines arranged in the same direction as the plurality of bit lines, each of the plurality of source lines being paired with a corresponding one of the plurality of bit lines and being connected to the second diffusion region of corresponding one of the NMOS transistors;
- a plurality of word lines arranged in a perpendicular direction to the plurality of bit lines and the plurality of source lines, each of the plurality of word lines being connected to the gate of a corresponding one of the NMOS transistors;
- a column selection circuit that selects one of the plurality of source lines and one of the plurality of bit lines;
- a row selection circuit that selects one of the plurality of word lines;
- a source line drive circuit that includes i) a current steering circuit connected to a first voltage source, ii) a first switch circuit disposed between the source line and an output of the current steering circuit, iii) a second switch circuit disposed in parallel with the first switch between the source line and a reference potential point, wherein the source line drive circuit is connected to one of the plurality of the source lines via the column selection circuit;
- a bit line drive circuit that includes i) a third switch circuit disposed between the bit line and the reference potential point, and ii) a fourth switch circuit disposed in parallel with the third switch between the bit line and a second voltage source, wherein the bit line drive circuit is connected to one of the plurality of the bit lines via the column selection circuit; and
- a control circuit that controls at least the NMOS transistor, the source line drive circuit, the bit line drive circuit, the column selection circuit, and the row selection circuit,
- wherein each of the nonvolatile memory elements completes to change from the high resistance state to the low resistance state when a voltage higher than or equal to a low resistance change ending voltage is applied between the first electrode and the second electrode, wherein the low resistance change ending voltage varies in a range between a first voltage and a second voltage higher than the first voltage, and
- wherein when the control circuit causes the nonvolatile memory element between one bit line and one source line selected by the column selection circuit, to be in the low resistance state for a writing operation, i) the control circuit turns on the first switch circuit and the third switch circuit, and turns off the second switch circuit and the fourth switch circuit to flow a first current from the first voltage source to the reference potential point, and
  - ii) the control circuit applies a first gate voltage to the gate of the NMOS transistor of the nonvolatile memory element between the one bit line and the one source line selected by the column selection circuit, and
- wherein when the control circuit causes the nonvolatile memory element between one bit line and one source line selected by the column selection circuit, to be in the high resistance state for the writing operation, i) the control circuit turns off the first switch circuit and the third switch circuit, and turns on the second switch circuit and the fourth switch circuit to flow a second current from the second voltage source to the reference potential point, and ii) the control circuit applies a second gate voltage to the gate of the NMOS transistor of the nonvolatile memory element between the one bit line and the one source line selected by the column selection circuit, the second gate voltage being lower than the first gate voltage.

12. The variable resistance nonvolatile memory device according to claim 11, wherein the column selection circuit includes a plurality of fifth switch circuits and includes a plurality of sixth switch circuits,
- wherein each of the plurality of the fifth switch circuits has one terminal connected to a corresponding one of the memory cells and has the other terminal connected to both of the first switch circuit and the second switch circuit, and
- wherein each of the plurality of the sixth switch circuits has one terminal connected to the corresponding one of the memory cells and has the other terminal connected to both of the third switch circuit and the fourth switch circuit.

13. The variable resistance nonvolatile memory device according to claim 12, further comprising
- a third voltage source at which a third reference voltage is set,
- wherein the column selection circuit further comprising:
- a seventh switch circuit disposed between the plurality of source lines and the third voltage source; and
- a eighth switch circuit disposed between the plurality of bit lines and the third voltage source,
- wherein when the control circuit causes one of the nonvolatile memory elements to be in the low resistance state or the high resistance state for the writing operation, the control circuit turns on a corresponding one of the fifth switch circuits and a corresponding one of the sixth switch circuits, and turns off the seventh switch circuit and the eighth switch circuit, and
- wherein when the control circuit does not causes the one of the nonvolatile memory elements to be in the low resistance state or the high resistance state for the writing operation, the control circuit turns off the corresponding one of the fifth switch circuits and the corresponding one of the sixth switch circuits, and turns on the seventh switch circuit and the eighth switch circuit.

14. The variable resistance nonvolatile memory device according to claim 13, wherein $$0\,[V] < VPR < VwL - Vtns$$

is satisfied, when VPR is the third reference voltage, VwL is the first gate voltage, and Vtns is a threshold value voltage when the NMOS transistor performs the source follower operation.

15. The variable resistance nonvolatile memory device according to claim 14, wherein the third reference voltage VPR is $(VwL - Vtns)/2$.

16. The variable resistance nonvolatile memory device according to claim 12,
- wherein each of the nonvolatile memory elements starts to change from the high resistance state to the low resistance state when a voltage higher than or equal to a low resistance change starting voltage is applied between the first electrode and the second electrode, wherein the low resistance change starting voltage varies in a range between a third voltage and a fourth voltage higher than the third voltage,
- wherein each of the nonvolatile memory elements has characteristics in which when the writing operation in the high resistance state and the writing operation in the low resistance state are alternately repeated, a plurality of low resistance change starting voltages corresponding to the nonvolatile memory elements are distributed according to a normal distribution, and
- wherein when the control circuit causes the nonvolatile memory element to be in the low resistance state, the control circuit selects a corresponding one of the word lines to apply the first gate voltage to the gate of a corresponding one of the NMOS transistors to satisfy $VwL > VRS2 + Vtns$,
- wherein VRS2 is the fourth voltage which is derived based on an occurrence probability of $1/(A \times B)$, VwL is the first gate voltage, and Vtns is a threshold value voltage when the NMOS transistor performs the source follower operation,
- wherein A is the number of the memory cells arranged in the memory cell array, and B is a maximum number of times of rewriting the memory cell array in a high resistance state or a low resistance state.

17. The variable resistance nonvolatile memory device according to claim 11, wherein when the control circuit causes nonvolatile memory element to be in the high resistance state, the control circuit selects a corresponding one of the word lines to apply the second gate voltage to the gate of a corresponding one of the NMOS transistors to be a drain current of the NMOS transistor between 1 time and 1.7 times the constant current in a non-saturation region of a voltage-current characteristic, the non-saturation region of the voltage-current characteristic indicating a relation of a source voltage of the NMOS transistor with the drain current of the NMOS transistor.

18. The variable resistance nonvolatile memory device according to claim 11, wherein the control circuit selects a corresponding one of the word lines to apply the first gate voltage to the gate of a corresponding one of the NMOS transistors to satisfy $VwL > 1.8 \, [V] + Vtns$, where VwL is the first gate voltage, and Vtns is a threshold value voltage when the NMOS transistor performs the source follower operation.

19. The variable resistance nonvolatile memory device according to claim 18, wherein the control circuit applies the first gate voltage to the gate of the corresponding one of the NMOS transistors to satisfy $VwL \geq 2.2 \, [V] + Vtns$.

20. The variable resistance nonvolatile memory device according to claim 17, wherein the control circuit applies the second gate voltage to the gate of the corresponding one of the NMOS transistors to be the drain current between 1.3 times and 1.5 times the constant current.

* * * * *